(12) United States Patent
Nagase

(10) Patent No.: US 6,756,183 B2
(45) Date of Patent: Jun. 29, 2004

(54) METHOD FOR PREPARING LITHOGRAPHIC PRINTING PLATE

(75) Inventor: Hiroyuki Nagase, Shizuoka-Ken (JP)

(73) Assignee: Fuji Photo Film Co., Ltd., Minami-Ashigara (JP)

( * ) Notice: Subject to any disclaimer, the term of this patent is extended or adjusted under 35 U.S.C. 154(b) by 7 days.

(21) Appl. No.: 10/222,903

(22) Filed: Aug. 19, 2002

(65) Prior Publication Data

US 2003/0138732 A1 Jul. 24, 2003

(30) Foreign Application Priority Data

Aug. 24, 2001 (JP) ........................................ 2001-254289
Aug. 24, 2001 (JP) ........................................ 2001-254290
Aug. 24, 2001 (JP) ........................................ 2001-254291
Aug. 24, 2001 (JP) ........................................ 2001-254292

(51) Int. Cl.$^7$ ................................................ G03F 7/30
(52) U.S. Cl. ........................ 430/302; 430/309; 430/331
(58) Field of Search ................................ 430/302, 309, 430/331

(56) References Cited

U.S. PATENT DOCUMENTS

| | | | | |
|---|---|---|---|---|
| 4,579,811 A | * | 4/1986 | Schell et al. ................ | 430/302 |
| 4,692,397 A | * | 9/1987 | Liu ............................ | 430/325 |
| 5,155,011 A | * | 10/1992 | Zertani et al. .............. | 430/331 |
| 5,155,012 A | * | 10/1992 | Joerg et al. ................. | 430/331 |
| 5,922,522 A | | 7/1999 | Barr et al. | |

FOREIGN PATENT DOCUMENTS

| | | |
|---|---|---|
| EP | 0 722 121 A | 7/1996 |
| EP | 0 949 539 A2 | 10/1999 |
| EP | 1 013 469 A1 | 6/2000 |
| EP | 1 091 253 A1 | 4/2001 |
| EP | 1 122 610 A2 | 8/2001 |
| JP | 2000081711 A | 3/2000 |

* cited by examiner

*Primary Examiner*—Hoa Van Le
(74) *Attorney, Agent, or Firm*—Burns, Doane, Swecker & Mathis, L.L.P.

(57) ABSTRACT

A method for preparing a lithographic printing plate comprising the steps of imagewise exposing, to light, a presensitized plate for use in making a lithographic printing plate, which comprises a grained and anodized substrate provided thereon with a photopolymerizable light-sensitive layer containing a compound having at least one addition-polymerizable ethylenically unsaturated double bond and a titanocene type initiator; and then developing the light-exposed presensitized plate using a developer which comprises a surfactant and a weak acid or a salt thereof having a dissociation constant pka ranging from 10 to 13, and has a pH value ranging from 11.5 to 12.8. The method exhibits excellent development performance, and gives good results to the resultant printing plate in terms of printing durability and scumming. In addition, the change in pH value of the developer is so small that the stable development can be ensured for a long period of time.

19 Claims, No Drawings

METHOD FOR PREPARING LITHOGRAPHIC PRINTING PLATE

FIELD OF THE INVENTION

The present invention relates to a method for preparing a lithographic printing plate, and specifically to the plate-making method wherein a presensitized plate for use in making a lithographic printing plate (hereinafter possibly referred to as "PS plate") is developed by a specific developer. More specifically, the present invention relates to the plate-making method wherein a photopolymerizable presensitized plate for use in making a lithographic printing plate (hereinafter possibly referred to as "photopolymerizable PS plate") is developed by a specific developer, which method never shows any reduction of developing characteristics due to the elapse of a long period of time and repeated use of the developer, can ensure a good ability to develop the non-image area (non-exposed area) of the lithographic printing plate, prevents the non-image area from scumming, does not damage the image area (exposed area) of the plate due to the development, ensures the formation of firm images and allows the achievement of high printing durability.

BACKGROUND OF THE INVENTION

The developers widely used conventionally for developing a photopolymerizable PS plate may roughly be divided into the following three groups: a) non-aqueous developers mainly comprising organic solvents; b) aqueous developers mainly comprising inorganic alkalis; and c) aqueous developers mainly comprising organic bases.

Among these, those presently used include, for instance, aqueous developers b) and c) at the request of the environmental protection.

Characteristic properties of these two developers will be detailed below. The inorganic alkaline developer b) is characterized in that it usually comprises a silicate and has a pH value in the proximity to 12 in order to hydrophilize the surface of a substrate of the printing plate after the development.

This silicate component is essential for the subsequent hydrophilization treatment or for preventing the non-image area from being contaminated by ink during printing, i.e., for the prevention of scumming.

For instance, there have been known a developer having a pH value of not less than 12 such as those disclosed in Japanese Un-Examined Patent Publication (hereunder referred to as "J.P. KOKAI") No. Hei 8-248643 and a developer having a pH value of not more than 12 such as those disclosed in J.P. KOKAI No. Hei 11-65129. However, the former or the developer having a pH value of not less than 12 is liable to dissolve aluminum currently used as a substrate for the printing plate and, in particular, in case of a dot (small dot) occupying a small image area, it may dissolve the aluminum substrate immediately below the image area due to the so-called side etching phenomenon and this results in a phenomenon in which small dots are removed from the substrate (skipping of small dots) during printing. In other words, this developer suffers from such a problem that it may significantly deteriorate the printing durability of the resulting printing plate.

Moreover, the latter or the developer having a pH value of not more than 12 is excellent in the foregoing printing durability and an ability of preventing scumming, but it is liable to cause reduction of the pH value when continuing the developing treatment over a long period of time due to, for instance, the effect of carbon dioxide present in the air and the developer causes separation of a silicate during the development and this in turn leads to the occurrence of such a novel problem that it never allows any stable development.

In addition to the foregoing, J.P. KOKAI Nos. Sho 61-109052, 2000-81711 and Hei 11-65126 and West German Patent No. 1,984,605 disclose developers free of any silicate, but all of them were not only inferior in the prevention of scumming to those comprising silicates, but also could simultaneously satisfy the requirements for the printing durability and the prevention of scumming, only with great difficulty.

On the other hand, there have been known, as the organic base-containing developer c), for instance, those each comprising an organic amine such as ethanolamine and an alcoholic organic solvent such as benzyl alcohol as an auxiliary developer. In this case, however, such a developer undoubtedly has a low pH value on the order of 10 and therefore, it is not susceptible to the influence of carbon dioxide and is excellent in the processing stability. However, it also suffers from problems in that it is not only disadvantageous in the hydrophilization of the substrate, but also has an extremely high ability of penetration into the image area, that it adversely affects, in particular, small dots and that it is accompanied by the deterioration of the image-forming ability or such a phenomenon that small dots are removed from the substrate during development.

In other words, under the existing circumstances, there is not proposed any developer suitably used for developing the photopolymerizable PS plate, while taking into consideration, for instance, the image-forming ability, prevention of any scumming and printing durability as well as the processing stability.

Regarding the composition of the developer, it has been known that factors such as the presence of a silicate, the level of pH and the presence of an inorganic or organic alkali may exert a great influence on the developing phenomenon, but any combination thereof conventionally proposed has never permitted the solution of the foregoing problems at all. In particular, when a developer has a relatively lower pH value of approximately 12, such developer suffers greater change in a pH value, which change is associated with carbon dioxide gas and alkali consumption by PS plates, and the developer is susceptible to processing amount of PS plates, lag in adding a replenisher and a concentration of carbon dioxide in a room.

With respect to the processing stability, it is quite critical to consider not only the above-mentioned problem on the silicate-separation associated with the reduction of pH, but also stabilization of pH value of the developer in a relatively lower pH range. In other words, there has been desired for the development of a developer for a photopolymerizable PS plate, which can satisfy the requirements for the foregoing image-forming ability, for both the prevention of scumming and the printing durability and for the processing stability. In addition, in view of improving the prevention of scumming, a desensitizing treatment after a development is contributory thereto and it is necessary to ensure a sufficient volume of a coating by the desensitizing treatment.

OBJECTS OF THE INVENTION

Accordingly, it is an object of the present invention to provide a method for preparing a lithographic printing plate, which can satisfy both the requirements for the prevention of scumming and the printing durability on the resultant printing plate without impairing the image-forming ability, and which can improve the processing stability which is associated with a pH change of the developer.

SUMMARY OF THE INVENTION

The inventors of this invention have conducted various studies, recognized that the lower pH value of a developer is advantageous so as to avoid the impairment of the image-forming ability of the developer, while searched for suppressing a pH change of the developer, which change is associated with alkali consumption, and then found that an inclusion of a compound having a dissociation constant pka of from 10 to 13 into a developer is effective in suppressing the pH change of the developer, and the development performance is sufficiently exhibited and assured, and the scumming is favorably eliminated, even if the developer has a relatively lower pH value.

Accordingly, the present invention relates to a method for preparing a lithographic printing plate comprising the steps of imagewise exposing, to light, a presensitized plate for use in making a lithographic printing plate, which comprises a grained and anodized substrate provided thereon with a photopolymerizable light-sensitive layer containing a compound having at least one addition-polymerizable ethylenically unsaturated double bond and a titanocene type initiator; and then developing the light-exposed presensitized plate using a developer which comprises a surfactant and a weak acid or a salt thereof having a dissociation constant pka ranging from 10 to 13, and has a pH value ranging from 11.5 to 12.8.

In one embodiment of the method according to the present invention, the light-exposed plate is washed with water, said plate is then developed with the developer and washed with water again, and a desensitizing solution is applied to the surface of the plate with a coating amount of not less than 0.02 g/m$^2$ on a dry basis, said desensitizing solution comprising (a) gum arabic in amount of 0 to 3% by weight and (b) a modified starch in amount of 5 to 30% by weight. In other words, the present invention relates to a method for preparing a lithographic printing plate comprising the steps of imagewise exposing, to light, a presensitized plate for use in making a lithographic printing plate, which comprises a grained and anodized substrate provided thereon with a photopolymerizable light-sensitive layer containing a compound having at least one addition-polymerizable ethylenically unsaturated double bond and a titanocene type initiator; washing the light-exposed plate with water; developing said plate using the foregoing developer; washing the developed plate with water; and then applying a desensitizing solution to the surface of the plate with a coating amount of not less than 0.02 g/m$^2$ on a dry basis, said desensitizing solution comprising (a) gum arabic in amount of 0 to 3% by weight and (b) a modified starch in amount of 5 to 30% by weight.

According to a preferred embodiment of the present invention, the developer used in the method comprises as the surfactant, at least one member selected from the group consisting of nonionic surfactants and anionic surfactants.

According to a further embodiment of the present invention, the developer used in the method comprises a chelating agent for divalent metals. According to a further embodiment of the present invention, the developer used in the method comprises carbonic acid or a carbonate. According to a still further embodiment of the present invention, the developer used in the method has a conductivity of from 3 to 40 mS/cm.

In order to more sufficiently achieve the development performance and prevention of scumming, the developer used in the present invention may comprise a specific compound. Thus, according to an embodiment of present invention, the developer used in the method further comprises at least one member selected from the group consisting of a compound having a carboxyl group or a salt thereof, represented by the following general formula (1):
R—Ar—(COOM)$_n$
wherein R represents a hydrogen atom or a linear or branched alkyl group having carbon atoms of from 1 to 20, Ar represents an aromatic ring, M represents a hydrogen atom, monovalent metal or an ammonium group, and n represents 1 or 2, a compound represented by the following general formula (2): (R$^1$)(R$^2$)N—X—OH
wherein R$^1$ and R$^2$ each represents an organic residue, and X represents a divalent connecting group, water-soluble sulfite salts, alkaline-soluble mercapto compounds and thioether compounds.

Furthermore, in a preferred embodiment of the present invention, the light-sensitive layer has an acid value of not more than 1.0 meq/g and more specifically, the light-sensitive layer comprises a compound having an acid group whose pKa value is not more than 9 and the light-sensitive layer has an acid value ranging from 0.20 to 0.60 meq/g.

In another preferred embodiment of the plate-making method according to the present invention, the imagewise light-exposed plate is developed in such a manner that the rate of the development of the non-exposed area is not less than 0.05 μm/s and the rate of the developer penetrating into the exposed area is not more than 0.1 μm/s.

As a still further preferred embodiment of the plate-making method according to the present invention, the substrate of the presensitized plate is an anodized aluminum substrate provided thereon with an organic compound carrying a phosphorus atom-containing acidic group or an organic silicone compound.

DETAILED DESCRIPTION OF THE INVENTION

The developer used in the present invention (hereinafter possibly referred to as simply "developer") and the process for preparing a lithographic printing plate according to the present invention will be explained below.

The developer used in the present invention is fundamentally an alkaline aqueous solution having a pH value ranging from 11.5 to 12.8, and preferably from 11.8 to 12.5.

At the first setout, components of the developer will be specifically explained below.

[Weak Acid or Salt Thereof Having Dissociation Constant (pka) Ranging from 10 to 13]

A weak acid or a salt thereof having a dissociation constant pka ranging from 10 to 13 used in the present invention may be selected from those described in "IONISATION CONSTANTS OF ORGANIC ACIDS IN AQUEOUS SOLUTION" published by Pergamon Press, and includes alcohols such as 2,2,3,3-tetrafluoropropanol-1 (pka: 12.74), trifluoroethanol (pka: 12.37) and trichloroethanol (pka: 12.24), aldehydes such as pyridine-2-aldehyde (pka:12.68) and pyridine-4-aldehyde (pka: 12.05), a compound having a phenolic hydroxyl group such as salicylic acid (pka: 13.0), 3-hydroxy-2-naphthoic acid (pka: 12.8), catechol (pka: 12.6), gallic acid (pka: 12.4), sulfosalicylic acid (pka: 11.7), 3,4-dihydroxysulfonic acid (pka: 12.2), 3,4-dihydroxybenzoic acid (pka: 11.94), 1,2,4- trihydroxybenzen (pka: 11.82), hydroquinone (pka: 11.56), pyrogallol (pka: 11.34), o-cresol (pka: 10.33), resorcinol (pka: 11.27), p-cresol (pka: 10.27) and m-cresol (pka: 10.09), sugars such as sorbitol (pka: 13.0), sucrose (pka: 12.7), glucose (pka: 12.46) and L-ascorbic acid (pka: 11.34), oximes such as 2-butaneoxime (pka: 12.45), acetoxime (pka: 12.42), 1,2-cycloheputadione dioxime (pka: 12.3), 2-hydroxybenzaldehyde oxime (pka: 12.10), dimethylglyoxime (pka: 11.9), ethanediamide dioxime (pka: 11.37) and acetophenone oxime (pka: 11.35), a nucleic acid related compound such as adenosine (pka: 12.56), inosine (pka: 12.5), guanine (pka: 12.3), cytosine (pka: 12.2), hypoxanthine (pka: 12.1) and xanthine (pka: 11.9), and others such as diethylaminomethylphosphonic acid (pka: 12.32), 1-amino-3,3,3-trifluorobenzoic acid (pka: 12.29), isopropylidene diphosphonic acid (pka: 12.10), 1,1-ethylidene diphosphonic acid (pka: 11.54), 1,1-ethylidene diphosphonic acid 1-hydroxy (pka: 11.52), benzimidazole (pka: 12.86), thiobenzamide (pka: 12.8), picoline thioamide (pka: 12.55), barbituric acid (pka: 12.5), and weak acids such as phosphoric acid (pka: 12.4), metasilicic acid (pka: 12.0), orthosilicic acid (pka: 12.0), arsenic acid (pka: 11.5), hydrogen peroxide (pka: 11.6) and hydrogen sulfide (pka: 11.9).

Among these, preferred are sulfosalicylic acid, phosphoric acid, inosine, acetoxime and sucrose. The salt of weak acid includes alkaline metal salts such as a sodium salt, a potassium salt and a lithium salt. The weak acid or the salt thereof may be used alone or in any combination of at least two of them. The amount of the weak acid and/or the salt thereof in the developer ranges generally from 0.01 to 1 mol/litter.

[Alkaline Agent]

A base which is used in combination with the above weak acid and/or a salt thereof may be selected from known alkaline agents which are conventionally used in a developer. A preferable alkaline agent includes sodium hydroxide, ammonium hydroxide, potassium hydroxide and lithium hydroxide. Other examples of the alkaline agents include inorganic alkaline agents such as sodium tertiary phosphate, potassium tertiary phosphate, ammonium tertiary phosphate, sodium carbonate, potassium carbonate, ammonium carbonate, sodium bicarbonate, potassium bicarbonate, ammonium bicarbonate, sodium borate, potassium borate and ammonium borate and the like. The alkaline agents which are usable also include organic alkaline agents such as monomethylamine, dimethylamine, trimethylamine, monoethylamine, diethylamine, triethylamine, monoisopropylamine, diisopropylamine, triisopropylamine, n-butylamine, monoethanolamine, diethanolamine, triethanolamine, monoisopropanolamine, diisopropanolamine, ethyleneimine, ethylenediamine, pyridine, tetramethylammonium hydroxide and the like.

The above alkaline agent may be used alone or in combination. The combination use of the above alkaline agents is, for example, a combination of an alkali metal hydroxide such as sodium hydroxide and potassium hydroxide with a carbonate such as sodium carbonate and potassium carbonate.

The alkaline agent may be used in a concentration and a combination which are selected so as to adjust preferably a pH value of the developer.

[Surfactant]

As one example of a surfactant used in the developer, there is a nonionic compound represented by the following general formula (I), which belongs to a nonionic surfactant.

$$A\text{—}W \qquad (I)$$

(In the formula, A represents a hydrophobic organic group whose logP as determined for A—H is not less than 1.5 and W represents a nonionic hydrophilic organic group whose logP as determined for W—H is less than 1.0).

LogP is generally used as a hydrophobic property parameter, which is described in C. Hansch, A. Leo, "Substituent Constants for Correlation Analysis in Chemistry and Biology", J. Wile & Sons, 1979. LogP is determined as follows: the object molecule (A—H and W—H) is distributed in a two-layers system of octanol/water to obtain a proportion of partition between octanol layer and water layer, a balanced concentration ratio P is calculated from said proportion, and logP is defined as a logarithmic value of said balanced concentration ratio P.

LogP herein is used as an index which identifies each of groups A and W. LogP herein denotes those obtained from the known data by calculation according to the method described in A. K. Ghose, et. al. J. Comput. Chem. 9, 80 (1988), on the basis of A—H or W—H structure, which structure is made by linking hydrogen atom to each of the organic groups A and W, for the sake of simplicity.

Specifically, as a chemical structure of A and W, organic groups A and W are usually different from each other, and each of A and W represents a monovalent organic residue which satisfies the above definite logP value. More preferably, each of A and W represents a hydrogen atom, a halogen atom, a hydrocarbon radical which may have a substituent and/or an unsaturated bond, a heterocyclic group, a hydroxyl group, a substituted oxy group, a mercapto group, a substituted thio group, an amino group, a substituted amino group, a substituted carbonyl group, a carboxylate group, a sulfo group, a sulfonato group, a substituted sulfinyl group, a substituted sulfonyl group, a phosphono group, a substituted phosphono group, a phosphonato group, a substituted phosphonato group, a cyano group, a nitro group and the like.

Said hydrocarbon radical which may have a substituent and/or a unsaturated bond includes an alkyl group, a substituted alkyl group, an aryl group, a substituted aryl group, an alkenyl group, a substituted alkenyl group, an alkynyl group, a substituted alkynyl group and the like.

Said alkyl group includes a linear chain, branched chain or cyclic alkyl group having carbon atoms of from 1 to 20, specific examples thereof are methyl, ethyl, propyl, butyl, pentyl, hexyl, heptyl, octyl, nonyl, decyl, undecyl, dodecyl, tridecyl, hexadecyl, octadecyl, eicosyl, isopropyl, isobutyl, s-butyl, t-butyl, isopentyl, neopentyl, 1-metylbutyl, isohexyl, 2-ethylhexyl, 2-methylhexyl, cyclohexyl, cyclopentyl and 2-norbornyl groups and the like. Among these, preferred are a linear chain alkyl group having 1 to 12 carbon atoms, a branched chain alkyl group having 3 to 12 carbon atoms, and a cyclic alkyl group having 5 to 10 carbon atoms.

Said substituted alkyl group consists in a linkage of a substituent group and an alkylene group, and said substituent group includes a monovalent non-metallic atomic group other than a hydrogen atom. Preferred examples of the substituent group are halogen atoms (—F, —Br, —Cl and —I), hydroxyl, alkoxy, aryloxy, mercapto, alkylthio, arylthio, alkyldithio, aryldithio, amino, N-alkylamino, N,N-dialkylamino, N-arylamino, N,N-diarylamino, N-alkyl-N-arylamino, acyloxy, carbamoyloxy, N-alkylcarbanoyloxy, N-arylcarbamoyloxy, N,N-dialkylcarbamoyloxy, N,N-diarylcarbamoyloxy, N-alkyl-N-arylcarbamoyloxy, alkylsulfoxy, arylsulfoxy, acylthio, aminoacyl, N-alkylacylamino, N-arylacylamino, ureido, N'-alkylureido, N',N'-dialkylureido, N'-arylureido, N',N'-diarylureido, N'-alkyl-N'-arylureido, N-alkylureido, N-arylureido, N'-alkyl-N-alkylureido, N'-alkyl-N-arylureido, N',N'- dialkyl-N-alkylureido, N',N'-dialkyl-N-arylureido, N'-aryl-N-alkylureido, N'-aryl-N'-arylureido, N',N'-diaryl-N-alkylureido, N',N'-diaryl-N-arylureido, N'-alkyl-N'-aryl-N-alkylureido, N'-alkyl-N'-aryl-N-arylureido, alkoxycarbonylamino, aryloxycarbonylamino, N-alkyl-N-alkoxycarbonylamino, N-alkyl-N-aryloxycarbonylamino, N-aryl-N-alkoxycarbonylamino, N-aryl-N-aryloxycarbonylamino, formyl, acyl, carboxyl group and conjugate base group thereof (hereinafter referred to as carboxylate), alkoxycarbonyl, aryloxycarbonyl, carbamoyl, N-alkylcarbomoyl, N,N-dialkylcarbamoyl, N-arylcarbamoyl, N,N-diarylcarbamoyl, N-alkyl-N-arylcarbamoyl, alkylsulfinyl, arylsulfinyl, arylsulfonyl, sulfo (—SO$_3$H) and conjugate base group thereof (hereinafter referred to as sulfonato), alkoxysulfonyl, aryloxysulfonyl, sulfinamoyl, N-alkylsulfinamoyl, N,N-diarylsulfinamoyl, N-arylsulfinamoyl, N,N-diarylsulfinamoyl, N-alkyl-N-arylsulfinamoyl, sulfamoyl N-alkylsulfamoyl, N,N-dialkylsulfamoyl, N-arylsulfamoyl, N,N-diarylsulfamoyl, N-alkyl-N-arylsulfamoyl, N-acylsulfamoyl and conjugate base group thereof, N-alkylsulfonylsulfamoyl (—SO$_2$NHSO$_2$(alkyl)) and conjugate base group thereof, N-arylsulfonylsulfamoyl (—SO$_2$NHSO$_2$(aryl)) and conjugate base group thereof, N-alkylsulfonylcarbamoyl (—CONHSO$_2$(alkyl)) and conjugate base group thereof, N-arylsulfonylcarbamoyl (—CONHSO$_2$(aryl)) and conjugate base group thereof, alkoxysilyl (—Si(O-alkyl)$_3$), aryloxysilyl (—Si(O-aryl)$_3$), hydroxysilyl (—Si(OH)$_3$) and conjugate base group thereof, phosphono (—PO$_3$H$_2$) and conjugate base group thereof (hereinafter referred to as phosphonato), dialkylphosphono (—PO$_3$(alkyl)$_2$), diarylphosphono (—PO$_3$(aryl)$_2$), alkylarylphosphono (—PO$_3$(alkyl)(aryl)), monoalkylphosphono (—PO$_3$H(alkyl)) and conjugate base group thereof hereinafter referred to as alkylphosphonato), monoarylphosphono (—PO$_3$H(aryl)) and conjugate base group thereof (hereinafter referred to as arylphosphonato), phosphonoxy (—OPO$_3$H$_2$) and conjugate base group thereof (hereinafter referred to as phosphonatoxy), dialkylphosphonoxy (—OPO$_3$(alkyl)$_2$) diarylphosphonoxy (—OPO$_3$(aryl)$_2$), alkylarylphosphonoxy (—OPO$_3$(alkyl)(aryl)), monoalkylphosphonoxy (—OPO$_3$H(alkyl)) and conjugate base group thereof (hereinafter referred to as alkylphosphonatoxy), monoarylphosphonoxy (—OPO$_3$H(aryl)) and conjugate base group thereof (hereinafter referred to as arylphosphonatoxy), cyano, nitro, aryl, alkenyl and alkynyl groups and the like.

Said alkyl group on the above substituent includes alkyl groups as described above. Specific examples of the aryl group on the above substituent are phenyl, biphenyl, naphthyl, tolyl, xylyl, mesityl, cumenyl, fluorophenyl, chlorophenyl, bromophenyl, chloromethylphenyl, hydroxyphenyl, methoxyphenyl, ethoxyphenyl, phenoxyphenyl, acetoxyphenyl, benzoyloxyphenyl, methylthiophenyl, phenylthiophenyl, methylaminophenyl, dimethylaminophenyl, acetylaminophenyl, carboxyphenyl, methoxycarbonylphenyl, ethoxycarbonylphenyl, phenoxycarbonylphenyl, N-phenylcarbamoylphenyl, phenyl, nitrophenyl, cyanophenyl, sulfophenyl, sulfonatophenyl, phosphonophenyl and phosphonatophenyl groups. Specific examples of the alkenyl group are vinyl, 1-propenyl, 1-butenyl, cinnamyl and 2-chloro-1-ethenyl groups and the like. Specific examples of the alkynyl group are ethynyl, 1-propynyl, 1-butynyl, trimethylsilylethynyl and phenylethynyl groups and the like.

Said acyl group (R$^4$CO—) includes those wherein R$^4$ is hydrogen atom, the above described alkyl, aryl, alkenyl or alkynyl group.

The alkylene group in the substituted alkyl group includes a bivalent organic residue which is shown by excepting any one hydrogen atom on the above mentioned alkyl group having carbon atoms of from 1 to 20, and preferred are a linear chain alkylene group having carbon atoms of from 1 to 12, a branched chain alkylene group having carbon atoms of from 3 to 12 and a cyclic alkylene group having carbon atoms of from 5 to 10.

Examples of the preferred substituted alkyl group are chloromethyl, bromomethyl, 2-chloroethyl, trifluoromethyl, methoxymethyl, methoxyethyoxyethyl, allyloxymethyl, phenoxymethyl, methylthiomethyl, tolylthiomethyl, ethylaminoethyl, diethylaminopropyl, morpholinopropyl, acetyloxymethyl, benzoyloxymethyl, N-cyclohexylcarbamoyloxyethyl, N-phenylcarbamoyloxyethyl, acetylaminoethyl, N-methylbenzoylaminopropyl, 2-oxoethyl, 2-oxopropyl, carboxypropyl, methoxycarbonylethyl, methoxycarbonylmethyl, methoxycarbonybutyl, ethoxycarbonylmethyl, butoxycarbonylmethyl, allyloxycarbonylmethyl, benzyloxycarbonylmethyl, methoxycarbonylphenylmethyl, trichloromethylcarbonylmethyl, allyloxycarbonylbutyl, chlorophenoxycarbonylmethyl, carbamoylmethyl, N-methylcarbamoylethyl, N,N-dipropylcarbamoylmethyl, N-(methoxyphenyl)carbamoylethyl, N-methyl-N-(sulfophenyl)carbamoylmethyl, sulfopropyl, sulfobutyl, sulfonatobutyl, sulfamoylbutyl, N-ethylsulfamoylmethyl, N,N-dipropylsulfamoylpropyl, N-tolylsulfamoylpropyl, N-methyl-N-(phosphonophenyl)sulfamoyloctyl,

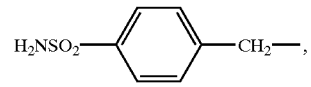

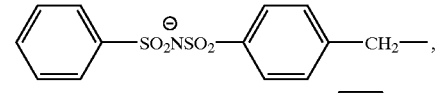

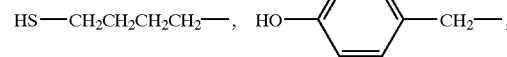

phosphonobutyl, phosphonatohexyl, diethylphosphonobutyl, diphenylphosphonopropyl, methylphosphonobutyl, methylphosphonato butyl, tolylphosphonohexyl, tolylphosphonato hexyl, phosphonoxypropyl, phosphonatoxybutyl, benzyl, phenethyl, α-methylbenzyl, 1-methyl-1-phenylethyl, p-methylbenzyl, cinnamyl, allyl, 1-propenylmethyl, 2-butenyl, 2-methylallyl, 2-methylpropenylmethyl, 2-propynyl, 2-butynyl and 3-butynyl groups and the like.

The aryl group includes a monocyclic group and a condensed-ring group such as those are formed from condensation of from 1 to 3 benzene rings, condensation of a benzene ring and five-membered unsaturated ring, and the like. Examples of the aryl group are phenyl, naphthyl, anthryl, phenanthryl, indenyl, acenaphthenyl and fluorenyl groups and the like. Among these, phenyl and naphthyl groups are preferable.

Said substituted aryl group consists of binding of a substituent group to an aryl group. As a substituent group bonding to a carbon atom which is a ring-forming member of the aryl group, a monovalent non-metallic atomic group other than a hydrogen atom is exemplified. Preferred examples of the substituent group include the alkyl groups, the substituted alkyl groups and the substituent groups on the substituted alkyl groups as described above. Specific examples of preferred substituted aryl group are biphenyl, tolyl, xylyl, mesityl, cumenyl, chlorophenyl, bromophenyl, fluorophenyl, chloromethylphenyl, trifluoromethylphenyl, hydroxyphenyl, methoxyphenyl, methoxyethoxyphenyl, allyloxyphenyl, phenoxyphenyl, methylthiophenyl, tolylthiophenyl, phenylthiophenyl, ethylaminophenyl, diethylaminophenyl, morpholinophenyl, acetyloxyphenyl, benzoyloxyphenyl, N-cyclohexylcarbamoyloxyphenyl, N-phenylcarbamoyloxyphenyl, acetylaminophenyl, N-methylbenzoylaminophenyl, carboxyphenyl, methoxycarbonylphenyl, allyloxycarbonylphenyl, chlorophenoxycarbonylphenyl, carbamoylphenyl, N-methylcarbamoylphenyl, N,N-dipropylcarbamoylphenyl, N-(methoxyphenyl)carbamoylphenyl, N-methyl-N-(sulfophenyl)carbamoylphenyl, sulfophenyl, sulfonato phenyl, sulfamoylphenyl, N-ethylsulfamoylphenyl, N,N-dipropylsulfamoylphenyl, N-tolylsulfamoylphenyl, N-methyl-N-(phosphonophenyl)sulfamoylphenyl, phosphonophenyl, phosphonato phenyl, diethylphosphonophenyl, diphenylphosphonophenyl, methylphosphonophenyl, methylphosphonato phenyl, tolylphosphonophenyl, tolylphosphonato phenyl, allylphenyl, 1-propenylmethylphenyl, 2-butenylphenyl, 2-methylallylphenyl, 2-methylpropenylphenyl, 2-propynylphenyl, 2-butynylphenyl and 3-butynylphenyl groups and the like.

The alkenyl group includes those described above. The substituted alkenyl group consists of replacing a hydrogen atom in the alkenyl group with a substituent group which bonds thereto. The substituent group includes the groups which are described above as substituents on the substituted alkyl group, and the alkenyl group includes those described above. Specific examples of preferred substituted alkenyl group are shown below.

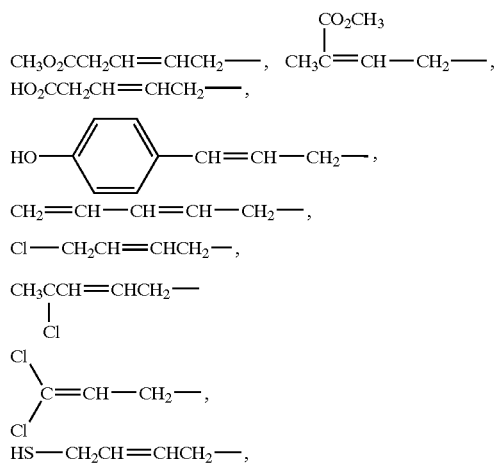

The alkynyl group includes those described above. The substituted alkynyl group consists of replacing a hydrogen atom in the alkynyl group with a substituent group which bonds thereto. The substituent group includes the groups which are described above as substituents on the substituted alkyl group, and the alkynyl group includes those described above.

The heterocyclic group includes a monovalent group which is shown by excepting any one hydrogen atom on a heterocycle, and a monovalent group which is shown by excepting any one hydrogen atom on the above monovalent group and linking thereto a substituent group which is described above as a substituent group in the substituted alkyl group, such monovalent group being referred to as a substituted heterocyclic group. Specific examples of preferred heterocyclic group are shown below.

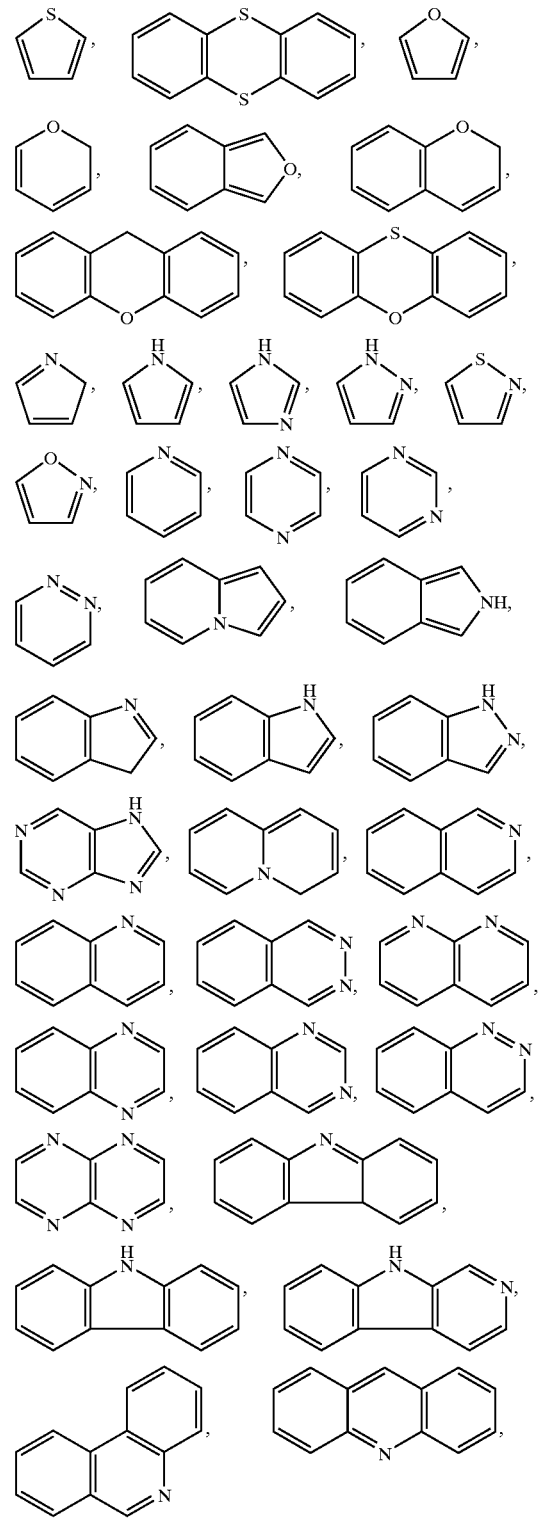

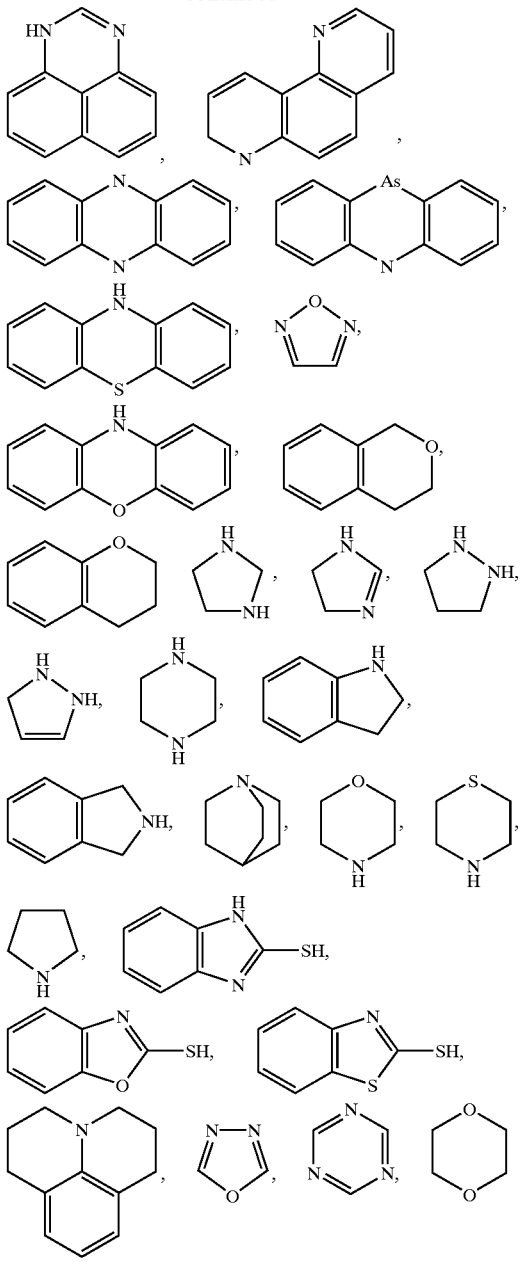

The substituted oxy group ($R^5O—$) includes those wherein $R^5$ is a monovalent non-metallic atomic group other than a hydrogen atom. Preferred substituted oxy group includes alkoxy, aryloxy, acyloxy, carbamoyloxy, N-alkylcarbamoyloxy, N-arylcarbamoyloxy, N,N-dialkylcarbamoyloxy, N,N-diarylcarbamoyloxy, N-alkyl-N-arylcarbamoyloxy, alkylsulfoxy, arylsulfoxy, phosphonoxy and phosphonato oxy groups and the like. The alkyl group and the aryl group in the above oxy group may be the above mentioned alkyl, substituted alkyl, aryl and substituted aryl groups.

The acyl group ($R^6CO—$) in said acyloxy group includes those wherein $R^6$ is the above mentioned alkyl, substituted alkyl, aryl and substituted aryl groups. Preferable substituent groups in the above group are alkoxy, aryloxy, acyloxy and arylsulfoxy groups and the like. Specific examples of preferred substituted oxy group are methoxy, ethoxy, propyloxy, isopropyloxy, butyloxy, pentyloxy, hexyloxy, dodecyloxy, benzyloxy, allyloxy, phenethyloxy, carboxyethyloxy, methoxycarbonylethyloxy, ethoxycarbonylethyloxy, methoxyethoxy, phenoxyethoxy, methoxyethoxyethoxy, ethoxyethoxyethyoxy, morpholinoethoxy, morpholinoethoxy, morpholinopropyloxy, allyloxyethoxyethoxy, phenoxy, tolyloxy, xylyloxy, mesityloxy, cumenyloxy, methoxyphenyloxy, ethoxyphenyloxy, chlorophenyloxy, bromophenyloxy, acetyloxy, benzoyloxy, naphthyloxy, phenylsulfonyloxy, phosphonoxy and phosphonato oxy groups and the like.

The substituted thio group ($R^7S—$) includes those wherein $R^7$ is a monovalent non-metallic atomic group other than a hydrogen atom. Preferable substituted thio groups are alkylthio, arylthio, alkyldithio, aryldithio and acylthio groups and the like. The alkyl and aryl groups in the above thio group include the above mentioned alkyl, substituted alkyl, aryl and substituted aryl groups, and the acyl gourp ($R^6CO—$) in the above acylthio group is as described above. Among these, alkylthio and aryl thio groups are preferable. Specific examples of preferred substituted thio groups are methylthio, ethylthio, phenylthio, ethoxyethylthio, carboxyethylthio and methoxycarbonylthio groups and the like.

The substituted amino group ($R^8NH—$, $(R^9)(R^{10})N—$) includes those wherein $R^8$, $R^9$, $R^{10}$ are a monovalent non-metallic atomic group other than a hydrogen atom. Preferable examples of the substituted amino group are N-alkylamino, N,N-dialkylamino, N-arylamino, N,N-diarylamino, N-alkyl-N-arylamino, acylamino, N-alkylacylamino, N-arylacylamino, ureido, N'-alkylureido, N',N'-dialkylureido, N'-arylureido, N',N'-diarylureido, N'-alkyl-N'-arylureido, N-alkylureido, N-arylureido, N'-alkyl-N-alkylureido, N'-alkyl-N-arylureido, N'-N'-dialkyl-N-alkylureido, N',N'-dialkyl-N-arylureido, N'-aryl-N-alkylureido, N'-aryl-N-arylureido, N',N'-diaryl-N-alkylureido, N',N'-diaryl-N-arylureido, N'-alkyl-N'-aryl-N-alkylureido, N'-alkyl-N'-aryl-N-arylureido, alkoxycarbonylamino, aryloxycarbonylamino, N-alkyl-N-alkoxycarbonylamino, N-alkyl-N-aryloxycarbonylamino, N-aryl-N-alkoxycarbonylamino and N-aryl-N-aryloxycarbonylamino groups and the like. The alkyl and aryl groups in the above amino groups include the above mentioned alkyl, substituted alkyl, aryl and substituted aryl groups, and the acyl gourp ($R^6CO—$) in the above acylamino, N-alkylacylamino and N-arylacylamino groups is as described above. Among these, more preferred are N-alkylamino, N,N-dialkylamino, N-arylamino and acylamino groups and the like. Specific examples of preferable substituted amino group are methylamino, ethylamino, diethylamino, morpholino, piperidino, phenylamino, benzoylamino and acetylamino groups and the like.

The substituted carbonyl group ($R^{11}—CO—$) includes those wherein $R^{11}$ is a monovalent non-metallic atomic group. Examples of the substituted carbonyl group are formyl, acyl, carboxyl, alkoxycarbonyl, aryloxycarbonyl, carbamoyl, N-alkylcarbamoyl, N,N-dialkylcarbamoyl, N-arylcarbamoyl, N,N-diarylcarbamoyl and N-alkyl-N-arylcarbamoyl groups and the like. The alkyl and aryl groups in the above substituted carbonyl groups include the above mentioned alkyl, substituted alkyl, aryl and substituted aryl groups. Among these, preferable substituted carbonyl groups are formyl, acyl, carboxyl, alkoxycabonyl, aryloxycarbonyl, carbamoyl, N-alkylcarbamoyl, N,N-dialkylcarbamoyl and N-arylcarbamoyl groups and the like, and more preferred are formyl, acyl, alkoxycabonyl and aryloxycarbonyl groups and the like. Specific examples of the substituted carbonyl group are formyl, acetyl, benzoyl, carboxyl, methoxy carbonyl, allyloxycaronyl, N-methylcarbamoyl, N-phenylcarbamoyl, N,N-diethylcarbamoyl and morpholinocarbonyl groups and the like.

The substituted sulfinyl group ($R^{12}$—SO—) includes those wherein $R^{12}$ is a monovalent non-metallic atomic group. Examples of the substituted sulfinyl group are alkylsulfinyl, arylsulfinyl, sulfinamoyl, N-alkylsulfinamoyl, N,N-dialkylsulfinamoyl, N-arylsulfinamoyl, N,N-diarylsulfinamoyl, N-alkyl-N-arylsulfinamoyl and N-alkyl-N-arylsulfinamoyl groups and the like. The alkyl and aryl groups in the above substituted sulfinyl groups include the above mentioned alkyl, substituted alkyl, aryl and substituted aryl groups. Among these, preferable substituted sulfinyl groups are alkylsulfinyl and arylsulfinyl groups and the like. Specific examples of the substituted sulfinyl groups are hexylsulfinyl, benzylsulfinyl and tolylsulfinyl groups and the like.

The substituted sulfonyl group ($R^{13}$—$SO_2$—) includes those wherein $R^{13}$ is a monovalent non-metallic atomic group. Preferable examples of the substituted sulfonyl group are alkylsulfonyl and arylsulfonyl groups and the like. The alkyl and aryl groups in the above substituted sulfonyl group include the above mentioned alkyl, substituted alkyl, aryl and substituted aryl groups. Specific examples of the substituted sulfonyl group are butylsulfonyl and chlorophenylsulfonyl groups and the like.

The sulfonato group (—$SO_3^-$) denotes a conjugate base anionic ion group of a sulfo group (—$SO_3H$) as described above, and normally the sulfonate group is preferably used with a counter cationic ion. Said counter cationic ion includes those generally known, for example, various oniums such as ammoniums, sulfoniums, phosphoniums, iodoniums, aziniums and the like, and metallic ions such as $Na^+$, $K^+$, $Ca^{2+}$, $Zn^{2+}$ and the like.

The carboxylate group (—$CO_2^-$) denotes a conjugate base anionic ion group of a carboxyl group (—$CO_2H$) as described above, and normally the carboxylate group is preferably used with a couter cationic ion. Said counter cationic ion includes those generally known, for example, various oniums such as ammoniums, sulfoniums, phosphoniums, iodoniums, aziniums and the like, and metallic ions such as $Na^+$, $K^+$, $Ca^{2+}$, $Zn^{2+}$ and the like.

The substituted phosphono group denotes a group consisting of replacing one or two hydroxyl groups in a phosphono group with an organic oxo group which differs from a hydroxyl group. Preferable examples of the substituted phosphono group are dialkylphosphono, diarylphosphono, alkylarylphosphono, monoalkylphosphono and monoarylphosphono groups and the like. The alkyl and aryl groups in the above substituted phosphono group include the above mentioned alkyl, substituted alkyl, aryl and substituted aryl groups. Among these, dialkylphosphono and diarylphosphono groups are preferable. Specific examples of these groups are diethylphosphono, dibutylphosphono, diphenylphosphono groups and the like.

The phosphonato group (—$PO_3^{2-}$, —$PO_3H^-$) denotes a conjugate base anionic ion group derived from an acid first-dissociation or an acid second-dissociation of a phosphono group (—$PO_3H_2$) as described above. Normally the phosphonate group is preferably used with a counter cationic ion. Said counter cationic ion includes those generally known, for example, various oniums such as ammoniums, sulfoniums, phosphoniums, iodoniums, aziniums and the like, and metallic ions such as $Na^+$, $K^+$, $Ca^{2+}$, $Zn^{2+}$ and the like.

The substituted phosphonato group is a conjugate base anionic ion group of the above mentioned substituted phosphono group which consists of replacing one hydroxyl group in a phosphono group with an organic oxo group. Examples of the substiututed phosphonate group are a conjugate base of the above mentioned monoalkylphosphono group (—$PO_3H(alkyl)$) and monoarylphosphono group (—$PO_3H(aryl)$). Normally the substituted phosphonate group is preferably used with a counter cationic ion. Said counter cationic ion includes those generally known, for example, various oniums such as ammoniums, sulfoniums, phosphoniums, iodoniums, aziniums and the like, and metallic ions such as $Na^+$, $K^+$, $Ca^{2+}$, $Zn^{2+}$ and the like.

In the formula (I), structure of A is preferably an organic group comprising an aromatic group, and structure of W is preferably a nonionic organic group comprising a polyoxyalkylene group.

Examples of A—H and W—H are shown below.
Examples of A—H

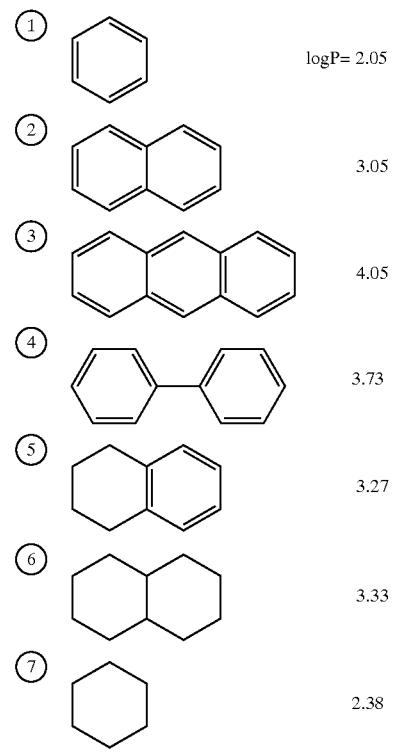

⑧ a linear or branched chain $C_nH_{2n+2}$ (n is an integer $\geq 4$) logP of 2.09 in case of butane
⑨ a linear or branched chain $C_nH_{2n}$ (n is an integer $\geq 4$)
⑩ a linear or branched chain $C_nH_{2n-2}$ (n is an integer $\geq 4$)
Any hydrogen atom on the above structures ①~⑩ may be replaced with the above described substituent group on the hydrocarbon radicals.
Examples of W—H

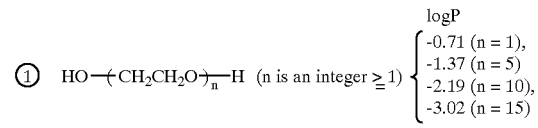

-continued

② HO—(CHCH₂O)ₙ—H (n is an integer ≥ 1) (-0.30 (n = 1), 0.70 (n = 5))
       |
       CH₃

③ HO—(CH₂CH₂O)ₙ—(CHCH₂O)ₘ—H
                      |
                      CH₃
   (n is an integer ≥ 1, m is an integer ≥ 1)

④ HS—(CH₂CH₂O)ₙ—H (n is an integer ≥ 1)

⑤ HO—(CH₂CH₂CH₂O)ₙ—H (n is an integer ≥ 1)

⑥ HO—(CH₂CH₂—N)ₙ—H (n is an integer ≥ 1)
                |
                H

⑦ H₂N—(CH₂CH₂—N)ₙ—H (n is an integer ≥ 1)
                 |
                 H

⑧ α—(CH₂CH)ₙ—ω (n is an integer ≥ 1)
        |
        OH

⑨ α—(CH₂CH)ₙ—ω (n is an integer ≥ 1)
        |
        NH₂

⑩ α—(CH₂CH)ₙ—ω (n is an integer ≥ 1)
        |
        C≡N

⑪ α—(CH₂CH)ₙ—ω (n is an integer ≥ 1)
        |
        CONH₂

⑫ α—(CH₂CH)ₙ—ω (n is an integer ≥ 1)
        |
        CH₂OH

⑬ α—(CH₂CH)ₙ—ω (n is an integer ≥ 1)
        |
        CH₂NH₂

⑭ α—(CH₂CH)ₙ—ω (n is an integer ≥ 1)
        |
        CO₂⁻OH

In the above ①–⑭, α and ω each represents —OH, —H, —SH or —NH₂. A hydrogen atom on the above structures ①–⑭ may be replaced with the above described substituent group on the hydrocarbon radicals.

Specific examples of the compound represented by the formula (I) are shown below.

[Examples of Compound represented by the Formula (I)] A-W

Y-1 naphthyl—O—(CH₂CH₂O)₁₃—H

Y-2 naphthyl—O—(CH₂CH₂O)₁₀—H

Y-3 naphthyl—O—(CH₂CH₂O)₅—H

Y-4 naphthyl—O—(CHCH₃CH₂O)₈—H

[Examples of Compound represented by the Formula (I)] A-W

Y-5 naphthyl—O—(CH₂CH₂O)₅—(CH(CH₃)CH₂O)₈—H

Y-6 (t)C₄H₉-naphthyl—O—(CH₂CH₂O)₁₅—H

Y-7 (n)C₈H₁₇O-naphthyl—O—(CH₂CH₂O)₁₅—H

Y-8 C₃H₇CO₂-naphthyl—O—(CH₂CH₂O)₁₅—H

Y-9 (CH₃)₂N-naphthyl—O—(CH₂CH₂O)₁₅—H

Y-10 (n)C₆H₁₃NHCO-naphthyl—O—(CH₂CH₂O)₁₅—H

Y-11 (t)C₄H₉, (t)C₄H₉-naphthyl—O—(CH₂CH₂O)₁₅—H

Y-12 phenyl—O—(CH₂CH₂O)₁₀—H

Y-13 (t)C₄H₉-phenyl—O—(CH₂CH₂O)₁₀—H

Y-14 (n)C₄H₉O-phenyl—O—(CH₂CH₂O)₁₀—H

Y-15 (n)C₆H₁₃CO₂-phenyl—O—(CH₂CH₂O)₁₀—H

Y-16 (n)C₆H₁₃OCO-phenyl—O—(CH₂CH₂O)₁₀—H

-continued

[Examples of Compound represented by the Formula (I)]
A-W

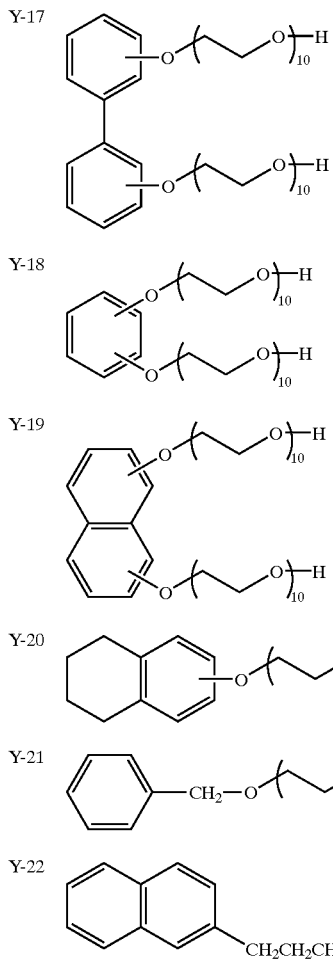

Preferred examples of the nonionic compound of the formula (I) includes the compound represented by the following formula (I-A) or (I-B).

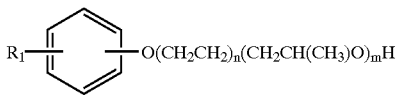
(I-A)

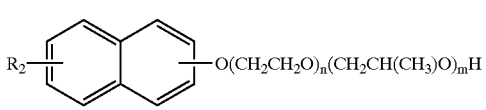
(I-B)

wherein $R_1$ and $R_2$ each represents H or an alkyl group having 1 to 100 carbon atoms and n and m each represents an integer ranging from 0 to 100, provided that n and m are not simultaneously zero.

The compound represented by the formula (I-A) includes polyoxyethylene phenylether, polyoxyethylene methylphenylether, polyoxyethylene octylphenylether, polyoxyethylene nonylphenylether and the like.

The compound represented by the formula (I-B) includes polylxyethylene naphthylether, polyoxyethylene methylnaphthylether, polyoxyethylene octylnaphthylether, polyoxyethylene nonylnaphthylether and the like.

In the compound represented by the formula (I-A) or (I-B), the number of repeating unit in a polyoxyethylene chain is preferably from 3 to 50, and more preferably from 5 to 30. The number of repeating unit in a polyoxypropylene chain is preferably from 0 to 10, and more preferably from 0 to 5. In the compound of the formula (I), a polyoxyethylene moiety and a polyoxypropylene moiety may be arrayed in the form of a random or block copolymer.

The nonionic compound of the formula (I), for example, the nonionic aromatic ether represented by the formula (I-A) or (I-B) may be used alone or in any combination of at least two of them.

The developer used in the present invention may comprise a nonionic surfactant shown below, which may possibly other than the nonionic compound represented by the formula (I). Such nonionic surfactants are for example, polyoxyethylene alkylethers such as polyoxyethylene laurylether, polyoxyethylene cetylether and polyoxyethylene stearylether, polyoxyethylene alkylarylethers such as polyoxyethylene octylphenylether and polyoxyethylene nonylphenylether, polyoxyethylene alkylesters such as polyoxyethylene stearate, sorbitan alkylesters such as sorbitan monolaurate, sorbitan monostearate, sorbitan distearate, sorbitan monooleate, sorbitan sesquioleate and sorbitan trioleate, monoglyceride alkylesters such as glycerol monostearate and glycerol monooleate, an adduct of polypropyleneoxide with ethyleneoxides, and the like.

Examples of anionic surfactants which may be used in the developer are alkyl benzene sulfonates such as sodium dodecylbenzenesulfonate, alkyl naphthalene sulfonates such as sodium butylnaphthalenesulfonate, sodium pentylnaphthalenesulfonate, sodium hexylnaphthalenesulfonate and sodium octylnaphthalenesulfonate, alkyl sulfates such as dodecyl sodium sulfate, alkyl sulfonates such as sodium dodecyl sulfonate, salts of sulfosuccinate such as dilauryl sodium sulfosuccinate, and the like.

In the developer, there may be used amphoteric surfactants including alkylbetanines such as laurylbetaine and stearylbetaine, and amino acid type amphoteric surfactants.

In the above surfactants, preferred are a nonionic surfactant such as the nonionic aromatic ether represented by the formula (I-A) or (I-B) and/or an anionic surfactant such as alkyl naphthalene sulfonates.

The surfactant may be used alone or in any combination of at least two of them. The amount of the surfactant in the developer ranges generally from 0.1 to 20% by weight in terms of the effective component thereof, preferably from 0.1 to 15% by weight, and more preferably from 1.0 to 8.0% by weight. If the amount is too small, the developing performance and ability in dissolving components of a light-sensitive layer will be degraded. If the amount is too large, printing durability of a printing plate will be degraded.

[Compound Represented by the General Formula (1)]

The developer used in the present invention may comprise a compound having a carboxyl group or a salt thereof, which is represented by the following general formula (1):

R—Ar—(COOM)$_n$ wherein R represents a hydrogen atom or a linear or branched alkyl group having carbon atoms of from 1 to 20, Ar represents an aromatic ring, M represents a hydrogen atom, monovalent metal or an ammonium group, and n represents 1 or 2.

In the formula (1), the alkyl represented by R may be substituted and such substituent includes hydroxyl group and amino group, and the aromatic ring represented by Ar includes benzene ring and naphthalene ring.

Examples of the compound represented by the formula (1) are benzoic acid, phthalic acid, p-ethyl benzoic acid, p-n-butyl benzoic acid, p-n-propyl benzoic acid, p-isopropyl benzoic acid, p-tert-butyl benzoic acid, p-2-hydroxyethyl benzoic acid, naphthoic acid and the like. The salt thereof includes a monovalent metal salt and an ammonium salt.

In the developer, the compound represented by the formula (1) may be used alone or in combination. The compound represented by the formula (1) may be used in the developer in an amount ranging from 0.1 to 5% by weight, and preferably from 0.5 to 3% by weight.

[Compound Represented by the General Formula (2)]

The developer used in the present invention may comprise a compound represented by the following general formula (2): $(R^1)(R^2)N-X-OH$ wherein $R^1$ and $R^2$ each represents an organic residue, and X represents a divalent connecting group.

In the formula (2), each of $R^1$ and $R^2$ is a monovalent organic residue, which may be the same or different. In the formula (2), $R^1$ and $R^2$ each represents a hydrogen atom, a halogen atom, a hydrocarbon radical which may have a substituent and/or an unsaturated bond, a heterocyclic group, a hydroxyl group, a substituted oxy group, a mercapto group, a substituted thio group, an amino group, a substituted amino group, a substituted carbonyl group, a carboxylate group, a sulfo group, a sulfonato group, a substituted sulfinyl group, a substituted sulfonyl group, a phosphono group, a substituted phosphono group, a phosphonato group, a substituted phosphonato group, a cyano group, a nitro group and the like, and $R^1$ and $R^2$ may link with each other to form a ring.

In the formula (2), X represents a hydrocarbon connecting group (a bivalent group made by excluding any one hydrogen atom from a hydrocarbon group) which may have a substituent and/or an unsaturated bond.

$R^1$ and $R^2$ in the formula (2) are exemplified below. Said hydrocarbon radical which may have a substituent and/or a unsaturated bond includes an alkyl group, a substituted alkyl group, an aryl group, a substituted aryl group, an alkenyl group, a substituted alkenyl group, an alkynyl group, a substituted alkynyl group and the like.

Said alkyl group includes a linear chain, branched chain or cyclic alkyl group having carbon atoms of from 1 to 20, specific examples thereof are methyl, ethyl, propyl, butyl, pentyl, hexyl, heptyl, octyl, nonyl, decyl, undecyl, dodecyl, tridecyl, hexadecyl, octadecyl, eicosyl, isopropyl, isobutyl, s-butyl, t-butyl, isopentyl, neopentyl, 1-metylbutyl, isohexyl, 2-ethylhexyl, 2-methylhexyl, cyclohexyl, cyclopentyl and 2-norbornyl groups and the like. Among these, preferred are a linear chain alkyl group having 1 to 12 carbon atoms, a branched chain alkyl group having 3 to 12 carbon atoms, and a cyclic alkyl group having 5 to 10 carbon atoms.

Said substituted alkyl group consists in a linkage of a substituent group and an alkylene group, and said substituent group includes a monovalent non-metallic atomic group other than a hydrogen atom. Preferred examples of the substituent group are halogen atoms (—F, —Br, —Cl and —I), hydroxyl, alkoxy, aryloxy, mercapto, alkylthio, arylthio, alkyldithio, aryldithio, amino, N-alkylamino, N,N-dialkylamino, N-arylamino, N,N-diarylamino, N-alkyl-N-arylamino, acyloxy, carbamoyloxy, N-alkylcarbanoyloxy, N-arylcarbamoyloxy, N,N-dialkylcarbamoyloxy, N,N-diarylcarbamoyloxy, N-alkyl-N-arylcarbamoyloxy, alkylsulfoxy, arylsulfoxy, acylthio, aminoacyl, N-alkylacylamino, N-arylacylamino, ureido, N'-alkylureido, N',N'-dialkylureido, N'-arylureido, N',N'-diarylureido, N'-alkyl-N'-arylureido, N-alkylureido, N-arylureido, N'-alkyl-N-alkylureido, N'-alkyl-N-arylureido, N',N'-dialkyl-N-alkylureido, N',N'-dialkyl-N-arylureido, N'-aryl-N-alkylureido, N'-aryl-N'-arylureido, N',N'-diaryl-N-alkylureido, N',N'-diaryl-N-arylureido, N'-alkyl-N'-aryl-N-alkylureido, N'-alkyl-N'-aryl-N-arylureido, alkoxycarbonylamino, aryloxycarbonylamino, N-alkyl-N-alkoxycarbonylamino, N-alkyl-N-aryloxycarbonylamino, N-aryl-N-alkoxycarbonylamino, N-aryl-N-aryloxycarbonylamino, formyl, acyl, carboxyl group and conjugate base group thereof (hereinafter referred to as carboxylate), alkoxycarbonyl, aryloxycarbonyl, carbamoyl, N-alkylcarbomoyl, N,N-dialkylcarbamoyl, N-arylcarbamoyl, N,N-diarylcarbamoyl, N-alkyl-N-arylcarbamoyl, alkylsulfinyl, arylsulfinyl, arylsulfonyl, sulfo (—$SO_3H$) and conjugate base group thereof (hereinafter referred to as sulfonato), alkoxysulfonyl, aryloxysulfonyl, sulfinamoyl, N-alkylsulfinamoyl, N,N-diarylsulfinamoyl, N-arylsulfinamoyl, N,N-diarylsulfinamoyl, N-alkyl-N-arylsulfinamoyl, sulfamoyl N-alkylsulfamoyl, N,N-dialkylsulfamoyl, N-arylsulfamoyl, N,N-diarylsulfamoyl, N-alkyl-N-arylsulfamoyl, N-acylsulfamoyl and conjugate base group thereof, N-alkylsulfonylsulfamoyl (—$SO_2NHSO_2$(alkyl)) and conjugate base group thereof, N-arylsulfonylsulfamoyl (—$SO_2NHSO_2$(aryl)) and conjugate base group thereof, N-alkylsulfonylcarbamoyl (—$CONHSO_2$(alkyl)) and conjugate base group thereof, N-arylsulfonylcarbamoyl (—$CONHSO_2$(aryl)) and conjugate base group thereof, alkoxysilyl (—$Si(O$-alkyl$)_3$), aryloxysilyl (—$Si(O$-aryl$)_3$), hydroxysilyl (—$Si(OH)_3$) and conjugate base group thereof, phosphono (—$PO_3H_2$) and conjugate base group thereof (hereinafter referred to as phosphonato), dialkylphosphono (—$PO_3$(alkyl)$_2$), diarylphosphono (—$PO_3$(aryl)$_2$), alkylarylphosphono (—$PO_3$(alkyl)(aryl)), monoalkylphosphono (—$PO_3H$(alkyl)) and conjugate base group thereof (hereinafter referred to as alkylphosphonato), monoarylphosphono (—$PO_3H$(aryl)) and conjugate base group thereof (hereinafter referred to as arylphosphonato), phosphonoxy (—$OPO_3H_2$) and conjugate base group thereof (hereinafter referred to as phosphonatoxy), dialkylphosphonoxy (—$OPO_3$(alkyl)$_2$) diarylphosphonoxy (—$OPO_3$(aryl)$_2$), alkylarylphosphonoxy (—$OPO_3$(alkyl)(aryl)), monoalkylphosphonoxy (—$OPO_3H$(alkyl)) and conjugate base group thereof (hereinafter referred to as alkylphosphonatoxy), monoarylphosphonoxy (—$OPO_3H$(aryl)) and conjugate base group thereof (hereinafter referred to as arylphosphonatoxy), cyano, nitro, aryl, alkenyl and alkynyl groups and the like.

Said alkyl group on the above substituent includes alkyl groups as described above. Specific examples of the aryl group on the above substituent are phenyl, biphenyl, naphthyl, tolyl, xylyl, mesityl, cumenyl, fluorophenyl, chlorophenyl, bromophenyl, chloromethylphenyl, hydroxyphenyl, methoxyphenyl, ethoxyphenyl, phenoxyphenyl, acetoxyphenyl, benzoyloxyphenyl, methylthiophenyl, phenylthiophenyl, methylaminophenyl, dimethylaminophenyl, acetylaminophenyl, carboxyphenyl, methoxycarbonylphenyl, ethoxycarbonylphenyl, phenoxycarbonylphenyl, N-phenylcarbamoylphenyl, phenyl, nitrophenyl, cyanophenyl, sulfophenyl, sulfonatophenyl, phosphonophenyl and phosphonatophenyl groups. Specific examples of the alkenyl group are vinyl, 1-propenyl, 1-butenyl, cinnamyl and 2-chloro-1-ethenyl groups and the like. Specific examples of the alkynyl group are ethynyl, 1-propynyl, 1-butynyl, trimethylsilylethynyl and phenylethynyl groups and the like.

Said acyl group ($R^4CO—$) includes those wherein $R^4$ is hydrogen atom, the above described alkyl, aryl, alkenyl or alkynyl group.

The alkylene group in the substituted alkyl group includes a bivalent organic residue which is shown by excepting any one hydrogen atom on the above mentioned alkyl group having carbon atoms of from 1 to 20, and preferred are a linear chain alkylene group having carbon atoms of from 1 to 12, a branched chain alkylene group having carbon atoms of from 3 to 12 and a cyclic alkylene group having carbon atoms of from 5 to 10.

Examples of the preferred substituted alkyl group are chloromethyl, bromomethyl, 2-chloroethyl, trifluoromethyl, methoxymethyl, methoxyethyoxyethyl, allyloxymethyl, phenoxymethyl, methylthiomethyl, tolylthiomethyl, ethylaminoethyl, diethylaminopropyl, morpholinopropyl, acetyloxymethyl, benzoyloxymethyl, N-cyclohexylcarbamoyloxyethyl, N-phenylcarbamoyloxyethyl, acetylaminoethyl, N-methylbenzoylaminopropyl, 2-oxoethyl, 2-oxopropyl, carboxypropyl, methoxycarbonylethyl, methoxycarbonylmethyl, methoxycarbonybutyl, ethoxycarbonylmethyl, butoxycarbonylmethyl, allyloxycarbonylmethyl, benzyloxycarbonylmethyl, methoxycarbonylphenylmethyl, trichloromethylcarbonylmethyl, allyloxycarbonylbutyl, chlorophenoxycarbonylmethyl, carbamoylmethyl, N-methylcarbamoylethyl, N,N-dipropylcarbamoylmethyl, N-(methoxyphenyl)carbamoylethyl, N-methyl-N-(sulfophenyl)carbamoylmethyl, sulfopropyl, sulfobutyl, sulfonatobutyl, sulfamoylbutyl, N-ethylsulfamoylmethyl, N,N-dipropylsulfamoylpropyl, N-tolylsulfamoylpropyl, N-methyl-N-(phosphonophenyl)sulfamoyloctyl,

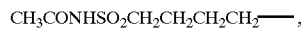

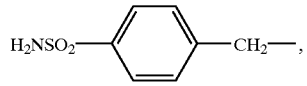

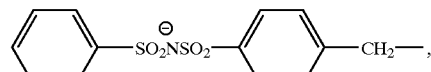

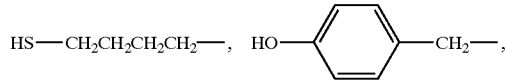

phosphonobutyl, phosphonatohexyl, diethylphosphonobutyl, diphenylphosphonopropyl, methylphosphonobutyl, methylphosphonato butyl, tolylphosphonohexyl, tolylphosphonato hexyl, phosphonoxypropyl, phosphonatoxybutyl, benzyl, phenethyl, α-methylbenzyl, 1-methyl-1-phenylethyl, p-methylbenzyl, cinnamyl, allyl, 1-propenylmethyl, 2-butenyl, 2-methylallyl, 2-methylpropenylmethyl, 2-propynyl, 2-butynyl and 3-butynyl groups and the like.

The aryl group includes a monocyclic group and a condensed-ring group such as those are formed from condensation of from 1 to 3 benzene rings, condensation of a benzene ring and five-membered unsaturated ring, and the like. Examples of the aryl group are phenyl, naphthyl, anthryl, phenanthryl, indenyl, acenaphthenyl and fluorenyl groups and the like. Among these, phenyl and naphthyl groups are preferable.

Said substituted aryl group consists of binding of a substituent group to an aryl group. As a substituent group bonding to a carbon atom which is a ring-forming member of the aryl group, a monovalent non-metallic atomic group other than a hydrogen atom is exemplified. Preferred examples of the substituent group include the alkyl groups, the substituted alkyl groups and the substituent groups on the substituted alkyl groups as described above. Specific examples of preferred substituted aryl group are biphenyl, tolyl, xylyl, mesityl, cumenyl, chlorophenyl, bromophenyl, fluorophenyl, chloromethylphenyl, trifluoromethylphenyl, hydroxyphenyl, methoxyphenyl, methoxyethoxyphenyl, allyloxyphenyl, phenoxyphenyl, methylthiophenyl, tolylthiophenyl, phenylthiophenyl, ethylaminophenyl, diethylaminophenyl, morpholinophenyl, acetyloxyphenyl, benzoyloxyphenyl, N-cyclohexylcarbamoyloxyphenyl, N-phenylcarbamoyloxyphenyl, acetylaminophenyl, N-methylbenzoylaminophenyl, carboxyphenyl, methoxycarbonylphenyl, allyloxycarbonylphenyl, chlorophenoxycarbonylphenyl, carbamoylphenyl, N-methylcarbamoylphenyl, N,N-dipropylcarbamoylphenyl, N-(methoxyphenyl)carbamoylphenyl, N-methyl-N-(sulfophenyl)carbamoylphenyl, sulfophenyl, sulfonato phenyl, sulfamoylphenyl, N-ethylsulfamoylphenyl, N,N-dipropylsulfamoylphenyl, N-tolylsulfamoylphenyl, N-methyl-N-(phosphonophenyl)sulfamoylphenyl, phosphonophenyl, phosphonato phenyl, diethylphosphonophenyl, diphenylphosphonophenyl, methylphosphonophenyl, methylphosphonato phenyl, tolylphosphonophenyl, tolylphosphonato phenyl, allylphenyl, 1-propenylmethylphenyl, 2-butenylphenyl, 2-methylallylphenyl, 2-methylpropenylphenyl, 2-propynylphenyl, 2-butynylphenyl and 3-butynylphenyl groups and the like.

The alkenyl group includes those described above. The substituted alkenyl group consists of replacing a hydrogen atom in the alkenyl group with a substituent group which bonds thereto. The substituent group includes the groups which are described above as substituents on the substituted alkyl group, and the alkenyl group includes those described above. Specific examples of preferred substituted alkenyl group are shown below.

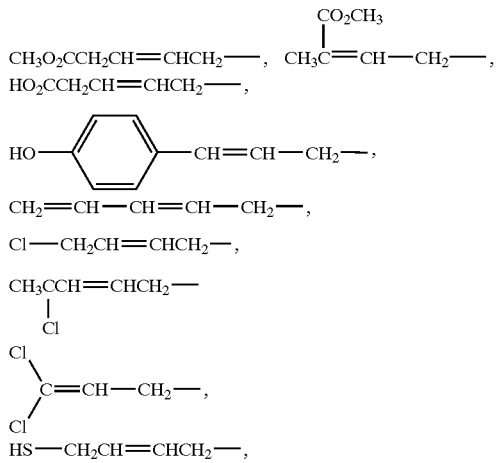

The alkynyl group includes those described above. The substituted alkynyl group consists of replacing a hydrogen atom in the alkynyl group with a substituent group which bonds thereto. The substituent group includes the groups which are described above as substituents on the substituted alkyl group, and the alkynyl group includes those described above.

The heterocyclic group includes a monovalent group which is shown by excepting any one hydrogen atom on a heterocycle, and a monovalent group which is shown by excepting any one hydrogen atom on the above monovalent group and linking thereto a substituent group which is described above as a substituent group in the substituted alkyl group, such monovalent group being referred to as a substituted heterocyclic group. Specific examples of preferred heterocyclic group are shown below.

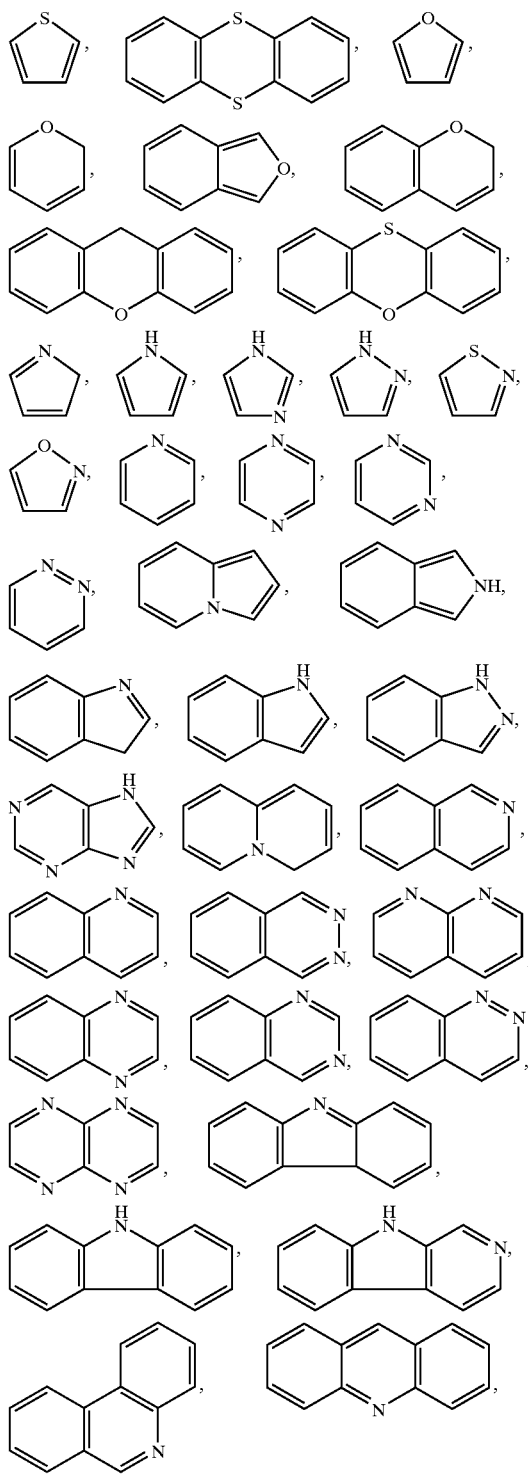

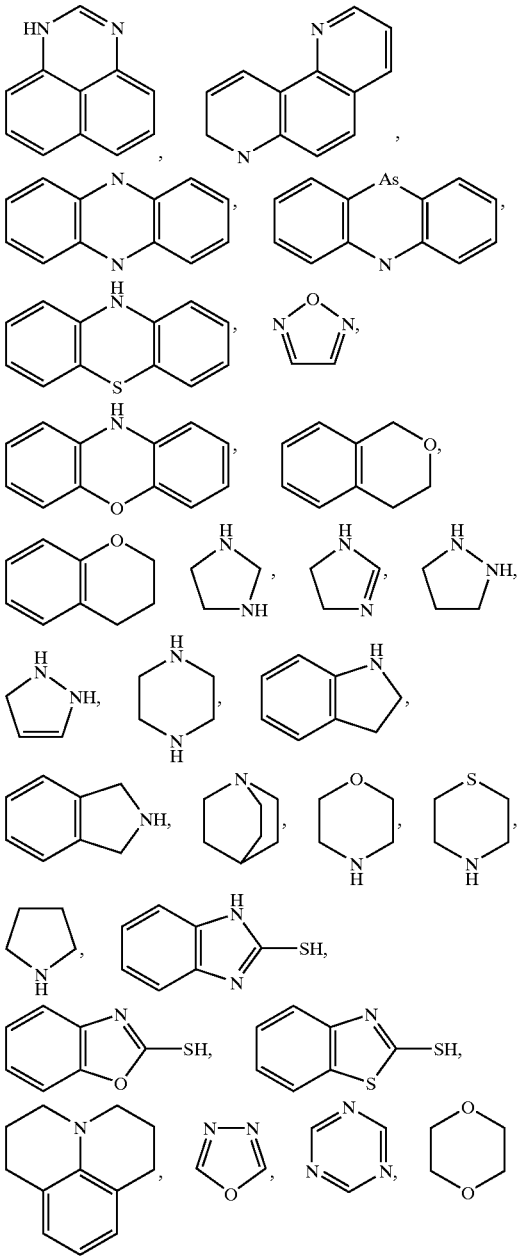

The substituted oxy group ($R^5O$—) includes those wherein $R^5$ is a monovalent non-metallic atomic group other than a hydrogen atom. Preferred substituted oxy group includes alkoxy, aryloxy, acyloxy, carbamoyloxy, N-alkylcarbamoyloxy, N-arylcarbamoyloxy, N,N-dialkylcarbamoyloxy, N,N-diarylcarbamoyloxy, N-alkyl-N-arylcarbamoyloxy, alkylsulfoxy, arylsulfoxy, phosphonoxy and phosphonato oxy groups and the like. The alkyl group and the aryl group in the above oxy group may be the above mentioned alkyl, substituted alkyl, aryl and substituted aryl groups.

The acyl group ($R^6CO$—) in said acyloxy group includes those wherein $R^6$ is the above mentioned alkyl, substituted alkyl, aryl and substituted aryl groups. Preferable substituent groups in the above group are alkoxy, aryloxy, acyloxy and arylsulfoxy groups and the like. Specific examples of preferred substituted oxy group are methoxy, ethoxy, propyloxy, isopropyloxy, butyloxy, pentyloxy, hexyloxy, dodecyloxy, benzyloxy, allyloxy, phenethyloxy, carboxyethyloxy, methoxycarbonylethyloxy, ethoxycarbonylethyloxy, methoxyethoxy, phenoxyethoxy, methoxyethoxyethoxy, ethoxyethoxyethyoxy, morpholinoethoxy, morpholinoethoxy, morpholinopropyloxy, allyloxyethoxyethoxy, phenoxy, tolyloxy, xylyloxy, mesityloxy, cumenyloxy, methoxyphenyloxy, ethoxyphenyloxy, chlorophenyloxy, bromophenyloxy, acetyloxy, benzoyloxy, naphthyloxy, phenylsulfonyloxy, phosphonoxy and phosphonato oxy groups and the like.

The substituted thio group ($R^7S—$) includes those wherein $R^7$ is a monovalent non-metallic atomic group other than a hydrogen atom. Preferable substituted thio groups are alkylthio, arylthio, alkyldithio, aryldithio and acylthio groups and the like. The alkyl and aryl groups in the above thio group include the above mentioned alkyl, substituted alkyl, aryl and substituted aryl groups, and the acyl gourp ($R^6CO—$) in the above acylthio group is as described above. Among these, alkylthio and aryl thio groups are preferable. Specific examples of preferred substituted thio groups are methylthio, ethylthio, phenylthio, ethoxyethylthio, carboxyethylthio and methoxycarbonylthio groups and the like.

The substituted amino group ($R^8NH—$, $(R^9)(R^{10})N—$) includes those wherein $R^8$, $R^9$, $R^{10}$ are a monovalent non-metallic atomic group other than a hydrogen atom. Preferable examples of the substituted amino group are N-alkylamino, N,N-dialkylamino, N-arylamino, N,N-diarylamino, N-alkyl-N-arylamino, acylamino, N-alkylacylamino, N-arylacylamino, ureido, N'-alkylureido, N',N'-dialkylureido, N'-arylureido, N',N'-diarylureido, N'-alkyl-N'-arylureido, N-alkylureido, N-arylureido, N'-alkyl-N-alkylureido, N'-alkyl-N-arylureido, N'-N'-dialkyl-N-alkylureido, N',N'-dialkyl-N-arylureido, N'-aryl-N-alkylureido, N'-aryl-N-arylureido, N',N'-diaryl-N-alkylureido, N',N'-diaryl-N-arylureido, N'-alkyl-N'-aryl-N-alkylureido, N'-alkyl-N'-aryl-N-arylureido, alkoxycarbonylamino, aryloxycarbonylamino, N-alkyl-N-alkoxycarbonylamino, N-alkyl-N-aryloxycaronylamino, N-aryl-N-alkoxycarbonylamino and N-aryl-N-aryloxycarbonylamino groups and the like. The alkyl and aryl groups in the above amino groups include the above mentioned alkyl, substituted alkyl, aryl and substituted aryl groups, and the acyl gourp ($R^6CO—$) in the above acylamino, N-alkylacylamino and N-arylacylamino groups is as described above. Among these, more preferred are N-alkylamino, N,N-dialkylamino, N-arylamino and acylamino groups and the like. Specific examples of preferable substituted amino group are methylamino, ethylamino, diethylamino, morpholino, piperidino, phenylamino, benzoylamino and acetylamino groups and the like.

The substituted carbonyl group ($R^{11}—CO—$) includes those wherein $R^{11}$ is a monovalent non-metallic atomic group. Examples of the substituted carbonyl group are formyl, acyl, carboxyl, alkoxycarbonyl, aryloxycarbonyl, carbamoyl, N-alkylcarbamoyl, N,N-dialkylcarbamoyl, N-arylcarbamoyl, N,N-diarylcarbamoyl and N-alkyl-N-arylcarbamoyl groups and the like. The alkyl and aryl groups in the above substituted carbonyl groups include the above mentioned alkyl, substituted alkyl, aryl and substituted aryl groups. Among these, preferable substituted carbonyl groups are formyl, acyl, carboxyl, alkoxycabonyl, aryloxycarbonyl, carbamoyl, N-alkylcarbamoyl, N,N-dialkylcarbamoyl and N-arylcarbamoyl groups and the like, and more preferred are formyl, acyl, alkoxycabonyl and aryloxycarbonyl groups and the like. Specific examples of the substituted carbonyl group are formyl, acetyl, benzoyl, carboxyl, methoxy carbonyl, allyloxycaronyl, N-methylcarbamoyl, N-phenylcarbamoyl, N,N-diethylcarbamoyl and morpholinocarbonyl groups and the like.

The substituted sulfinyl group ($R^{12}—SO—$) includes those wherein $R^{12}$ is a monovalent non-metallic atomic group. Examples of the substituted sulfinyl group are alkylsulfinyl, arylsulfinyl, sulfinamoyl, N-alkylsulfinamoyl, N,N-dialkylsulfinamoyl, N-arylsulfinamoyl, N,N-diarylsulfinamoyl, N-alkyl-N-arylsulfinamoyl and N-alkyl-N-arylsulfinamoyl groups and the like. The alkyl and aryl groups in the above substituted sulfinyl groups include the above mentioned alkyl, substituted alkyl, aryl and substituted aryl groups. Among these, preferable substituted sulfinyl groups are alkylsulfinyl and arylsulfinyl groups and the like. Specific examples of the substituted sulfinyl groups are hexylsulfinyl, benzylsulfinyl and tolylsulfinyl groups and the like.

The substituted sulfonyl group ($R^{13}—SO_2—$) includes those wherein $R^{13}$ is a monovalent non-metallic atomic group. Preferable examples of the substituted sulfonyl group are alkylsulfonyl and arylsulfonyl groups and the like. The alkyl and aryl groups in the above substituted sulfonyl group include the above mentioned alkyl, substituted alkyl, aryl and substituted aryl groups. Specific examples of the substituted sulfonyl group are butylsulfonyl and chlorophenyl-sulfonyl groups and the like.

The sulfonato group ($—SO_3^-$) denotes a conjugate base anionic ion group of a sulfo group ($—SO_3H$) as described above, and normally the sulfonate group is preferably used with a counter cationic ion. Said counter cationic ion includes those generally known, for example, various oniums such as ammoniums, sulfoniums, phosphoniums, iodoniums, aziniums and the like, and metallic ions such as $Na^+$, $K^+$, $Ca^{2+}$, $Zn^{2+}$ and the like.

The carboxylate group ($—CO_2^-$) denotes a conjugate base anionic ion groups of a carboxyl group ($—CO_2H$) as described above, and normally the carboxylate group is preferably used with a couter cationic ion. Said counter cationic ion includes those generally known, for example, various oniums such as ammoniums, sulfoniums, phosphoniums, iodoniums, aziniums and the like, and metallic ions such as $Na^+$, $K^+$, $Ca^{2+}$, $Zn^{2+}$ and the like.

The substituted phosphono group denotes a group consisting of replacing one or two hydroxyl groups in a phosphono group with an organic oxo group which differs from a hydroxyl group. Preferable examples of the substituted phosphono group are dialkylphosphono, diarylphosphono, alkylarylphosphono, monoalkylphosphono and monoarylphosphono groups and the like. The alkyl and aryl groups in the above substituted phosphono group include the above mentioned alkyl, substituted alkyl, aryl and substituted aryl groups. Among these, dialkylphosphono and diarylphosphono groups are preferable. Specific examples of these groups are diethylphosphono, dibutylphosphono, diphenylphosphono groups and the like.

The phosphonato group ($—PO_3^{2-}$, $—PO_3H^-$) denotes a conjugate base anionic ion groups derived from an acid first-dissociation or an acid second-dissociation of a phosphono group ($—PO_3H_2$) as described above. Normally the phosphonate group is preferably used with a counter cationic ion. Said counter cationic ion includes those generally known, for example, various oniums such as ammoniums, sulfoniums, phosphoniums, iodoniums, aziniums and the like, and metallic ions such as $Na^+$, $K^+$, $Ca^{2+}$, $Zn^{2+}$ and the like.

The substituted phosphonato group is a conjugate base anionic ion group of the above mentioned substituted phosphono group which consists of replacing one hydroxyl group in a phosphono group with an organic oxo group. Examples of the substiututed phosphonate group are a conjugate base of the above mentioned monoalkylphosphono group ($-PO_3H(alkyl)$) and monoarylphosphono group ($-PO_3H(aryl)$). Normally the substituted phosphonate group is preferably used with a counter cationic ion. Said counter cationic ion includes those generally known, for example, various oniums such as ammoniums, sulfoniums, phosphoniums, iodoniums, aziniums and the like, and metallic ions such as $Na^+$, $K^+$, $Ca^{2+}$, $Zn^{2+}$ and the like.

Specific examples of the compound represented by the formula (2) are shown below.

TABLE 1

| Compound | $R^1$ | $R^2$ | X |
|---|---|---|---|
| G-1 | H | H | $-CH_2-$ |
| G-2 | H | $-CH_2-OH$ | $-CH_2-$ |
| G-3 | H | H | $-CH_2CH_2-$ |
| G-4 | H | $-CH_2-OH$ | $-CH_2CH_2-$ |
| G-5 | H | $-CH_2CH_2-OH$ | $-CH_2CH_2-$ |
| G-6 | $-CH_2-OH$ | $-CH_2CH_2-OH$ | $-CH_2CH_2-$ |
| G-7 | $-CH_2CH_2-OH$ | $-CH_2CH_2-OH$ | $-CH_2CH_2-$ |

In the developer, the compound represented by the formula (2) may be used alone or in combination. The compound represented by the formula (2) may be used in the developer in an amount ranging from 0.01 to 3% by weight, and preferably from 0.05 to 0.5% by weight.

[Water-soluble Sulfite Salts, Alkaline-soluble Mercapto Compounds and Thioether Compounds]

The developer of the used in the present invention may comprise at least one compound selected from the group consisting of water-soluble sulfite salts, alkaline-soluble mercapto compounds and thioether compounds.

<Water-soluble Sulfite Salts>

The water-soluble sulfite salts which are usable in the present invention are alkaline metal salts such as sodium, potassium and lithium salts, and alkaline earth metal salts such as magnesium salt. The water-soluble sulfite salts may be used in the developer in an amount ranging from 0.05 to 3% by weight, and preferably 0.1 to 0.5% by weight. Sulfite ammonium salt is less stable and ammonium smell is recognised when it is used in an automatic processor, and therefore sodium salt and potassium salt are easy to deal and preferable.

<Alkaline-soluble Mercapto Compounds and Thioether Compounds>

The alkaline-soluble mercapto compound or thioether compound which may be used in the present invention is a compound which has in a molecule thereof one or more mercapto group and/or thioether group, and preferably has further at least one acid radical. More specifically, the alkaline-soluble mercapto compound and/or thioether compound are preferably those having one or more mercapto group and one or more carboxyl group.

Spepcific examples of the alkaline-soluble mercapto compound and thioether compound used in the present invention are mercaptoacetic acid, 2-mercaptopropionic acid, 3-mercaptopropionic acid, 4-mercaptobutanoic acid, 2,4-dimercaptobutanoic acid, 2-mercaptotetradecanoic acid, 2-mercaptomyristic acid, mercaptosuccinic acid, 2,3-dimercaptosuccinic acid, cysteine, N-acetylcysteine, N-(2-mercaptopropionyl)glycine, N-(2-mercapto-2-methylpropionyl)glycine, N-(3-mercaptopropionyl)glycine, N-(2-mercapto-2-methylpropionyl)cysteine, penicillamine, N-acetylpenicillamine, glycine-cysteine-glutamine condensation product, N-(2,3-dimercaptopropionyl)glycine, 2-mercaptonicotinic acid, thiosalicylic acid, 3-mercaptobenzoic acie, 4-mercaptobenzoic acid, 3-carboxy-2-mercaptopyridine, 2-mercaptobenzothiazole-5-carboxylic acid, 2-mercapto-3-phenylpropenoic acid, 2-mercapto-5-carboxyethylimidazole, 5-mercapto-1-(4-carboxyphenyl)tetrazole, N-(3,5-dicarboxyphenyl)-2-mercaptotetrazole, 2-(1,2-dicarboxyethylthio)-5-mercapto-1,3,4-thiadiazole, 2-(5-mercapto-1,3,4-thiadiazolylthio) hexanoic acid, 2-mercaptoethanesulfonic acid, 2,3-dimercapto-1-propanesulfonic acid, 2-mercaptobenzenesulfonic acid, 4-mercaptobenzenesulfonic acid, 3-mercapto-4-(2-sulfophenyl)-1,2,4-triazole, 2-mercaptobenzothiazole-5-sulfonic acid, 2-mercaptobenzoimidazole-6-sulfonic acid, mercaptosuccineimide, 4-mercaptobenzenesulfonamido, 2-mercaptobenzoimidazole-5-sulfonamide, 3-mercapto-4-(2-(methylaminosulfonyl)ethoxy)toluene, 3-mercapto-4-(2-(methylsulfonylamino)ethoxy)toluene, 4-mercapto-N-(p-methylphenylsulfonyl)benzamide, 4-mercaptophenol, 3-mercaptophenol, 2-mercaptophenol, 3,4-dimercaptotoluene, 2-mercaptohydroquinone, 2-thiouracil, 3-hydroxy-2-mercaptopyridine, 4-hydroxythiophenol, 4-hydroxy-2-mercaptopyridine, 4,6-dihydroxy-2-mercaptopyridine, 2,3-dihydroxypropylmercaptan, 2-mercapto-4-octylphenylether methylether, 2-mercapto-4-octylphenol methanesulfonylaminoethylether, 2-mercapto-4-octylphenol methylaminosulfonylbutylether, thiodiglycol acid, thiodiphenol, 6,8-dithiooctanoic acid, an alkaline metal salt thereof, an alkaline earth metal salt thereof and organic amine salts thereof. Among these, preferred are thiosalicylic acid, N-(2,3-dimercaptopropionyl)glycine, 2-(1,2-dicarboxyethylthio)-5-mercapto-1,3,4-thiadiazole, N-(2-mercapto-2-methylpropionyl)cysteine, cystein and the like.

These compounds may be used alone or in combination. In the developer, the alkaline-soluble mercapto compound and/or the thioether compound may be used in an amount ranging from 0.001 to 10% by weight. In the light of exhibiting a sufficient developing ability to non-image areas so as to prevent scumming in case of development with a relatively lower pH value, the amount of not less than 0.001% by weight is preferable, and the amount of more than 10% by weight tends to degrade a mechanical strength of light-cured portion in a light-sensitive layer, which results in deterioration of printing durability in a lithographic printing plate.

The developer used in the present invention may comprise any one or more compounds selected from the compound represented by the general formula (1), the compound represented by the general formula (2), the water-soluble sulfide salt, the alkaline-soluble mercapto compound and thioether compound.

[Chelating Agent]

The developer may comprise a chelating agent. Such chelating agent includes polyphosphates such as $Na_2P_2O_7$, $Na_5P_3O_3$, $Na_3P_3O_9$, $Na_2O_4P(NaO_3P)PO_3Na_2$ and Calgon (trade mane of sodium polymetaphosphate, available from Calgon Inc, (USA)); polyaminocarboxylic acids and salts thereof such as ethylenediaminetetraacetic acid and potassium and sodium salts thereof, diethylenetriaminepentaacetic acid and potassium and sodium salts thereof, triethylenetetraminehexaacetic acid and potassium and sodium salts thereof, hydroxyethylethylenediaminetriacetic acid and potassium and sodium salts thereof, nitrilotriacetic acid and potassium and sodium salts thereof, 1,2-diaminocyclohexanetetraacetic acid and potassium and sodium salts thereof and 1,3-diamino-2-propanoltetraacetic acid and potassium and sodium salts thereof; and organophosphonic acids, potassium, sodium and ammonium salts thereof such as 2-phosphonobutane tricarboxylic acid-1,2,4 and potassium and sodium salts thereof, 2-phosphonobutanone tricarboxylic acid-2,3,4 and potassium and sodium salts thereof, 1-phosphonoethane tricarboxylic acid-1,2,2 and potassium and sodium salts thereof, 1-hydroxyethane-1,1-diphosphonic acid and potassium and sodium salts thereof and amino tri(methylene phosphonic acid) and potassium and sodium salts thereof. The optimum amount of the chelating agent varies depending on the hardness and the amount of hard water used, but the amount thereof in general ranges from 0.01 to 5% by weight and preferably 0.01 to 0.5% by weight in the developer practically used.

[Others]

The developer may further comprise as occasion demands, other components than those described above. Such components include organic carboxylic acids such as decanoic acid and the like; organic solvents such as isopropyl alcohol, benzyl alcohol, ethyl cellosolve, butyl cellosolve, phenyl cellosolve, propylene glycol, diacetone alcohol and the like; a reducing agent; a colorant dye; a pigment; a water softner; an antiseptic agent and the like.

When an automatic processor is used to perform development procedure in the plate-making method according to the present invention, the developer becomes exhausted depending on the processing amount of plates, and therefore a replenisher or flesh developer may be used to restore the processing capacity of developer.

[Conductivity]

The developer used in the present invention has suitably a conductivity of from 3 to 40 mS/cm, preferably from 3 to 30 mS/cm in the light of a developing speed, and more preferably from 3 to 20 mS/cm. The conductivity of the developer may be determined by, for example, at 25° C. using a commercially available conductivity meter "CM60S" (trademark) made by Toa Denpa Kogyo Corporation.

[Foaming Property]

Foaming property of the developer may be determined by the following procedure: 30 ml of the developer is poured into a transparent glass bottle having a volume of 100 ml and an inner diameter of 3 cm, the glass bottle is shaken up and down at a speed of 3 times per one second for one minute at a temperature of 25° C., then the glass bottle is allowed to stand so as to determine the time which is taken until the generated foam disappears (foam-disappearing time). When said time is smaller, the foaming property of the developer is lower and favorable, in other words, anti-foaming property is higher.

The developer used in the present invention has preferably the lower foaming property and a foam-disappearing time of not more than 5 minutes which is determined by the above procedure. Thus the developer used in the present invention does not cause an obstacle due to foaming during development processing procedure.

[Color]

The developer used in the present invention may be colorless or preferably as colored as visually recognized so as to avoid a false recognition between the developer and water.

[Viscosity]

The developer used in the present invention has generally a viscosity of from 1.0 to 10.0 cp in the form of diluted solution at a temperature of 25° C. so that development processing procedure can be smoothly performed.

[PS Plate]

The present invention will now be explained in detail with respect to the PS plate for use in making a lithographic printing plate.

The PS plate for use in the present invention comprises a substrate and a light-sensitive layer provided thereon. The light-sensitive layer is not particularly limited, but preferably a light-sensitive layer of photopolymerizable type capable of producing images in a negative-working mode through laser irradiation.

The light-sensitive layer of photopolymerizable type preferably comprises mainly the following components:

(a) a compound having at least one addition-polymerizable ethylenically unsaturated double bond, (b) a polymer that is soluble or swellable in an aqueous alkaline solution, and (c) a photopolymerization initiator system.

The above-mentioned light-sensitive layer may further comprise a variety of compounds serving as, for example, a coloring agent, a plasticizer, and a thermal polymerization inhibitor if necessary.

The component (a), that is, a compound having at least one addition-polymerizable ethylenically unsaturated double bond can be selected freely from the group consisting of compounds having at least one, preferably two or more terminal ethylenically unsaturated bonds.

The component (a) may be in any form such as a monomer, a prepolymer including a dimmer, trimer and oligomer, or a mixture and copolymer thereof.

Examples of the aforementioned monomers and copolymers thereof include esters of unsaturated carboxylic acids such as acrylic acid, methacrylic acid, itaconic acid, crotonic acid, isocrotonic acid, and maleic acid with aliphatic polyhydric alcohol compounds and amides of aliphatic polyvalent amine compounds with unsaturated carboxylic acids.

Specific examples of the esters prepared from the unsaturated carboxylic acids and the aliphatic polyhydric alcohol compounds include:

acrylates such as ethylene glycol diacrylate, trimethylene glycol diacrylate, 1,3-butanediol diacrylate, tetramethylene glycol diacrylate, propylene glycol diacrylate, neopentyl glycol diacrylate, trimethylolpropane triacrylate, trimethylolpropane tri(acryloyloxypropyl)ether, trimethylolethane triacrylate, hexanediol diacrylate, 1,4-cyclohexanediol diacrylate, tetraethylene glycol diacrylate, pentaerythritol diacrylate, pentaerythritol triacrylate, pentaerythritol tetraacrylate, dipentaerythritol diacrylate, dipentaerythritol pentaacrylate, dipentaerythritol hexaacrylate, sorbitol triacrylate, sorbitol tetraacrylate, sorbitol pentaacrylate, sorbitol hexaacrylate, tri(acryloyloxyethyl)isocyanurate, and polyester acrylate oligomers;

methacrylates such as tetramethylene glycol dimethacrylate, trimethylene glycol dimethacrylate, neopentyl glycol dimethacrylate, trimethylolpropane trimethacrylate, trimethylolethane trimethacrylate, ethylene glycol dimethacrylate, 1,3-butanediol dimethacrylate, hexanediol dimethacrylate, pentaerythritol dimethacrylate, pentaerythritol trimethacrylate, pentaerythritol tetramethacrylate, dipentaerythritol dimethacrylate, dipentaerythritol hexamethacrylate, dipentaerythritol pentamethacrylate, sorbitol trimethacrylate, sorbitol tetramethacrylate, bis[p-(3-methacryloxy-2-hydroxypropoxy)phenyl]dimethylmethane, and bis[p-(methacryloxyethoxy)phenyl]dimethylmethane;

itaconates such as ethylene glycol diitaconate, propylene glycol diitaconate, 1,3-butanediol diitaconate, 1,4-butanediol diitaconate, tetramethylene glycol diitaconate, pentaerythritol diitaconate, and sorbitol tetraitaconate;

crotonates such as ethylene glycol dicrotonate, tetramethylene glycol dicrotonate, pentaerythritol dicrotonate, and sorbitol tetradicrotonate;

isocrotonates such as ethylene glycol diisocrotonate, pentaerythritol diisocrotonate, and sorbitol tetraisocrotonate;

maleates such as ethylene glycol dimaleate, triethylene glycol dimaleate, pentaerythritol dimaleate, and sorbitol tetramaleate; and mixtures of the above-mentioned ester monomers.

Specific examples of the amide monomers prepared from the aliphatic polyvalent amine compounds and the unsaturated carboxylic acids include methylenebis-acrylamide, methylenebis-methacrylamide, 1,6-hexamethylenebis-acrylamide, 1,6-hexamethylenebis-methacrylamide, diethylenetriamine trisacrylamide, xylylenebis-acrylamide, and xylylenebis-methacrylamide.

Examples of the component (a) further include vinyl urethane compounds, each having at least two polymerizable vinyl groups in the molecule thereof, obtained by adding a vinyl monomer having a hydroxyl group represented by the following general formula (A) to a polyisocyanate compound having at least two isocyanate groups in the molecule thereof as disclosed in Japanese Patent Publication for Opposition Purpose (hereunder referred to as "J.P. KOKOKU) No. Sho 48-41708:

$$CH_2=C(R_3)COOCH_2CH(R_4)OH \quad (A)$$

wherein $R_3$ and $R_4$ are each independently H or $CH_3$.

Furthermore, other examples of the component (a) for use in the present invention are urethane acrylates as disclosed in J.P. KOKAI No. Sho 51-37193 and J.P. KOKOKU No. Hei 2-32293; polyester acrylates as disclosed in J.P. KOKAI No. Sho 48-64183 and J.P. KOKOKU Nos. Sho 49-43191 and Sho 52-30490; polyfunctional (meth)acrylates such as epoxy acrylates obtained through reactions of epoxy resins with (meth)acrylic acid; and photo-curable monomers and oligomers disclosed in Journal of Japan Adhesion Society, 1984, Vol. 20, No. 7, pp.300–308.

The amount of the component (a) suitably ranges from 5 to 70% by weight (hereinafter simply referred to as "%"), preferably 10 to 50% based on the total weight of the overall components.

The component (b) for use in the light-sensitive layer of the PS plate is a polymer soluble or swellable in an aqueous alkaline solution as mentioned above. The polymer works as a film-forming agent for the light-sensitive layer, and may appropriately be selected in consideration of the application of the aqueous alkaline developer. For example, use of a water-soluble organic polymer makes it possible to develop the light-sensitive layer with water.

Examples of such organic polymers include addition polymers having a carboxyl group in the side chain thereof, such as (meth)acrylic acid copolymers, itaconic acid copolymers, crotonic acid copolymers, maleic acid copolymers, and partially esterified maleic acid copolymers as disclosed in J.P. KOKAI Nos. Sho 59-44615, Sho 54-92723, Sho 59-53836 and Sho 59-71048, and J.P. KOKOKU Nos. Sho 54-34327, Sho 58-12577 and Sho 54-25957; and acidic cellulose derivatives having a carboxyl group in the side chain thereof. In addition to the above, polymers obtained by adding a cyclic acid anhydride to an addition polymer having hydroxyl group can also be used. Among the polymers which are preferable as the component (b) are copolymers of benzyl (meth)acrylate, (meth)acrylic acid and other optional addition-polymerizable vinyl monomers and copolymers of allyl (meth)acrylate, (meth)acrylic acid and other optional addition-polymerizable vinyl monomers. Further, polyvinyl pyrrolidone and polyethylene oxide are useful as the water-soluble organic polymers. Alcohol-soluble polyamides and polyethers of 2,2-bis-(4-hydroxyphenyl)-propane with epichlorohydrin are also useful as the component (b) for increasing the strength of the cured film.

Furthermore, polyurethane resins as disclosed in J.P. KOKOKU Nos. Hei 7-120040, Hei 7-120041, Hei 7-120042 and Hei 8-12424, and J.P. KOKAI Nos. Sho 63-287944, Sho 63-287947, Hei 1-271741 and Hei 11-352691 are also useful as the component (b).

The strength of the cured film of the light-sensitive layer can be improved by introducing a radical reactive group into the side chain of the above-mentioned polymer. Examples of the functional groups that can readily cause addition-polymerization reaction are ethylenically unsaturated bond group, amino group, and epoxy group; examples of the functional groups that can be formed into radicals by light exposure are mercapto group, thiol group, halogen atoms, triazine structure, and onium salt structure; and examples of polar groups are carboxyl group and imide group. The ethylenically unsaturated bond groups such as acryl group, methacryl group, allyl group and styryl group are particularly preferable as the functional groups that can readily cause addition-polymerization reaction, and in addition, other functional groups selected from the group consisting of amino group, hydroxyl group, phosphonic acid group, phosphoric acid group, carbamoyl group, isocyanate group, ureido group, ureylene group, sulfonic acid group, and ammonio group are also useful.

It is preferable that the above-mentioned polymer serving as the component (b) be controlled to have an appropriate molecular weight and acid value in order to maintain the development performance of a photopolymerizable composition comprising the components (a), (b) and (c). In consideration of development using the developer used in the present invention, it is preferable to use any of the above-mentioned polymers with a weight-average molecular weight of from 5,000 to 300,000, and an acid value of 0.2 to 5.0 meq/g.

Such an organic polymer can be incorporated into the photopolymerizable composition in any suitable amounts. However, if the amount of the organic polymer exceeds 90%, undesirable problems will arise, for instance, the strength of images formed by development may be insufficient. In light of this, the amount of the organic polymer is preferably in the range of from 10 to 90%, more preferably from 30 to 80%. It is preferable that the weight ratio of the photopolymerizable ethylenically unsaturated compound (component (a)) to the organic polymer (component (b)) be in the range of 1:9 to 9:1, more preferably 2:8 to 8:2, and further preferably 3:7 to 7:3.

The component (c) for use in the light-sensitive layer of the PS plate is a photopolymerization initiator. Depending upon the wavelength of light emitting from the employed light source, the photopolymerization initiator may appropriately be selected from a variety of photopolymerization initiators well known in patents and references. Further, two or more polymerization initiators may be used in combination to prepare a combined initiator system.

Some combined initiator systems are proposed to cope with the light sources of visible light with a wavelength of 400 nm or more, Ar laser, second harmonic wave of semiconductor laser, and SHG-YAG laser. For instance, U.S. Pat. No. 2,850,445 discloses certain dyes capable of causing photoreduction such as Rose Bengal, Eosine, and Erythrosine. Moreover, combined initiator systems using a dye and an initiator are as follows: a composite initiator system of a dye and an amine (J.P. KOKOKU No. Sho 44-20189); a combined system of hexaarylbiimidazole, a radical generator and a dye (J.P. KOKOKU No. Sho 45-37377); a system of hexaarylbiimidazole and p-dialkylaminobenzylidene ketone (J.P. KOKOKU No. Sho 47-2528 and J.P. KOKAI No. Sho 54-155292); a system comprising a cyclic cis-α-dicarbonyl compound and a dye (J.P. KOKAI No. Sho 48-84183); a system comprising a cyclic triazine and a merocyanine dye (J.P. KOKAI No. Sho 54-151024); a system comprising a 3-ketocoumarin compound and an activator (J.P. KOKAI Nos. Sho 52-112681 and Sho 58-15503); a system comprising biimidazole, a styrene derivative, and a thiol (J.P. KOKAI No. Sho 59-140203); a system comprising an organic peroxide and a dye (J.P. KOKAI Nos. Sho 59-1504, Sho 59-140203, Sho 59-189340 and Sho 62-174203, J.P. KOKOKU No. Sho 62-1641, and U.S. Pat. No. 4,766,055); a system comprising a dye and an active halogen compound (J.P. KOKAI Nos. Sho 63-258903 and Hei 2-63054); a system comprising a dye and a borate compound (J.P. KOKAI Nos. Sho 62-143044, Sho 62-150242, Sho 64-13140, Sho 64-13141, Sho 64-13142, Sho 64-13143, Sho 64-13144, Sho 64-17048, Hei 1-229003, Hei 1-298348 and Hei 1-138204); a system comprising a dye with a rhodanine ring and a radical generator (J.P. KOKAI Nos. Hei 2-179643 and Hei 2-244050); a system comprising titanocene and a 3-ketocoumarin dye (J.P. KOKAI No. Sho 63-221110); a system comprising titanocene, a xanthene dye and an addition-polymerizable ethylenically unsaturated compound having amino group or urethane group (J.P. KOKAI Nos. Hei 4-221958 and Hei 4-219756); a system comprising titanocene and a particular merocyanine dye (J.P. KOKAI No. Hei 6-295061); and a system comprising titanocene, a dye having benzopyran ring (J.P. KOKAI No. Hei 8-334897) and the like.

Of the above-mentioned initiator systems, the systems using titanocene compounds are particularly preferred because of excellent sensitivity. The titanocene compounds may appropriately be selected, for example, from a variety of titanocene compounds as disclosed in J.P. KOKAI Nos. Sho 59-152396 and Sho 61-151197.

Specific examples of such titanocene compounds are as follows: di-cyclopentadienyl-Ti-di-chloride, di-cyclopentadienyl-Ti-bis-phenyl, di-cyclopentadienyl-Ti-bis-2,3,4,5,6-pentafluorophen-1-yl, di-cyclopentadienyl-Ti-bis-2,3,5,6-tetrafluorophen-1-yl, di-cyclopentadienyl-Ti-bis-2,4,6-trifluorophen-1-yl, di-cyclopentadienyl-Ti-bis-2,6-di-fluorophen-1-yl, di-cyclopentadienyl-Ti-bis-2,4-difluorophen-1-yl, di-methylcyclopentadienyl-Ti-bis-2,3,4,5,6-tetrafluorophen-1-yl, di-methylcyclopentadienyl-Ti-bis-2,6-difluorophen-1-yl, and di-cyclopentadienyl-Ti-bis-2,6-difluoro-3-(pyrro-1-yl)-phen-1-yl.

Furthermore, some assistants such as an amine compound and a thiol compound may be added to the photopolymerization initiator when necessary. The addition of such hydrogen-donating compounds can enhance the performance of the employed photopolymerization initiator.

The amount of the photopolymerization initiator is suitably in the range of 0.05 to 100 parts by weight, preferably 0.1 to 70 parts by weight, and more preferably 0.2 to 50 parts by weight, with respect to 100 parts by weight of the ethylenically unsaturated compound.

In addition to the foregoing fundamental components (a), (b) and (c), a small amount of thermal polymerization inhibitor is desirably contained in the photopolymerizable composition to inhibit undesired thermal polymerization of the photopolymerizable ethylenically unsaturated compound during preparation or storage of the photopolymerizable composition. Examples of such thermal polymerization inhibitors include hydroquinone, p-methoxyphenol, di-t-butyl-p-cresol, pyrogallol, t-butyl catechol, benzoquinone, 4,4'-thiobis(3-methyl-6-t-butylphenol), 2,2'-methylenebis(4-methyl-6-t-butylphenol), N-nitrosophenyl hydroxylamine cerium salt and N-nitrosophenyl hydroxylamine aluminum salt. The amount of the thermal polymerization inhibitor is preferably from about 0.01 to about 5% based on the total weight of the photopolymerizable composition. In addition, the photopolymerizable composition may optionally comprise, for example, higher fatty acid derivatives such as behenic acid and behenic acid amide when necessary. To effectively eliminate the polymerization inhibitory effect of oxygen, such higher fatty acid derivatives may be localized in the surface portion of the light-sensitive layer at the drying step for the formation of the light-sensitive layer. The amount of the higher fatty acid derivatives is preferably from about 0.5 to about 10% based on the total weight of the photopolymerizable composition.

Furthermore, the composition may further comprise a coloring agent for pigmenting the resulting light-sensitive layer. Examples of the coloring agent include pigments such as phthalocyanine pigments (C.I. Pigment Blue 15:3, 15:4, 15:6 and the like), azo pigments, carbon black, and titanium oxide; and dyes such as Ethyl Violet, Crystal Violet, azo dyes, anthraquinone dyes and cyanine dyes. The amount of the coloring agent including such pigments and dyes is preferably from about 0.5 to about 20% based on the total weight of solid content in the obtained light-sensitive layer.

Moreover, the photopolymerizable composition may further comprise inorganic fillers and plasticizers such as dioctyl phthalate, dimethyl phthalate and tricresyl phosphate for improving the physical properties of the resultant cured film. The amount of such additives including the inorganic fillers and plasticizers is preferably 10% or less of the total weight of solid content in the obtained light-sensitive layer.

To provide the light-sensitive layer on a substrate, which will be described later, the photopolymerizable composition is dissolved in various kinds of organic solvents to prepare a coating liquid and then the coating liquid is applied onto the surface of the substrate. Examples of the solvents include acetone, methyl ethyl ketone, cyclohexane, ethyl acetate, ethylene dichloride, tetrahydrofuran, toluene, ethylene glycol monomethyl ether, ethylene glycol monoethyl ether, ethylene glycol dimethyl ether, propylene glycol monomethyl ether, propylene glycol monoethyl ether, acetylacetone, cyclohexanone, diacetone alcohol, ethylene glycol monomethyl ether acetate, ethylene glycol ethyl ether acetate, ethylene glycol monoisopropyl ether, ethylene glycol monobutyl ether acetate, 3-methoxypropanol, methoxymethoxyethanol, diethylene glycol monomethyl ether, diethylene glycol monoethyl ether, diethylene glycol dimethyl ether, diethylene glycol diethyl ether, propylene glycol monomethyl ether acetate, propylene glycol monoethyl ether acetate, 3-methoxypropyl acetate, N,N-dimetylformamide, dimethyl sulfoxide, γ-butyrolactone, methyl lactate, and ethyl lactate. These solvents may be used alone or in combination. The concentration of the solid content in the coating liquid is suitably from 1 to 50% by weight.

To improve the surface quality of the coated surface, the photopolymerizable composition for use in the light-sensitive layer may further comprise a surfactant.

When the coating liquid for the photosensitive layer is applied, the coating amount is preferably from about 0.1 to about 10 g/m², preferably from 0.3 to 5 g/m², and more preferably from 0.5 to 3 g/m² on a dry basis.

The photosensitive layer of the PS plate will now be described in terms of acid value.

The acid value of the light-sensitive layer referred to in the present invention is an amount equivalent to an acid with pKa of 9 or less contained in units per gram of the light-sensitive layer that is provided on the substrate. In the calculation of the acid value, overcoat layers including an oxygen barrier layer, which are provided on the light-sensitive layer are not considered. The acid value of the light-sensitive layer can be experimentally obtained by titration using an aqueous solution of sodium hydroxide, and also by calculation from the total content of compounds having acid groups with pKa of 9 or less in the photopolymerizable composition.

The acid value of the light-sensitive layer can be controlled by changing the amount ratio of the component (a) to the component (b) having acid group, and employing as the component (b) a low-acid value binder polymer containing a smaller amount of acid group. In the latter case, the use of a binder polymer with an acid value of 1.5 meq/g or less, preferably 1.2 meq/g or less is effective.

It is preferable that the light-sensitive layer of the PS plate for use in the present invention has an acid value of 1.0 meq/g or less, more preferably in the range of 0.20 to 0.60 meq/g in light of the application to the lithographic printing plate, and most preferably in the range of 0.30 to 0.50 meq/g in terms of image-forming performance.

The substrate for use in the PS plate will now be explained in detail.

Any dimensionally stable plate-shaped materials can be used as the substrates for the PS plate for use in the present invention. In light of dimensional stability, aluminum substrates are particularly preferred. Aluminum plates substantially composed of aluminum and aluminum-containing alloys, for example, alloys of aluminum with metals such as silicon, copper, manganese, magnesium, chromium, zinc, lead, bismuth and nickel can be used. Alternatively, an aluminum or aluminum alloy sheet may be attached to a sheet of paper or a plastic film to form a laminate sheet, or aluminum or aluminum alloys may be deposited thereon. Further, a composite sheet obtained by attaching an aluminum sheet to a polyethylene terephthalate film as disclosed in J.P. KOKOKU No. Sho 48-18327 is also preferably used as the substrate of the PS plate.

Such aluminum substrates are subjected to various kinds of surface treatment.

One of the surface treatment methods for the aluminum substrates is graining, i.e., mechanical surface-graining, chemical etching, electrolytical graining as disclosed in J.P. KOKAI No. Sho 56-28893. To be more specific, the surface of the aluminum substrate may be electrochemically grained in an electrolytic solution comprising hydrochloric acid or nitric acid. Alternatively, the aluminum surface may be subjected to mechanical graining such as wire brush graining by rubbing the aluminum surface with metal wire; ball graining using the combination of abrasive ball and abrasive material; and brush graining using nylon brush and abrasive agent. Such surface-graining methods may be used alone or in combination.

Of the above-mentioned methods for roughening the aluminum surface to a predetermined extent, the electrochemical surface-graining in an electrolytic solution of hydrochloric acid or nitric acid is particularly effective in the present invention. In this case, the electrical charge is suitably in the range of from 100 to 400 C/dm². More specifically, the aluminum substrate may be placed in an electrolytic solution containing 0.1 to 50% of hydrochloric acid or nitric acid and electrolysis may be carried out at a temperature of from 20 to 100° C. for one second to 30 minutes with the electrical charge controlled to 100 to 400 C/dm².

The aluminum substrate grained in the above-mentioned manner may be subjected to chemical etching with acids or alkalis. The use of alkalis for an etchant is advantageous for industrial applications because the time required to destroy the fine structure can be curtailed. Preferable examples of the alkalis for use in etching are sodium hydroxide, sodium carbonate, sodium aluminate, sodium metasilicate, sodium phosphate, potassium hydroxide and lithium hydroxide. It is preferable to control the concentration of the alkali in the etchant to 1 to 50% and the temperature of the etchant to 20 to 100° C. so that the amount of aluminum to be dissolved in the etchant is in the range of from 5 to 20 g/m³.

The etched aluminum surface may be then subjected to pickling for removing smut remaining on the etched surface. For pickling, nitric acid, sulfuric acid, phosphoric acid, chromic acid, hydrofluoric acid, fluoroboric acid are preferably employed. In particular, after the electrochemical surface-graining, to bring the etched aluminum surface into contact with a 15–65 wt % sulfuric acid solution at a temperature of from 50 to 90° C. as disclosed in J.P. KOKAI No. Sho 53-12739 is one of the preferable methods for removal of the smut after etching. The alkali etching method as described in J.P. KOKOKU No. Sho 48-28123 is also desirable.

Consequently, the Al substrate for use in the present invention is suitably finished to have a surface roughness of 0.3 to 0.7 μm in terms of (Ra).

Further, it is preferable that the aluminum surface thus treated be subjected to anodization. The anodization may be conducted in accordance with the methods well known in this field. More specifically, a direct current or alternating current is applied to the aluminum substrate in an aqueous solution or nonaqueous solution of hydrochloric acid, sulfuric acid, phosphoric acid, nitric acid, chromic acid, boric acid, oxalic acid, sulfamic acid, benzenesulfonic acid, or mixtures thereof, so that an anodized layer is deposited on the surface of the aluminum substrate.

The anodizing conditions cannot be definitely determined because the conditions vary depending upon the electrolytic solution to be employed. It is generally proper that the concentration of the electrolytic solution ranges from 1 to 80%, the liquid temperature ranges from 5 to 70° C., the current density be controlled to 0.5 to 60 A/dm², the applied voltage be in the range of 1 to 100 V, and the time for electrolysis be 10 to 100 sec.

One of the preferable anodizing methods is described in British Patent No. 1,412,768 where anodization is conducted in sulfuric acid at high current density, and the other method is to use an electrolytic bath of phosphoric acid as disclosed in U.S. Pat. No. 3,511,661.

In the present invention, it is preferable that the anodized layer deposited on the aluminum substrate by anodization has a thickness of 1 to 10 g/m², more preferably 1.5 to 7 g/m², and further preferably 2 to 5 g/m². When the thickness of the above-mentioned anodized layer is less than 1 g/m², the resultant PS plate may be susceptible to scratches, while extremely large amount of electric power is required to produce the anodized layer with a thickness of more than 10 g/m².

Furthermore, after surface-graining and anodization, the aluminum substrate may be subjected to sealing. For sealing, the aluminum substrate is immersed into hot water or a hot aqueous solution of an inorganic or organic salt, or placed in a steam bath. The aluminum surface may be subjected to still another surface treatment such as silicate treatment using silicates of alkali metals, or immersion in an aqueous solution of potassium fluorozirconate or phosphate.

In addition to the above-mentioned aluminum substrates, other plate-shaped materials with dimensional stability can also be used as the substrates for the PS plate. Examples of such dimensionally stable plate-shaped materials include paper, laminate sheets of paper with plastics such as polyethylene, polypropylene and polystyrene, metal plates such as zinc and copper plates, plastic films such as cellulose diacetate, cellulose triacetate, cellulose propionate, cellulose butyrate, cellulose acetate butyrate, cellulose nitrate, polyethylene terephthalate, polyethylene, polystyrene, polypropylene, polycarbonate and polyvinyl acetal films, and a sheet of paper or a plastic film to which the above-mentioned metal plates such as zinc and copper plates are attached or on which those metals are deposited.

Such substrates are preferably subjected to surface treatment to make the surface hydrophilic according to the nature of each substrate. The surface can be made hydrophilic by treatments based on some chemical reactions, such as etching, oxidation, reduction, and sol-gel coating. Alternatively, particular compounds capable of being adsorbed by the surface of the substrate may be coated thereon. In the latter case, for example, organic compounds carrying a phosphorus atom-containing acidic groups, e.g, phosphoric acid, phosphonic acid and phosphinic acid, or organic silicone compounds effectively contained in an adhesive layer provided on the aluminum substrate as described in J.P. KOKAI No. 2001-109139 are preferably used for the anodized aluminum substrates.

The PS plate for use in the present invention can be produced by providing the light-sensitive layer on the substrate.

The PS plate may further comprise an organic or inorganic undercoating layer that is interposed between the substrate and the photosensitive layer.

Furthermore, the PS plate for use in the present invention may further comprise a protective layer such as an oxygen barrier layer comprising a water-soluble vinyl polymer as the main component that is overlaid on the light-sensitive layer.

Examples of the water-soluble vinyl polymers for use in the oxygen barrier protection layer include a polyvinyl alcohol which may be partially substituted with ester, ether and acetal; and a copolymer comprising such a partially substituted vinyl alcohol unit and an unsubstituted vinyl alcohol unit in such a substantial amount that can impart the required water-solubility to the resultant copolymer. In the protection layer, polyvinyl alcohols hydrolyzed to the extent of 71 to 100% and have a degree of polymerization of 300 to 2400 are preferably used. Specific examples of the commercially available polyvinyl alcohol products are PVA-105, PVA-110, PVA-117, PVA-117H, PVA-120, PVA-124, PVA-124H, PVA-CS, PVA-CST, PVA-HC, PVA-203, PVA-204, PVA-205, PVA-210, PVA-217, PVA-220, PVA-224, PVA-217EE, PVA-220, PVA-224, PVA-217EE, PVA-217E, PVA-220E, PVA-224E, PVA-405, PVA-420, PVA-613, and L-8, which are made by KURARAY Co., Ltd. Examples of the above-mentioned copolymers preferably used in the oxygen barrier protection layer include polyvinyl acetate chloroacetate or propionate, polyvinyl formal, polyvinyl acetal and copolymer thereof, which are preferably hydrolyzed to the extent of 88 to 100%. In addition to the above, polyvinyl pyrrolidone, gelatin, and gum arabic are also effectively used for the oxygen barrier protection layer. These polymers may be used alone or in combination.

When the oxygen barrier protection layer is provided by coating, purified water is preferably used alone as a solvent, or in combination with alcohols such as methanol and ethanol, and ketones such as acetone and methyl ethyl ketone. It is proper that the solid content in the coating liquid for formation of the oxygen barrier protection layer be in the range of 1 to 20% by weight The oxygen barrier protection layer may further comprise well known additives such as a surfactant for improving the coating characteristics and a water-soluble plasticizer for enhancing the physical properties of the obtained layer.

Examples of the above-mentioned water-soluble plasticizer include propionamide, cyclohexanediol, glycerin, and sorbitol. Water-soluble (meth)acrylic polymers may be added.

The coating amount for the oxygen barrier protection layer is suitably in the range of about 0.1 to about 15 $g/m^2$, preferably in the range of about 1.0 to about 5.0 $g/m^2$ on a dry basis.

The PS plate thus produced undergoes light exposure and development, thereby obtaining a lithographic printing plate. The process for making the lithographic printing plate will now be explained.

The PS plate may be entirely heated, if required, prior to light exposure, during light exposure, or from the initiation of light exposure to termination of development. To heat the PS plate as mentioned above can accelerate the reaction for image formation in the light-sensitive layer, thereby improving the sensitivity and the printing durability and also stabilizing the sensitivity. In this case, the PS plate may be heated under moderate conditions, more specifically, at 150° C. or less. When the PS plate is heated to extremely high temperatures, there will occur some problems, for example, fogging of non-image areas. After termination of the development, it is also effective to subject the images obtained by development to entire heating or entire light exposure for improving the strength of obtained images and the printing durability. In this case, the obtained images may be heated to high temperatures, generally in the range of 200 to 500° C. When the temperature is set within the above-mentioned range, the heating after development has an effect on strength of images without deterioration of the substrate and thermal decomposition of image areas.

Any light exposure methods well known in this field can be used in the present invention. Preferably used are light sources for laser beams. For example, the light sources for laser beams having wavelengths in the range of 350 to 450 nm are as follows:

gas laser such as $Ar^+$ laser (364 nm, 351 nm, 10 mW~1 W), $Kr^+$ laser (356 nm, 351 nm, 10 mW–1 W), and He—$Cd^+$ laser (441 nm, 325 nm, 1 mW–100 mW);

solid state laser such as combination of Nd:YAG (YVO4) and SHG (355 nm, 5 mW–1 W) and combination of Cr:LiSAF and SHG (430 nm, 10 mW);

semiconductor laser such as $KNbO_3$, ring resonator (430 nm, 30 mW), combination of waveguide optical wavelength conversion device, AlGaAs semiconductor and InGaAs semiconductor (380–450 nm, 5–100 mW), combination of waveguide optical wavelength conversion device, AlGaInP semiconductor and AlGaAs semiconductor (300–350 nm, 5–100 mW), and AlGaInN (350–450 nm, 5–30 mW); and pulse laser such as $N_2$ laser (337 nm, pulse: 0.1–10 mJ), and XeF (351 nm, pulse: 10–250 mJ).

In particular, AlGaInN semiconductor laser beams (commercially available as InGaN-based semiconductor laser beams with wavelengths of 400–410 nm and 5–30 mW) are preferable in terms of wavelength characteristics and cost.

As the light sources for laser beams having wavelengths of 450 to 700 nm, $Ar^+$ laser (488 nm), YAG-SHG laser (532 nm), He—Ne laser (633 nm), He—Cd laser, and red-color semiconductor laser (650–690 nm) are available.

As the light sources for laser beams having wavelengths of 700 to 1200 nm, semiconductor laser (800–850 nm) and Nd-YAG laser (1064 nm) are preferably used.

In addition to the above, there can also be employed a variety of light sources such as ultrahigh pressure, high pressure, intermediate pressure and low pressure mercury lamps, chemical lamps, carbon arc lamps, xenon lamps, metal halide lamps, and ultraviolet laser lamps (ArF excimer laser, KrF excimer laser and the like). Further, radial rays such as electron beams, X-rays, ion beams and far infrared rays can also be used. In consideration of cost, the above-mentioned light sources for laser beams with wavelengths of 350 nm or more are particularly preferable.

Any light exposure mechanism, for example, internal drum exposure method, external drum exposure method, or flat bed method is applicable to the present invention.

The components constituting the light-sensitive layer of the PS plate can be made soluble in neutral water or weak alkaline aqueous solutions when those components have high water-solubility. This type of PS plate can be mounted on a printing machine for achieving the light exposure and development successively to make a lithographic printing plate.

After completion of development using the above-mentioned developer, the printing plate may be subjected to various kinds of after-treatment using rinsing water, surfactant-containing rinsings, and liquids for desensitization containing gum arabic and starch derivatives as disclosed in J.P. KOKAI Nos. Sho 54-8002, Sho 55-115045 and Sho 59-58431. Such methods for after-treatment may be employed in combination in the present invention.

In one embodiment of the plate-making method of the present invention, the light-exposed plate is washed with water, said plate is then developed with the developer and washed with water again, and then a desensitizing solution is applied to the surface of the plate with a coating amount of not less than 0.02 g/m² on a dry basis, said desensitizing solution comprising (a) gum arabic in amount of 0 to 3% by weight and (b) a modified starch in amount of 5 to 30% by weight.

The desensitizing solution used in the above embodiment of the present invention will be explained in detail below.
[Desensitizing Solution]

The desensitizing solution for use in the present invention comprises (a) gum arabic in an amount of 0 to 3% by weight and (b) a modified starch in an amount of 5 to 30% by weight. In addition to the above, (c) a surfactant in an amount of 0.01 to 2% by weight, (d) a water-soluble salt in an amount of 0.01 to 2% by weight, and (e) a solvent in an amount of 0.05 to 2% by weight may be optionally contained in the desensitizing solution.

The gum arabic that is contained in the desensitizing solution when necessary serves to cover the plate surface therewith and enhance the desensitizability of the plate surface. An excess of gum arabic may impair the sensitizability of an image area formed on the printing plate. In light of this, the amount of gum arabic is suitably in the range of 0 to 3% by weight, preferably 0 to 2% by weight, based on the total weight of the desensitizing solution.

Examples of the modified starch used as the component (b) in the desensitizing solution include roasted starches such as white dextrin, yellow dextrin, and British gum; enzyme-modified dextrins such as enzyme dextrin and Schardinger dextrin; solubilized starches such as acid-thinned starch; oxidized starches such as dialdehyde starch; pregelatinized starches such as pregelatinized modified starch and pregelatinized unmodified starch; starch esters such as starch phosphate, fatty starch, starch sulfate, starch nitrate, starch xanthate, and starch carbamate; starch ethers such as carboxyalkyl starch, hydroxyalkyl starch, sulfoalkyl starch, cyanoethyl starch, allyl starch, benzyl starch, carbamylethyl starch, and dialkylamino starch; crosslinked starches such as methylol crosslinked starch, hydroxyalkyl crosslinked starch, phosphoric acid crosslinked starch, and dicarboxylic acid crosslinked starch; and graft copolymerized starches such as graft copolymer of starch and polyacrylamide, graft copolymer of starch and polyacrylic acid, graft copolymer of starch and polyvinyl acetate, graft copolymer of starch and polyacrylonitrile, graft copolymer of cationic starch and polyacrylate, graft copolymer of cationic starch and vinyl polymer, graft copolymer of starch, polystyrene and maleic acid, and graft copolymer of starch and polyethyleneoxide.

Of the above-mentioned modified starches, roasted starches, enzyme dextrin, enzyme-modified dextrin, starch phosphate, and starch ethers are preferable because such starches do not hinder the sensitization of an image area. Those starches may be used alone or in combination. Such starches may be contained in an amount of 5 to 30% by weight, preferably 7 to 20% by weight, based on the total weight of the desensitizing solution.

The desensitizing solution for use in the present invention may comprise a surfactant, preferably an anionic surfactant and a nonionic surfactant. Examples of the nonionic surfactant include polyoxyethylene alkyl ethers, polyoxyethylene alkylphenyl ethers, polyoxyethylene polystyrylphenyl ethers, polyoxyethylene polyoxypropylene alkyl ethers, glycerin fatty acid partial esters, sorbitan fatty acid partial esters, pentaerythritol fatty acid partial esters, propylene glycol monofatty acid esters, sucrose fatty acid partial esters, polyoxyethylene sorbitan fatty acid partial esters, polyoxyethylene sorbitol fatty acid partial esters, polyethylene glycol fatty acid esters, polyglycerin fatty acid partial esters, polyoxyethylenated castol oils, polyoxyethylene glycerin fatty acid partial esters, fatty acid diethanolamides, N,N-bis-2-hydroxyalkylamines, polyoxyethylene alkylamines, triethanolamine fatty acid esters, and trialkylamine oxides.

Examples of the anionic surfactant include fatty acid salts, abietates, hydroxyalkane sulfonates, alkanesulfonates, dialkylsulfosuccinates, linear alkylbenzenesulfonates, branched alkylbenzenesulfonates, alkylnaphthalenesulfonates, alkylphenyloxypolyoxyethylene propyl sulfonates, salts of polyoxyethylene alkylsulfophenyl ether, sodium salts of N-methyl-N-oleyltaurine, disodium salts of N-alkylsulfosuccinic acid monoamide, petroleum sulfonates, sulfated castor oil, sulfated beef tallow oil, sulfates of fatty acid alkyl ester, alkylsulfates, polyoxyethylene alkyl ether sulfates, fatty acid monoglyceride sulfates, polyoxyethylene alkylphenyl ether sulfates, polyoxyethylene styrylphenyl ether sulfates, alkyl phosphates, polyoxyethylene alkyl ether phosphates, polyoxyethylene alkylphenyl ether phosphates, partially saponified products of styrene-maleic anhydride copolymer, partially saponified products of olefin-maleic anhydride copolymer, and naphthalenesulfonate—formalin condensates.

In addition to the above-mentioned nonionic and anionic surfactants, cationic surfactants such as alkylamine salts, quaternary ammonium salts, polyoxyethylene alkylamine salts, and polyethylene polyamine derivatives; and amphoteric surfactants such as carboxybetaines, aminocarboxylic acids, sulfobetaines, aminosulfates and imidazolines may be used when necessary.

Of the above-mentioned surfactants, polyoxyethylene alkyl ethers, polyoxyethylene alkylphenyl ethers, polyoxyethylene polystyrylphenyl ethers, polyoxyethylene polyoxypropylene alkyl ethers, glycerin fatty acid partial esters, sorbitan fatty acid partial esters, pentaerythritol fatty acid partial esters, propylene glycol monofatty acid esters, polyoxyethylene sorbitan fatty acid partial esters, polyoxyethylene glycerin fatty acid partial esters, polyethylene glycol fatty acid esters, polyoxyethylenated castol oils, dialkylsulfosuccinates, alkylbenzenesulfonates, alkylnaphthalenesulfonates, alkylsulfonates and polyoxyethylene alkylamine salts are preferred because they can serve to prevent the decrease of sensitization of an image area formed on a lithographic printing plate. In particular, polyoxyethylene alkylphenyl ethers, polyoxyethylene polystyrylphenyl ethers, glycerin fatty acid partial esters, sorbitan fatty acid partial esters, pentaerythritol fatty acid partial esters, propylene glycol monofatty acid esters, polyethylene glycol fatty acid esters, dialkylsulfosuccinates and alkylsulfates are preferably used in the present invention.

When the nonionic surfactants are used, it is preferable that the nonionic surfactant have an HLB value of 14 or less, more preferably 11 or less. This is because such nonionic surfactants have the effect of stabilizing emulsified products.

Those surfactants may be used alone or in combination. It is particularly preferable to use the alkylphenyl type nonionic surfactants such as polyoxyethylene alkylphenyl ethers and polyoxypropylene dialkylphenyl ethers in combination with the dialkylsulfosuccinates; the fatty acid ester type surfactants in combination with the dialkylsulfosuccinates; and the alkylphenyl type nonionic surfactants, the fatty acid ester type surfactants, and the dialkylsulfosuccinates in combination. The above combinations have an synergetic effect of facilitating the preparation of the desensitizing solution as an emulsified product and inhibiting the decrease of sensitization in an image area.

The surfactant may be contained in an amount of about 0.01 to about 2% by weight, preferably 0.05 to 2% by weight, based on the total weight of the desensitizing solution.

As mentioned above, the desensitizing solution for use in the present invention may preferably comprise a water-soluble salt. The presence of the water-soluble salt in the desensitizing solution can make the hydrophilic nature of a non-image area more noticeable when the desensitizing solution is applied to the lithographic printing plate. Alkali metal salts and ammonium salts are preferably used as the water-soluble salts. In particular, water-soluble alkali metal salts and ammonium salts of acids such as acetic acid, molybdic acid, boric acid, nitric acid, sulfuric acid, phosphoric acid, and polyphosphoric acid produce satisfactory results. Specific examples of such water-soluble salts include ammonium acetate, sodium acetate, potassium acetate, sodium molybdate, potassium molybdate, sodium borate, ammonium borate, lithium nitrate, sodium nitrate, potassium nitrate, sodium primary phosphate, sodium secondary phosphate, sodium tertiary phosphate, potassium primary phosphate, potassium secondary phosphate, potassium tertiary phosphate, ammonium tertiary phosphate, sodium polyphosphate, and potassium sulfate. Of those acids, potassium acetate, sodium borate, ammonium borate, potassium nitrate, sodium molybdate, potassium molybdate, and potassium sulfate are particularly preferable.

The above-mentioned water-soluble acids, which may be used alone or in combination are preferably contained in an amount of about 0.01 to about 2% by weight, more preferably in an amount of 0.1 to 1% by weight, based on the total weight of the desensitizing solution.

As previously stated, the desensitizing solution for use in the present invention may comprise a solvent, which serves as a lipophilic material to improve the ink acceptability of an image area. Polyhydric alcohols, monohydric alcohols, and aliphatic hydrocarbons can be used as the solvents.

Preferable examples of the polyhydric alcohols are ethylene glycol, diethylene glycol, triethylene glycol, propylene glycol, tetraethylene glycol, polyethylene glycol, glycerin, and sorbitol.

Preferable examples of the monohydric alcohols serving as the solvents include alkyl alcohols such as propyl alcohol, butyl alcohol, pentanol, hexanol, heptanol, and octanol; and alcohols having an aromatic ring, such as benzyl alcohol, phenoxy ethanol, and phenylamino ethyl alcohol.

Preferable examples of the aliphatic hydrocarbons are n-hexanol, methylamyl alcohol, 2-ethylbutanol, n-heptanol, 3-heptanol, 2-octanol, 2-ethylhexanol, nonanol, 3,5,5-trimethylhexanol, n-decanol, undecanol, n-dodecanol, trimethylnonyl alcohol, tetradecanol, heptadecanol, 2-ethyl-1,3-hexanediol, 1,6-hexanediol, 2,5-hexanediol, 3,4-hexanediol, 1,8-octanediol, 1,9-nonanediol, and 1,10-decanediol.

The desensitizing solution for use in the present invention may further comprise a plasticizer, a fatty acid, a fatty oil, a wax, and a lipophilic resin.

Preferable examples of the plasticizer for use in the desensitizing solution include phthalic acid diesters such as dibutyl phthalate, diheptyl phthalate, di-n-octyl phthalate, di-(2-ethylhexyl)phthalate, dinonyl phthalate, didecyl phthalate, dilauryl phthalate, and butylbenzyl phthalate; aliphatic dibasic acid esters such as dioctyl azelate, dioctyl adipate, dibutyl glycol adipate, dibutyl sebacate, di-(2-ethylhexyl)sebacate, and dioctyl sebacate; epoxydized triglyceride such as epoxydized soybean oil; phosphates such as tricresyl phosphate, trioctyl phosphate, and trischloroethyl phosphate; and benzoates such as benzyl benzoate. Of those plasticizers, dioctyl adipate, dibutyl sebacate, and dioctyl azelate are particularly preferable in terms of no odor and high safety.

Preferable examples of the fatty acid for use in the desensitizing solution include saturated fatty acids such as caproic acid, enanthic acid, caprylic acid, pelargonic acid, capric acid, undecylic acid, lauric acid, tridecylic acid, myristic acid, pentadecylic acid, palmitic acid, heptadecylic acid, stearic acid, nonadecanoic acid, arachic acid, behenic acid, lignoceric acid, cerotic acid, heptacosanoic acid, montanic acid, melissic acid, lacceric acid, and isovaleric acid; and unsaturated fatty acids such as acrylic acid, crotonic acid, isocrotonic acid, undecylenic acid, oleic acid, elaidic acid, cetoleic acid, erucic acid, brassidic acid, sorbic acid, linoleic acid, linolenic acid, arachidonic acid, propiolic acid, stearolic acid, clupanodonic acid, tariric acid, and licanic acid.

Preferable examples of the wax for use in the desensitizing solution are carnauba wax, beeswax, whale wax, insect wax, wool wax, and shellac wax.

Preferable examples of the lipophilic resin for use in the desensitizing solution include phenolic novolak such as phenol-formaldehyde resin, cresol-formaldehyde resin, and t-butyl phenol formaldehyde resin; xylene resins prepared by condensing phenol and xylene with formaldehyde, resins prepared by condensing phenol and mesitylene with formaldehyde, polyhydroxystyrene, brominated polyhydroxystyrene, cashew resin, partially esterified product of styrene-maleic anhydride copolymer, melamine resin, alkyd resin, polyester resin, epoxy resin, rosin and modified rosin such as hydrogenated rosin and rosin ester, and petroleum resin such as gilsonite. Of those resins, phenolic novolak, and rosin and modified rosin are preferable.

As mentioned above, the desensitizing solution for use in the present invention comprises the modified starch as the component (b), which serves as a hydrophilic polymer. In addition to the modified starch, a naturally occurring polymer, a semisynthetic polymer, and cellulose derivatives may be used as the hydrophilic polymer. Examples of the natural polymer include starches such as sugar cane starch, potato starch, tapioca starch, wheat starch, and corn starch; polymers obtained from marine algae, such as carrageenan, laminaran, seaweed mannan, glue plant, Irish moss (carrageen), agar, and sodium alginate; microbial mucilage including homopolysaccharides such as hibiscus root, mannan, quince seed, pectin, dextran, glucan, and levan, and heterosaccharides such as succinoglucan and xanthan gum; and proteins such as glue gelatin, casein and collagen.

Specific examples of the semisynthetic polymer include propylene glycol alginate and cellulose derivatives such as viscose, methyl cellulose, ethyl cellulose, methylethyl cellulose, hydroxyethyl cellulose, carboxymethyl cellulose, hydroxypropyl cellulose, hydroxypropyl methyl cellulose, hydroxypropyl ethyl cellulose, and hydroxypropyl methyl cellulose phthalate.

Moreover, the desensitizing solution for use in the present invention may further comprise acids to adjust the pH value and impart the hydrophilic nature. In this case, for example, mineral acids such as phosphoric acid, sulfuric acid, and nitric acid; and organic acids such as citric acid, phosphonic acid, phenylphosphonic acid, tannic acid, malic acid, glacial acetic acid, lactic acid, silicic acid, and p-toluenesulfonic acid are preferably used. In particular, phosphoric acid is remarkably suitable because it can not only serve to control the pH value, but also work to prevent the contamination of a non-image area. It is preferable that the above-mentioned acid represented by phosphoric acid be added in an amount of 0.1 to 8% by weight, more preferably 0.5 to 5% by weight, based on the total weight of the aqueous phase.

In addition to the above, an antiseptic and anti-foaming agent may be added to the composition of the desensitizing solution. The antiseptic such as benzoic acid and derivatives thereof, phenol formalin, and sodium dehydroacetate may be contained in an amount of 0.005 to 2.0% by weight. As the anti-foaming agent, silicone resins, lower alcohols, organic polar compounds, and mineral oils are preferably used.

The desensitizing solution for use in the present invention can be prepared into any form, for example, an emulsion form, non-emulsion form, or suspension form by appropriately selecting the surfactant, lipophilic material, water-soluble polymers, and the like.

According to the plate-making method of the present invention, the above-mentioned desensitizing solution is suitably applied to the surface of the printing plate with a coating amount of 0.02 g/m$^2$ or more, preferably from 0.02 to 1 g/m$^2$ on a dry basis.

The lithographic printing plate thus obtained is set in an offset press to produce a large number of printed materials.

The present invention will be explained in more detail with reference to the following non-limitative working Examples and the effects practically attained by the present invention will also be discussed in detail in comparison with Comparative Examples.

EXAMPLES

Production of PS Plates

[Preparation of Substrate No. 1]

An aluminum plate (grade 1S) having a thickness of 0.30 mm was surface-grained with a nylon brush (No. 8) and an aqueous suspension of 800-mesh pumice stone and then sufficiently washed with water. Then the aluminum plate was etched by immersing in a 10% aqueous solution of sodium hydroxide at 70° C. for 60 seconds, followed by successively washing with running water, a 20% nitric acid solution for neutralization, and water. The surface of the aluminum plate was then electrolytically roughened in a 1% aqueous solution of nitric acid by the application of an alternating current in the form of a sinusoidal wave at the applied voltage (Va) of 12.7 V. The electrical charge was set to 300 C/dm$^2$ at the anode side. At this stage, the surface roughness of the aluminum plate was measured and found to be 0.45 μm in terms of Ra unit. Subsequently, the aluminum plate was immersed in a 30% aqueous solution of sulfuric acid at 55° C. for 2 minutes to desmut from the plate. The aluminum plate was then anodized in a 20% aqueous solution of sulfuric acid at 33° C. for 50 seconds at a current density of 5 A/dm$^2$, with the surface-grained surface of the aluminum plate serving as a cathode. The result was that the anodized layer with a thickness of 2.7 g/m$^2$ was deposited on the anode. The aluminum plate thus prepared was used as a substrate No. 1.

[Preparation of Substrate No. 2]

A liquid composition for undercoating layer No. 1 with the following formulation was coated on the substrate No. 1 for surface treatment so that the amount of phosphorus (P) in the coated layer was about 0.05 g/m$^2$. The coated layer was dried at 100° C. for one minute, so that a substrate No. 2 was obtained.

<Liquid Composition for Undercoating Layer No. 1>

|  | Parts by Weight |
| --- | --- |
| Phenylphosphonic acid | 2 |
| Methanol | 800 |
| Water | 50 |

[Preparation of Substrate No. 3]

A mixture of the following components was stirred.

|  | Parts by Weight |
| --- | --- |
| "Phosmer PE" (trademark), made by Uni-Chemical Co., Ltd. | 20 |
| Methanol | 130 |
| Water | 20 |
| p-toluenesulfonic acid | 5 |
| tetraethoxysilane | 50 |
| 3-methacryloxy propyl triethoxysilane | 50 |

About five minutes later, an exothermic reaction was found. After the reaction was carried out for 60 minutes, the reaction product was put into another container, and 30,000 parts by weight of methanol were further added to the reaction product. Thus, a liquid composition for undercoating layer No. 2 was prepared.

The liquid composition for undercoating layer No. 2 thus prepared was coated on the substrate No. 1 for surface treatment so that the amount of silicon (Si) in the coated layer was about 0.001 g/m². The coated layer was dried at 100° C. for one minute, so that a substrate No. 3 was obtained.

[Formation of Light-sensitive Layer]

The following components were mixed to prepare a coating liquid for formation of a light-sensitive layer.

<Formulation for Coating Liquid for Light-sensitive Layer>

|  | Parts by Weight |
|---|---|
| Ethylenically-unsaturated bond containing compound (A) | a(*) |
| Linear organic polymer (B) | b(*) |
| Sensitizer (C) | 0.15 |
| Photopolymerization initiator (D) | 0.30 |
| Additive (S) | 0.50 |
| Fluorine-containing surfactant ("Megafac F-177" (trademark), made by Dainippon Ink & Chemicals, Incorporated) | 0.03 |
| Thermal polymerization inhibitor (N-nitrosohydroxylamine aluminum salt) | 0.01 |
| ε-type copper phthalocyanine dispersion | 0.2 |
| Methyl ethyl ketone | 30.0 |
| Propylene glycol monomethyl ether | 30.0 |

(*)The amounts (a) and (b) are shown in Table 2.

Specific examples of the above-mentioned ethylenically-unsaturated bond containing compound (A), linear organic polymer (B), sensitizer (C), photopolymerization initiator (D), and additive (S) used are shown below:

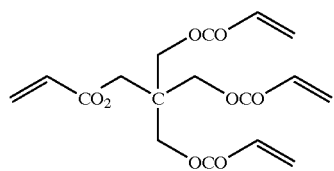

(A-1)

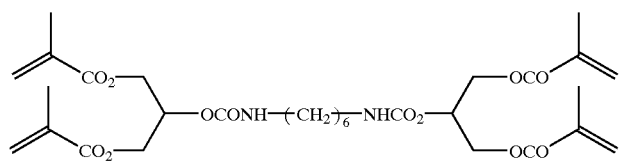

(A-2)

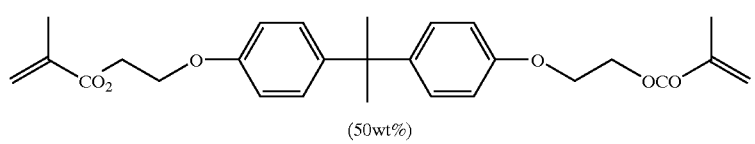

(A-3)

(50wt%)

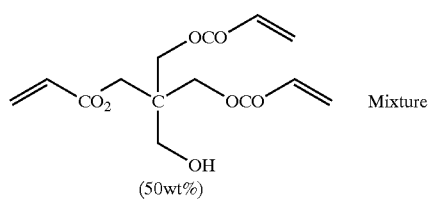 Mixture (50wt%)

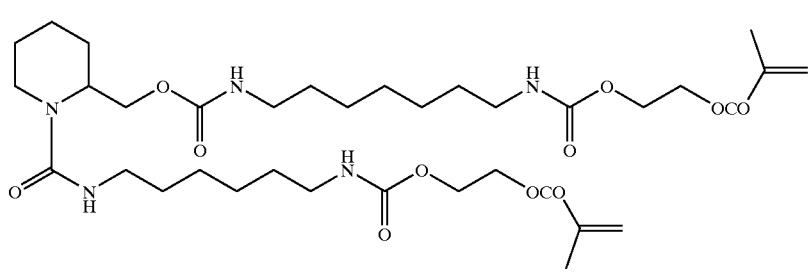

(A-4)

(50wt%)

-continued
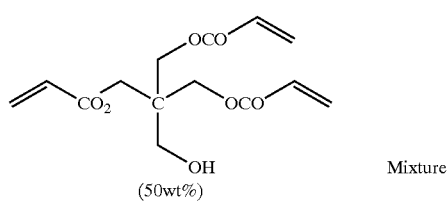
(50wt%) Mixture
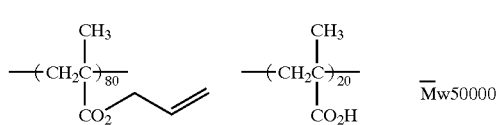
(B-1)
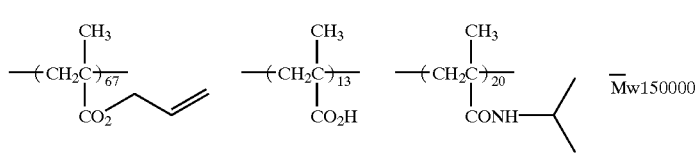
(B-2)
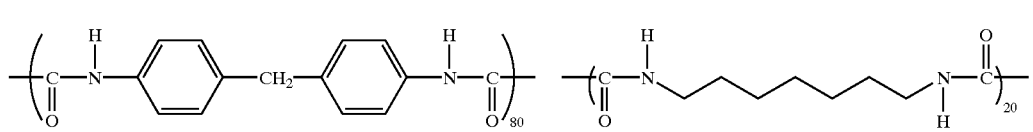
(B-3)
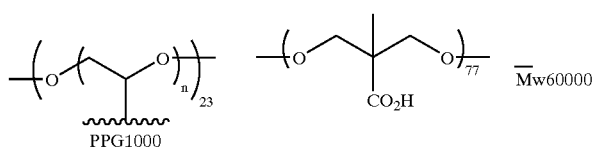
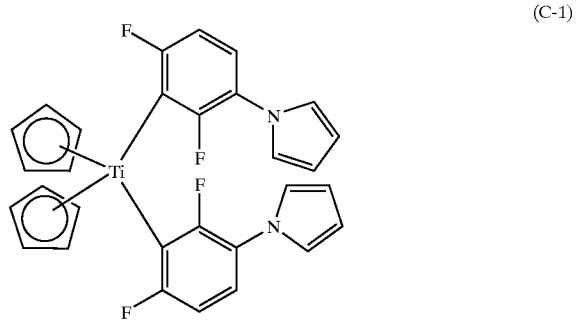
(C-1)
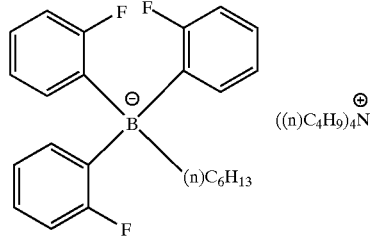
(C-2)
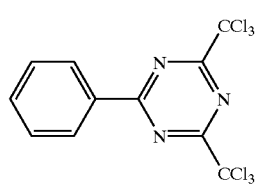
(C-3)
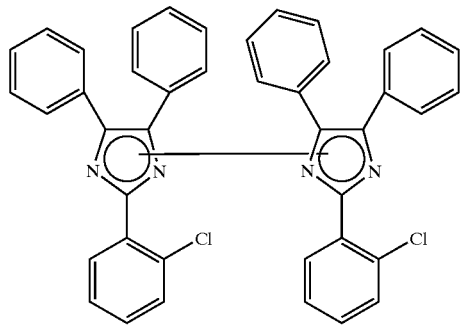
(C-4)

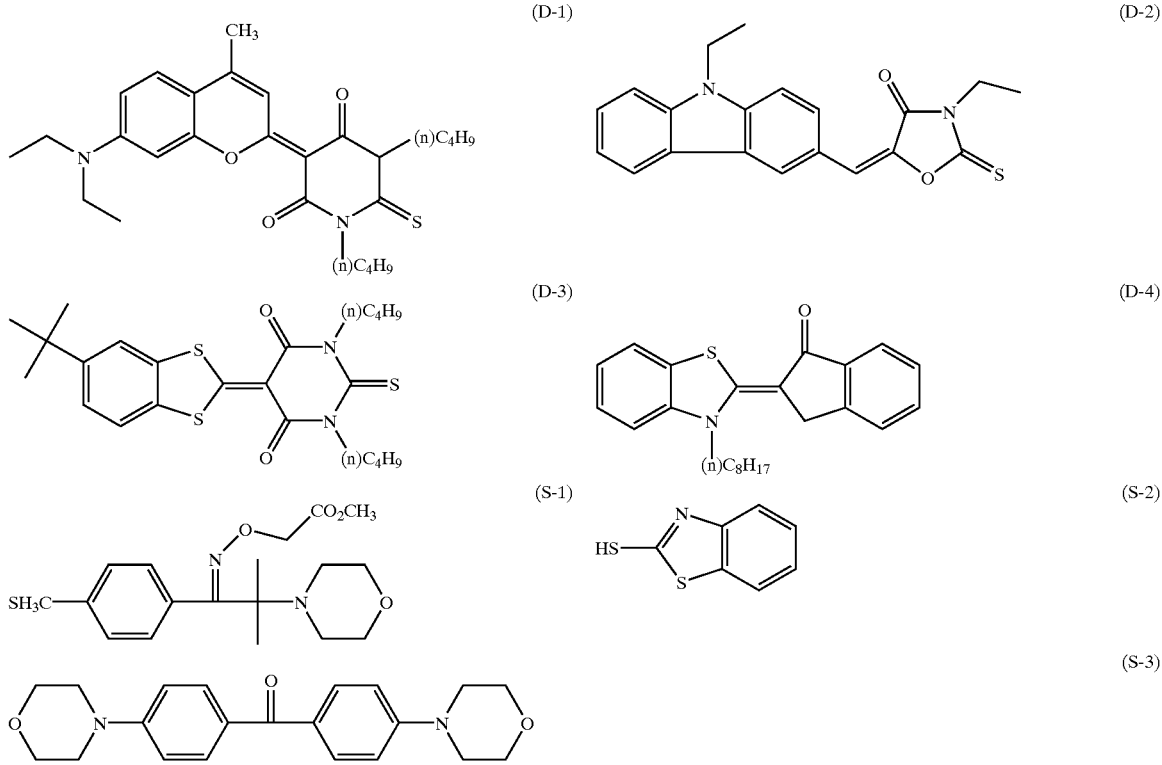

Table 2 shows the combination of the ethylenically-unsaturated bond containing compound (A), linear organic polymer (B), sensitizer (C), photopolymerization initiator (D)), and additive (S).

Each coating liquid for the light-sensitive layer was coated on the substrate designated in Table 2 so that the coating amount was 1.5 g/m² on a dry basis and dried at 100° C. for one minute, whereby a light-sensitive layer was provided on the substrate.

Subsequently, a 3% aqueous solution of polyvinyl alcohol with a degree of saponification of 98 mol % and a degree of polymerization of 500 was coated on the light-sensitive layer so that the coating amount was 2.5 g/m² on a dry basis and dried at 120° C. for 3 minutes. Thus, PS plates No. 1 to No. 9 were obtained.

TABLE 2

| PS Plate No. | A (a) (parts by weight) | B (b) (parts by weight) | C | D | S | Sub-strate No. | Acid Value of Light-sensitive Layer (meq/g) (Note) |
|---|---|---|---|---|---|---|---|
| 1 | A-1 (1.7) | B-1 (1.9) | C-1 | D-1 | S-1 | 1 | 0.45 |
| 2 | A-1 (1.7) | B-2 (1.9) | C-1 | D-1 | S-1 | 2 | 0.42 |
| 3 | A-1 (1.5) | B-1 (2.0) | C-1 | D-1 | S-1 | 3 | 0.71 |
| 4 | A-2 (2.3) | B-3 (2.0) | C-1 | D-1 | S-1 | 3 | 0.48 |
| 5 | A-1 (1.7) | B-2 (1.9) | C-1 | D-2 | S-1 | 2 | 0.43 |
| 6 | A-2 (1.7) | B-2 (1.9) | C-2 | D-3 | S-3 | 1 | 0.43 |
| 7 | A-1 (1.7) | B-2 (1.9) | C-3 | D-4 | S-1 | 2 | 0.46 |
| 8 | A-3 (1.7) | B-2 (1.9) | C-4 | D-4 | S-2 | 2 | 0.45 |
| 9 | A-4 (1.7) | B-2 (1.9) | C-1 | D-1 | S-2 | 2 | 0.46 |

(Note)
The amount of acid contained in units per gram of the light-sensitive layer was found by titration with sodium hydroxide, and then, the acid value was determined by calculation from the found value.

Examples 1 to 24 and Comparative Examples 1 and 2

Developers No. 1 to No. 15 for use in the present invention and Comparative developers No. 1 and No. 2 were each prepared as follows.

(Developer No. 1) (pH=11.7)

A developer No. 1 was prepared by adding to water phosphoric acid (pka: 12.4) with a concentration of 0.15 mol/liter, a nonionic surfactant of formula (Y–1) in an amount of 5% by weight, ethylenediaminetetraacetic acid·4Na salt (chelating agent) in an amount of 0.2% by weight, and potassium carbonate in an amount of 0.2% by weight, and adjusting the pH value of the resultant aqueous solution to 11.7 with the addition thereto of potassium hydroxide. The conductivity of the developer No. 1 was 5 mS/cm.

(Developer No. 2) (pH=12.0)

A developer No. 2 was prepared by adding to water phosphoric acid (pka: 12.4) with a concentration of 0.15 mol/liter, a nonionic surfactant of formula (Y-1) in an amount of 5% by weight, ethylenediaminetetraacetic acid·4Na salt (chelating agent) in an amount of 0.2% by weight, and potassium carbonate in an amount of 0.2% by weight, and adjusting the pH value of the resultant aqueous solution to 12.0 with the addition thereto of potassium hydroxide. The conductivity of the developer No. 2 was 7 mS/cm.

(Developer No. 3)(pH=12.4)

A developer No. 3 was prepared by adding to water phosphoric acid (pka: 12.4) with a concentration of 0.15 mol/liter, a nonionic surfactant of formula (Y-1) in an amount of 5% by weight, ethylenediaminetetraacetic acid·4Na salt (chelating agent) in an amount of 0.2% by weight, and potassium carbonate in an amount of 0.2% by weight, and adjusting the pH value of the resultant aqueous solution to 12.4 with the addition thereto of potassium hydroxide. The conductivity of the developer No. 3 was 11 mS/cm.

(Developer No. 4)(pH=12.0)

A developer No. 4 was prepared by adding to water sulfosalicylic acid (pka: 11.7) with a concentration of 0.15 mol/liter, a nonionic surfactant of formula (Y-1) in an amount of 5% by weight, ethylenediaminetetraacetic acid·4Na salt (chelating agent) in an amount of 0.2% by weight, and potassium carbonate in an amount of 0.2% by weight, and adjusting the pH value of the resultant aqueous solution to 12.0 with the addition thereto of potassium hydroxide. The conductivity of the developer No. 4 was 8 mS/cm.

(Developer No. 5)(pH=12.0)

A developer No. 5 was prepared by adding to water inosine (pka: 12.5) with a concentration of 0.15 mol/liter, a nonionic surfactant of formula (Y-1) in an amount of 5% by weight, ethylenediaminetetraacetic acid·4Na salt (chelating agent) in an amount of 0.2% by weight, and potassium carbonate in an amount of 0.2% by weight, and adjusting the pH value of the resultant aqueous solution to 12.0 with the addition thereto of potassium hydroxide. The conductivity of the developer No. 5 was 7 mS/cm.

(Developer No. 6)(pH=12.0)

A developer No. 6 was prepared by adding to water acetoxime (pka: 12.5) with a concentration of 0.15 mol/liter, a nonionic surfactant of formula (Y-1) in an amount of 5% by weight, ethylenediaminetetraacetic acid·4Na salt (chelating agent) in an amount of 0.2% by weight, and potassium carbonate in an amount of 0.2% by weight, and adjusting the pH value of the resultant aqueous solution to 12.0 with the addition thereto of potassium hydroxide. The conductivity of the developer No. 6 was 7 mS/cm.

(Developer No. 7)(pH=12.0)

A developer No. 7 was prepared by adding to water saccharose (pka: 12.7) with a concentration of 0.15 mol/liter, a nonionic surfactant of formula (Y-1) in an amount of 5% by weight, ethylenediaminetetraacetic acid·4Na salt (chelating agent) in an amount of 0.2% by weight, and potassium carbonate in an amount of 0.2% by weight, and adjusting the pH value of the resultant aqueous solution to 12.0 with the addition thereto of potassium hydroxide. The conductivity of the developer No. 7 was 7 mS/cm.

(Developer No. 8)(pH=12.0)

A developer No. 8 was prepared by adding to a commercially available potassium silicate solution "1K potassium silicate" (trademark) made by Nippon Chemical Industrial Co., Ltd., that is, a mixture of silicic acid and potassium hydroxide with a concentration of silicic acid of 0.15 mol/liter, a nonionic surfactant of formula (Y-1) in an amount of 5% by weight, ethylenediaminetetraacetic acid·4Na salt (chelating agent) in an amount of 0.2% by weight, and potassium carbonate in an amount of 0.2% by weight, and adjusting the pH value of the resultant solution to 12.0 with the addition thereto of potassium hydroxide. The conductivity of the developer No. 8 was 9 mS/cm.

(Developer No. 9)(pH=12.0)

A developer No. 9 was prepared by adding to water phosphoric acid (pka: 12.4) with a concentration of 0.15 mol/liter and a surfactant represented by the following formula in an amount of 5% by weight, and adjusting the pH value of the resultant aqueous solution to 12.0 with the addition thereto of potassium hydroxide. The conductivity of the developer No. 9 was 7 mS/cm.

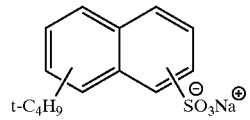

(Developer No. 10)(pH=12.0)

A developer No. 10 was prepared by adding to a commercially available potassium silicate solution "1K potassium silicate" (trademark) made by Nippon Chemical Industrial Co., Ltd., that is, a mixture of silicic acid and potassium hydroxide with a concentration of silicic acid of 0.15 mol/liter, phosphoric acid with a concentration of 0.1 mol/liter, a nonionic surfactant of formula (Y-1) in an amount of 5% by weight, ethylenediaminetetraacetic acid·4Na salt (chelating agent) in an amount of 0.2% by weight, and potassium carbonate in an amount of 0.2% by weight, and adjusting the pH value of the resultant solution to 12.0 with the addition thereto of potassium hydroxide. The conductivity of the developer No. 10 was 12 mS/cm.

(Developer No. 11)(pH=12.0)

A developer No. 11 was prepared by adding to a commercially available potassium silicate solution "1K potassium silicate" (trademark) made by Nippon Chemical Industrial Co., Ltd., that is, a mixture of silicic acid and potassium hydroxide with a concentration of silicic acid of 0.15 mol/liter, sulfosalicylic acid (pka: 11.7) with a concentration of 0.1 mol/liter, a nonionic surfactant of formula (Y-1) in an amount of 5% by weight, ethylenediaminetetraacetic acid·4Na salt (chelating agent) in an amount of 0.2% by weight, and potassium carbonate in an amount of 0.2% by weight, and adjusting the pH value of the resultant solution to 12.0 with the addition thereto of potassium hydroxide. The conductivity of the developer No. 11 was 12 mS/cm.

(Developer No. 12)(pH=12.0)

A developer No. 12 was prepared by adding to a commercially available potassium silicate solution "1K potassium silicate" (trademark) made by Nippon Chemical Industrial Co., Ltd., that is, a mixture of silicic acid and potassium hydroxide with a concentration of silicic acid of 0.15 mol/liter, inosine (pka: 12.5) with a concentration of 0.1 mol/liter, a nonionic surfactant of formula (Y-1) in an amount of 5% by weight, ethylenediaminetetraacetic acid·4Na salt (chelating agent) in an amount of 0.2% by weight, and potassium carbonate in an amount of 0.2% by weight, and adjusting the pH value of the resultant solution to 12.0 with the addition thereto of potassium hydroxide. The conductivity of the developer No. 12 was 12 mS/cm.

(Developer No. 13)(pH=12.0)

A developer No. 13 was prepared by adding to a commercially available potassium silicate solution "1K potassium silicate" (trademark) made by Nippon Chemical Industrial Co., Ltd., that is, a mixture of silicic acid and potassium hydroxide with a concentration of silicic acid of 0.15 mol/liter, acetoxime (pka: 12.5) with a concentration of 0.1 mol/liter, a nonionic surfactant of formula (Y-1) in an amount of 5% by weight, ethylenediaminetetraacetic acid·4Na salt (chelating agent) in an amount of 0.2% by weight, and potassium carbonate in an amount of 0.2% by weight, and adjusting the pH value of the resultant solution to 12.0 with the addition thereto of potassium hydroxide. The conductivity of the developer No. 13 was 12 mS/cm.

(Developer No. 14)(pH=12.0)

A developer No. 14 was prepared by adding to a commercially available potassium silicate solution "1K potassium silicate" (trademark) made by Nippon Chemical Industrial Co., Ltd., that is, a mixture of silicic acid and potassium hydroxide with a concentration of silicic acid of 0.15 mol/liter, saccharose (pka: 12.7) with a concentration of 0.1 mol/liter, a nonionic surfactant of formula (Y-1) in an amount of 5% by weight, ethylenediaminetetraacetic acid·4Na salt (chelating agent) in an amount of 0.2% by weight, and potassium carbonate in an amount of 0.2% by weight, and adjusting the pH value of the resultant solution to 12.0 with the addition thereto of potassium hydroxide. The conductivity of the developer No. 14 was 12 mS/cm.

(Developer No. 15)(pH=12.0)

A developer No. 15 was prepared by adding to water phosphoric acid (pka: 12.4) with a concentration of 0.15 mol/liter and a commercially available surfactant "Pelex NBL" (trademark) made by Kao Corporation, that is, sodium alkylnaphthalenesulfonate, in an amount of 5% by weight, and adjusting the pH value of the resultant aqueous solution to 12.0 with the addition thereto of potassium hydroxide. The conductivity of the developer No. 15 was 7 mS/cm.

(Comparative Developer No. 1)(pH=12.0)

A comparative developer No. 1 was prepared by adding ethylenediaminetetraacetic acid·4Na salt (chelating agent) in an amount of 0.2% by weight and potassium carbonate in an amount of 0.2% by weight to water, and adjusting the pH value of the resultant aqueous solution to 12.0 with the addition thereto of potassium hydroxide. The conductivity of the comparative developer No. 1 was 5 mS/cm.

(Comparative Developer No. 2)(pH=12.0)

A comparative developer No. 2 was prepared by adding to water a nonionic surfactant of formula (Y-1) in an amount of 5% by weight, ethylenediaminetetraacetic acid·4Na salt (chelating agent) in an amount of 0.2% by weight, and potassium carbonate in an amount of 0.2% by weight, and adjusting the pH value of the resultant aqueous solution to 12.0 with the addition thereto of potassium hydroxide. The conductivity of the comparative developer No. 2 was 5 mS/cm.

[Preparation of Replenishers]

Replenishers for the above-mentioned developers No. 1 to No. 15 for use in the present invention and comparative developers No. 1 and No. 2 were individually prepared by adding potassium hydroxide to the respective developers to adjust the pH value to 13.1.

In each of Examples 1 to 24 and Comparative Examples 1 and 2, a PS plate selected from Table 2 and the above-mentioned developer were employed in combination. The combination of the PS plate and the developer is shown in the following Table 3. The PS plates were subjected to light exposure and development under the following conditions to conduct evaluation tests. The evaluation tests were carried out as follows.

(1) Evaluation of Development Performance

Each PS plate was not subjected to light exposure before development. After completion of the development, the color of the obtained printing plate was visually inspected. The color of the light-sensitive layer was recognized when there remained the residue. The results are shown in Tables 5 and 6.

(2) Evaluation of Printing Durability and Scumming After Intermission

Two types of light sources were employed for light exposure of the PS plates. FD·YAG laser ("PlateJet 4" (trademark), made by Cymbolic Sciences, Inc.) with a wavelength of 532 nm and an intensity of 100 mW was used for the PS plates No. 1 to No. 4 and No. 9; and violet LD with a wavelength of 405 nm and an intensity of 30 mW emitting from a laboratory-scale internal drum exposure unit was used for the PS plates No. 5 to No. 8. With an exposure of 100 $\mu/cm^2$ under the standard exposure conditions, a solid image and dot images (with an increased dot percent from 1 to 99% by 1%) were subjected to scanning using the above-mentioned light sources at a density of 4000 dpi and 175 rays/inch.

After completion of the light exposure, each PS plate was subjected to development under the standard conditions using a commercially available automatic processor ("FLP-82News" (trade name), made by Fuji Photo Film Co., Ltd.) equipped with the above developer, the above replenisher and a finishing gum ("FP-2W" (trade name), made by Fuji Photo Film Co., Ltd.), whereby a lithographic printing plate was obtained. Each PS plate was pre-heated after light exposure so that the surface temperature of the plate reached 120° C., and the plate was immersed in the developer for 20 seconds.

With the obtained printing plate set on a lithographic press "R201" (trade name), made by MAN Roland, printing operation was carried out using a printing ink ("GEOS G black (N)" (trade name), made by Dainippon Ink & Chemicals, Incorporated). To evaluate the printing durability, occurrence of dot loss on the dot image with a dot percent of 3% was examined. The printing durability was expressed by the maximum number of printed sheets before the occurrence of dot loss. The results are shown in Table 3.

Scumming after intermission was examined by the following method. The obtained PS plate was set on a lithographic press "DAIYA IF2" (trade name), made by Mitsubishi Heavy Industries, Ltd., which was equipped with a printing ink ("GEOS G magenta (S)" (trade name), made by Dainippon Ink & Chemicals, Incorporated) to start printing operation. The printing operation was stopped and the press was allowed to stand for one hour with the printing ink being attached to the printing plate. When the press was started again one hour later, the presence of scumming on non-image areas for printed matter was visually checked. The results are shown in Table 3.

(3) Evaluation of Change in pH Value of Developer During Development

An optimum amount of replenisher to be added to each developer was determined within a range of from 50 to 120 cc (ml) for every one square meter of the PS plate subjected to development.

To evaluate the stability of the pH value in each developer, the following test was conducted, with the replenisher being supplied to each developer at the predetermined rate. The PS plate with an area of 100 m² was subjected to development on the first day. The area of the PS plate subjected to development was decreased to 50 m² and 10 m² on the second day and the third day, respectively. On the fourth day, the PS plate was not subjected to development. This development cycle was repeated 5 times.

A difference between the minimum pH value and the maximum pH value, which were obtained during the above-mentioned test is shown as an index of the pH variation. The results are shown in Table 3

(4) Evaluation of Sludge in Developer

As another index of processing stability, sludge in the developer was observed as follows. After completion of the development of the above-mentioned printing plate (20 m²) using the correspondent developer (1 litter), the developer was allowed to stand for one month. The presence of any sludge in the developer was inspected. The results are also shown in Table 3.

Examples 25 to 86 and Comparative Examples 3 to 5

Developers No. 16 to No. 46 for use in the present invention and Comparative developers No. 3 to No. 5 were each prepared as follows.

(Developer No. 16)(pH=11.7)

A developer No. 16 was prepared by adding to water phosphoric acid (pka: 12.4) with a concentration of 0.15 mol/liter, a commercially available surfactant "Pelex NBL" (trademark) made by Kao Corporation, that is, sodium alkylnaphthalenesulfonate, in an amount of 5% by weight, and p-tert-butyl benzoic acid in an amount of 1% by weight, and adjusting the pH value of the resultant aqueous solution to 11.7 with the addition thereto of potassium hydroxide. The conductivity of the developer No. 16 was 5 mS/cm.

(Developer No. 17)(pH=12.0)

A developer No. 17 was prepared by adding to water phosphoric acid (pka: 12.4) with a concentration of 0.15 mol/liter, a commercially available surfactant "Pelex NBL"

TABLE 3

| | PS Plate No. | Developer No. | Development Performance (*) | Scumming after Intermission () | Printing Durability (No. of Sheets) | Variation in pH | Sludge in Developer (*) |
|---|---|---|---|---|---|---|---|
| Ex. 1 | 1 | 2 | Nil | Nil | 200,000 | ±0.05 | Nil |
| Ex. 2 | 2 | 2 | Nil | Nil | 200,000 | ±0.05 | Nil |
| Ex. 3 | 3 | 2 | Nil | Nil | 120,000 | ±0.05 | Nil |
| Ex. 4 | 4 | 2 | Nil | Nil | 250,000 | ±0.05 | Nil |
| Ex. 5 | 5 | 2 | Nil | Nil | 200,000 | ±0.05 | Nil |
| Ex. 6 | 6 | 2 | Nil | Nil | 200,000 | ±0.05 | Nil |
| Ex. 7 | 7 | 2 | Nil | Nil | 200,000 | ±0.05 | Nil |
| Ex. 8 | 8 | 2 | Nil | Nil | 150,000 | ±0.05 | Nil |
| Ex. 9 | 9 | 2 | Nil | Nil | 150,000 | ±0.05 | Nil |
| Ex. 10 | 4 | 1 | Nil | Nil | 250,000 | ±0.05 | Nil |
| Ex. 11 | 4 | 2 | Nil | Nil | 250,000 | ±0.05 | Nil |
| Ex. 12 | 4 | 3 | Nil | Nil | 200,000 | ±0.05 | Nil |
| Ex. 13 | 4 | 4 | Nil | Nil | 250,000 | ±0.05 | Nil |
| Ex. 14 | 4 | 5 | Nil | Nil | 250,000 | ±0.05 | Nil |
| Ex. 15 | 4 | 6 | Nil | Nil | 250,000 | ±0.05 | Nil |
| Ex. 16 | 4 | 7 | Nil | Nil | 250,000 | ±0.08 | Nil |
| Ex. 17 | 4 | 8 | Nil | Nil | 250,000 | ±0.08 | Nil |
| Ex. 18 | 4 | 9 | Nil | Nil | 200,000 | ±0.05 | Slightly observed |
| Ex. 19 | 4 | 10 | Nil | Nil | 200,000 | ±0.03 | Nil |
| Ex. 20 | 4 | 11 | Nil | Nil | 200,000 | ±0.03 | Nil |
| Ex. 21 | 4 | 12 | Nil | Nil | 200,000 | ±0.03 | Nil |
| Ex. 22 | 4 | 13 | Nil | Nil | 200,000 | ±0.03 | Nil |
| Ex. 23 | 4 | 14 | Nil | Nil | 200,000 | ±0.03 | Nil |
| Ex. 24 | 4 | 15 | Nil | Nil | 250,000 | ±0.05 | Nil |
| Comp. Ex. 1 | 4 | Comp. 1 | Nil | Nil | 250,000 | ±0.2 | Nil |
| Comp. Ex. 2 | 4 | Comp. 2 | Observed | Observed | 250,000 | ±0.2 | Observed |

(*) "Nil" means there remained no light-sensitive layer, i.e., no residue, while "Observed" means there remained the light-sensitive layer, i.e., residue.
(**)) "Nil" means there was no ink contamination on non-image areas for printed matter after the printing operation was started again after intermission; while "observed" means ink contamination was observed on non-image areas.
(***) "Nil" means there was no sludge in the developer; while "observed" means there was sludge in the developer.

As is apparent from Table 3, the plate-making method according to the present invention exhibits excellent development performance and imparts favorable printing durability to the resultant printing plate, without scumming of the non-image areas even after intermission. Further, in the method of the present invention, a change in pH value of the developer during development is small, and no sludge is produced in the developer over a long period of time, thereby stable running performance is exhibited.

(trademark) made by Kao Corporation, that is, sodium alkylnaphthalenesulfonate, in an amount of 5% by weight, and p-tert-butyl benzoic acid in an amount of 1% by weight, and adjusting the pH value of the resultant aqueous solution to 12.0 with the addition thereto of potassium hydroxide. The conductivity of the developer No. 17 was 7 mS/cm.

(Developer No. 18)(pH=12.4)

A developer No. 18 was prepared by adding to water phosphoric acid (pka: 12.4) with a concentration of 0.15 mol/liter, a commercially available surfactant "Pelex NBL"

(trademark) made by Kao Corporation, that is, sodium alkylnaphthalenesulfonate, in an amount of 5% by weight, and p-tert-butyl benzoic acid in an amount of 1% by weight, and adjusting the pH value of the resultant aqueous solution to 12.4 with the addition thereto of potassium hydroxide. The conductivity of the developer No. 18 was 11 mS/cm.

(Developer No. 19)(pH=12.0)

A developer No. 19 was prepared by adding to water sulfosalicylic acid (pka: 11.7) with a concentration of 0.15 mol/liter, a commercially available surfactant "Pelex NBL" (trademark) made by Kao Corporation, that is, sodium alkylnaphthalenesulfonate, in an amount of 5% by weight, and p-tert-butyl benzoic acid in an amount of 1% by weight, and adjusting the pH value of the resultant aqueous solution to 12.0 with the addition thereto of potassium hydroxide. The conductivity of the developer No. 19 was 8 mS/cm.

(Developer No. 20)(pH=12.0)

A developer No. 20 was prepared by adding to water inosine (pka: 12.5) with a concentration of 0.15 mol/liter, a commercially available surfactant "Pelex NBL" (trademark) made by Kao Corporation, that is, sodium alkylnaphthalenesulfonate, in an amount of 5% by weight, and p-tert-butyl benzoic acid in an amount of 1% by weight, and adjusting the pH value of the resultant aqueous solution to 12.0 with the addition thereto of potassium hydroxide. The conductivity of the developer No. 20 was 8 mS/cm.

(Developer No. 21)(pH=12.0)

A developer No. 21 was prepared by adding to water acetoxime (pka: 12.5) with a concentration of 0.15 mol/liter, a commercially available surfactant "Pelex NBL" (trademark) made by Kao Corporation, that is, sodium alkylnaphthalenesulfonate, in an amount of 5% by weight, and p-tert-butyl benzoic acid in an amount of 1% by weight, and adjusting the pH value of the resultant aqueous solution to 12.0 with the addition thereto of potassium hydroxide. The conductivity of the developer No. 21 was 7 mS/cm.

(Developer No. 22)(pH=12.0)

A developer No. 22 was prepared by adding to water saccharose (pka: 12.7) with a concentration of 0.15 mol/liter, a commercially available surfactant "Pelex NBL" (trademark) made by Kao Corporation, that is, sodium alkylnaphthalenesulfonate, in an amount of 5% by weight, and p-tert-butyl benzoic acid in an amount of 1% by weight, and adjusting the pH value of the resultant aqueous solution to 12.0 with the addition thereto of potassium hydroxide. The conductivity of the developer No. 22 was 7 mS/cm.

(Developer No. 23)(pH=11.7)

A developer No. 23 was prepared by adding to a commercially available potassium silicate solution "1K potassium silicate" (trademark) made by Nippon Chemical Industrial Co., Ltd., that is, a mixture of silicic acid and potassium hydroxide with a concentration of silicic acid of 0.15 mol/liter, a commercially available surfactant "Pelex NBL" (trademark) made by Kao Corporation, that is, sodium alkylnaphthalenesulfonate, in an amount of 5% by weight, and p-tert-butyl benzoic acid in an amount of 1% by weight, and adjusting the pH value of the resultant solution to 11.7 with the addition thereto of potassium hydroxide. The conductivity of the developer No. 23 was 9 mS/cm.

(Developer No. 24)(pH=12.0)

A developer No. 24 was prepared by adding to water phosphoric acid (pka: 12.4) with a concentration of 0.15 mol/liter, a nonionic surfactant of formula (Y-1) in an amount of 5% by weight, ethylenediaminetetraacetic aicd·4Na salt (chelating agent) in amount of 0.2% by weight, potassium carbonate in an amount of 0.2% by weight, and p-tert-butyl benzoic acid in an amount of 1% by weight, and adjusting the pH value of the resultant aqueous solution to 12.0 with the addition thereto of potassium hydroxide. The conductivity of the developer No. 24 was 7 mS/cm.

(Developer No. 25)(pH=11.7)

A developer No. 25 was prepared by adding to water phosphoric acid (pka: 12.4) with a concentration of 0.15 mol/liter, a nonionic surfactant of formula (Y-1) in an amount of 5% by weight, and a compound (G-7) shown in Table 1 in an amount of 0.2% by weight, and adjusting the pH value of the resultant aqueous solution to 11.7 with the addition thereto of potassium hydroxide. The conductivity of the developer No. 25 was 5.0 mS/cm.

(Developer No. 26)(pH=12.0)

A developer No. 26 was prepared by adding to water phosphoric acid (pka: 12.4) with a concentration of 0.15 mol/liter, a nonionic surfactant of formula (Y-1) in an amount of 5% by weight, and a compound (G-7) shown in Table 1 in an amount of 0.2% by weight, and adjusting the pH value of the resultant aqueous solution to 12.0 with the addition thereto of potassium hydroxide. The conductivity of the developer No. 26 was 7.0 mS/cm.

(Developer No. 27)(pH=12.4)

A developer No. 27 was prepared by adding to water phosphoric acid (pka: 12.4) with a concentration of 0.15 mol/liter, a nonionic surfactant of formula (Y-1) in an amount of 5% by weight, and a compound (G-7) shown in Table 1 in an amount of 0.2% by weight, and adjusting the pH value of the resultant aqueous solution to 12.4 with the addition thereto of potassium hydroxide. The conductivity of the developer No. 27 was 14 mS/cm.

(Developer No. 28)(pH=12.0)

A developer No. 28 was prepared by adding to water phosphoric acid (pka: 12.4) with a concentration of 0.15 mol/liter, a nonionic surfactant of formula (Y-1) in an amount of 5% by weight, and a compound (G-1) shown in Table 1 in an amount of 0.2% by weight, and adjusting the pH value of the resultant aqueous solution to 12.0 with the addition thereto of potassium hydroxide. The conductivity of the developer No. 28 was 7.0 mS/cm.

(Developer No. 29)(pH=12.0)

A developer No. 29 was prepared by adding to water phosphoric acid (pka: 12.4) with a concentration of 0.15 mol/liter, a nonionic surfactant of formula (Y-1) in an amount of 5% by weight, and a compound (G-5) shown in Table 1 in an amount of 0.2% by weight, and adjusting the pH value of the resultant aqueous solution to 12.0 with the addition thereto of potassium hydroxide. The conductivity of the developer No. 29 was 7.0 mS/cm.

(Developer No. 30)(pH=12.0)

A developer No. 30 was prepared by adding to water acetoxime (pka: 12.5) with a concentration of 0.15 mol/liter, a nonionic surfactant of formula (Y-1) in an amount of 5% by weight, and a compound (G-7) shown in Table 1 in an amount of 0.2% by weight, and adjusting the pH value of the resultant aqueous solution to 12.0 with the addition thereto of potassium hydroxide. The conductivity of the developer No. 30 was 7.0 mS/cm.

(Developer No. 31)(pH=12.0)

A developer No. 31 was prepared by adding to water saccharose (pka: 12.7) with a concentration of 0.15 mol/liter, a nonionic surfactant of formula (Y-1) in an amount of 5% by weight, and a compound (G-1) shown in Table 1 in an amount of 0.2% by weight, and adjusting the pH value of the resultant aqueous solution to 12.0 with the addition thereto of potassium hydroxide. The conductivity of the developer No. 31 was 7.0 mS/cm.

(Developer No. 32)(pH=12.0)
A developer No. 32 was prepared by adding to a commercially available potassium silicate solution "1K potassium silicate" (trademark) made by Nippon Chemical Industrial Co., Ltd., that is, a mixture of silicic acid and potassium hydroxide with a concentration of silicic acid of 0.15 mol/liter, a nonionic surfactant of formula (Y-1) in an amount of 5% by weight and a compound (G-5) shown in Table 1 in an amount of 0.2% by weight, and adjusting the pH value of the resultant solution to 11.7 with the addition thereto of potassium hydroxide. The conductivity of the developer No. 32 was 9.0 mS/cm.

(Developer No. 33)(pH=12.6)
A developer No. 33 was prepared by adding to a commercially available potassium silicate solution "1K potassium silicate" (trademark) made by Nippon Chemical Industrial Co., Ltd., that is, a mixture of silicic acid and potassium hydroxide with a concentration of silicic acid of 0.15 mol/liter, a commercially available copolymer of ethylene oxide and propylene oxide "Pluronic P84" (trademark) made by Asahi Denka Kogyo K.K. in an amount of 3% by weight and a compound (G-7) shown in Table 1 in an amount of 0.2% by weight, and adjusting the pH value of the resultant solution to 12.6 with the addition thereto of potassium hydroxide. The conductivity of the developer No. 33 was 21.0 mS/cm.

(Developer No. 34)(pH=12.0)
A developer No. 34 was prepared by adding to water phosphoric acid (pka: 12.4) with a concentration of 0.15 mol/liter, a commercially available surfactant "Pelex NBL" (trademark) made by Kao Corporation, that is, sodium alkylnaphthalenesulfonate, in an amount of 5% by weight, and a compound (G-7) shown in Table 1 in an amount of 0.2% by weight, and adjusting the pH value of the resultant aqueous solution to 12.0 with the addition thereto of potassium hydroxide. The conductivity of the developer No. 34 was 7 mS/cm.

(Developer No. 35)(pH=11.7)
A developer No. 35 was prepared by adding to water phosphoric acid (pka: 12.4) with a concentration of 0.15 mol/liter, a nonionic surfactant of formula (Y-1) in an amount of 5% by weight, and potassium sulfite in an amount of 0.3% by weight, and adjusting the pH value of the resultant aqueous solution to 11.7 with the addition thereto of potassium hydroxide.

(Developer No. 36)(pH=12.0)
A developer No. 36 was prepared by adding to water phosphoric acid (pka: 12.4) with a concentration of 0.15 mol/liter, a nonionic surfactant of formula (Y-1) in an amount of 5% by weight, and potassium sulfite in an amount of 0.3% by weight, and adjusting the pH value of the resultant aqueous solution to 12.0 with the addition thereto of potassium hydroxide.

(Developer No. 37)(pH=12.4)
A developer No. 37 was prepared by adding to water phosphoric acid (pka: 12.4) with a concentration of 0.15 mol/liter, a nonionic surfactant of formula (Y-1) in an amount of 5% by weight, and potassium sulfite in an amount of 0.3% by weight, and adjusting the pH value of the resultant aqueous solution to 12.4 with the addition thereto of potassium hydroxide.

(Developer No. 38)(pH=12.0)
A developer No. 38 was prepared by adding to water phosphoric acid (pka: 12.4) with a concentration of 0.15 mol/liter, a nonionic surfactant of formula (Y-1) in an amount of 5% by weight, and sodium sulfite in an amount of 0.3% by weight, and adjusting the pH value of the resultant aqueous solution to 12.0 with the addition thereto of potassium hydroxide.

(Developer No. 39)(pH=12.0)
A developer No. 39 was prepared by adding to water phosphoric acid (pka: 12.4) with a concentration of 0.15 mol/liter, a nonionic surfactant of formula (Y-1) in an amount of 5% by weight, and thiosalicylic acid in an amount of 0.3% by weight, and adjusting the pH value of the resultant aqueous solution to 12.0 with the addition thereto of potassium hydroxide.

(Developer No. 40)(pH=12.0)
A developer No. 40 was prepared by adding to water phosphoric acid pka: 12.4) with a concentration of 0.15 mol/liter, a nonionic surfactant of formula (Y-1) in an amount of 5% by weight, and a compound of the following formula (a) in an amount of 0.3% by weight, and adjusting the pH value of the resultant aqueous solution to 12.0 with the addition thereto of potassium hydroxide.

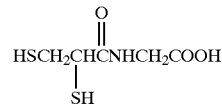

(a)

(Developer No. 41)(pH=12.0)
A developer No. 41 was prepared by adding to water phosphoric acid (pka: 12.4) with a concentration of 0.15 mol/liter, a nonionic surfactant of formula (Y-1) in an amount of 5% by weight, and a compound of the following formula (b) in an amount of 0.3% by weight, and adjusting the pH value of the resultant aqueous solution to 12.0 with the addition thereto of potassium hydroxide.

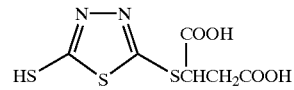

(b)

(Developer No. 42)(pH=12.0)
A developer No. 42 was prepared by adding to water inosine (pka: 12.5) with a concentration of 0.15 mol/liter, a nonionic surfactant of formula (Y-1) in an amount of 5% by weight, and sodium sulfite in an amount of 0.3% by weight, and adjusting the pH value of the resultant aqueous solution to 12.0 with the addition thereto of potassium hydroxide.

(Developer No. 43)(pH=12.0)
A developer No. 43 was prepared by adding to water guanine (pka: 12.3) with a concentration of 0.15 mol/liter, a nonionic surfactant of formula (Y-1) in an amount of 5% by weight, and sodium sulfite in an amount of 0.3% by weight, and adjusting the pH value of the resultant aqueous solution to 12.0 with the addition thereto of potassium hydroxide.

(Developer No. 44)(pH=12.0)
A developer No. 44 was prepared by adding to a commercially available potassium silicate solution "1K potassium silicate" (trademark) made by Nippon Chemical Industrial Co., Ltd., that is, a mixture of silicic acid and potassium hydroxide with a concentration of silicic acid of 0.15 mol/liter, a nonionic surfactant of formula (Y-1) in an amount of 5% by weight and sodium sulfite in an amount of 0.3% by weight, and adjusting the pH value of the resultant solution to 11.7 with the addition thereto of potassium hydroxide.

(Developer No. 45)(pH=12.6)
A developer No. 45 was prepared by adding to a commercially available potassium silicate solution "1K potassium silicate" (trademark) made by Nippon Chemical Industrial Co., Ltd., that is, a mixture of silicic acid and potassium hydroxide with a concentration of silicic acid of 0.15 mol/ liter, a commercially available copolymer of ethylene oxide and propylene oxide "Pluronic P84" (trademark) made by Asahi Denka Kogyo K.K. in an amount of 3% by weight and sodium sulfite in an amount of 0.3% by weight, and adjusting the pH value of the resultant solution to 12.6 with the addition thereto of potassium hydroxide.

(Developer No. 46)(pH=12.0)

A developer No. 46 was prepared by adding to water phosphoric acid (pka: 12.4) with a concentration of 0.15 mol/liter, a commercially available surfactant "Pelex NBL" (trademark) made by Kao Corporation, that is, sodium alkylnaphthalenesulfonate, in an amount of 5% by weight, and potassium sulfite in an amount of 0.3% by weight, and adjusting the pH value of the resultant aqueous solution to 12.0 with the addition thereto of potassium hydroxide. The conductivity of the developer No. 46 was 7 mS/cm.

(Comparative Developer No. 3)(pH=12.0)

A comparative developer No. 3 was prepared by adding to water a commercially available surfactant "Pelex NBL" (trademark) made by Kao Corporation, that is, sodium alkylnaphthalenesulfonate, in an amount of 5% by weight and p-tert-butyl benzoic acid in an amount of 1% by weight, and adjusting the pH value of the resultant aqueous solution to 12.0 with the addition thereto of potassium hydroxide. The conductivity of the comparative developer No. 3 was 5 mS/cm.

(Comparative Developer No. 4)(pH=13.0)

A comparative developer No. 4 was prepared by adding potassium hydroxide to water so as to have a pH value of 13.0. The conductivity of the comparative developer No. 4 was 3.5 mS/cm.

(Comparative Developer No. 5)(pH=12.0)

A comparative developer No. 5 was prepared by adding benzyl alcohol in an amount of 3% by weight to a commercially available potassium silicate solution "1K potassium silicate" (trademark) made by Nippon Chemical Industrial Co., Ltd., that is, a mixture of silicic acid and potassium hydroxide with a concentration of silicic acid of 0.15 mol/liter, and adjusting the pH value of the resultant solution to 12.0 with the addition thereto of potassium hydroxide. The conductivity of the comparative developer No. 5 was 8.0 mS/cm.

[Preparation of Replenishers]

Replenishers for the above-mentioned developers No. 16 to No. 46 according to the present invention and comparative developers No. 3 to No. 5 were individually prepared by adding potassium hydroxide to the respective developers to adjust the pH value to 13.1.

[Preparation of Desensitizing Solutions]

Desensitizing solutions A and B with the following formulations were prepared.

(Formulation for Desensitizing Solution A)

| White dextrin | 50 g |
| Hydroxypropyl etherified starch | 100 g |
| Gum arabic (dissolved in water to have a Baume degree of 14° B) | 10 g |
| Ammonium primary phosphate | 1.0 g |
| Sodium dilaurylsuccinate | 1.5 g |
| Polyoxyethylene nonylphenyl ether | 5 g |
| Ethylene glycol | 10 g |
| EDTA | 0.05 g |
| Dehydroacetic acid | 0.05 g |
| Water | 1000 g |

(Formulation for Desensitizing Solution B)

| White dextrin | 5.0 parts by weight |
| Hydroxypropyl etherified starch | 10.0 parts by weight |
| Gum arabic | 1.0 part by weight |
| Ammonium primary phosphate | 0.1 parts by weight |
| Sodium dilaurylsuccinate | 0.15 parts by weight |
| Polyoxyethylene nonylphenyl ether | 0.5 parts by weight |
| Ethylene glycol | 1.0 part by weight |
| EDTA | 0.005 parts by weight |
| Dehydroacetic acid | 0.005 parts by weight |
| Water | 100 parts by weight |

In each of Examples 25 to 86 and Comparative Examples 3 to 5, a PS plate selected from Table 2, the above-mentioned developer and the above-mentioned desensitizing solutions were employed in combination. The combination of the PS plate, the developer and the desensitizing solution is shown in the following Tables 4 and 5. The PS plates were subjected to light exposure and development under the following conditions to conduct evaluation tests. The evaluation tests were carried out as follows.

(1) Evaluation of Development Performance

Each PS plate was not subjected to light exposure before development. After completion of the development, the color of the obtained printing plate was visually inspected. The color of the light-sensitive layer was recognized when there remained the residue. The results are shown in Tables 4 and 5.

(2) Evaluation of Printing Durability and Scumming After Intermission

Two types of light sources were employed for light exposure of the PS plates. FD·YAG laser ("PlateJet 4" (trademark), made by Cymbolic Sciences, Inc.) with a wavelength of 532 nm and an intensity of 100 mW was used for the PS plates No. 1 to No. 4 and No. 9; and violet LD with a wavelength of 405 nm and an intensity of 30 mW emitting from a laboratory-scale internal drum exposure unit was used for the PS plates No. 5 to No. 8. With an exposure of 100 $\mu/cm^2$ under the standard exposure conditions, a solid image and dot images (with an increased dot percent from 1 to 99% by 1%) were subjected to scanning using the above-mentioned light sources at a density of 4000 dpi and 175 rays/inch.

After completion of the light exposure, each PS plate was subjected to the treatments of washing with water, development, washing with water again and then desensitizing treatment under the standard conditions, using a commercially available automatic processor ("FLP-82News" (trade name), made by Fuji Photo Film Co., Ltd.) equipped with the above developer, the above replenisher and the above desensitizing solution, whereby a lithographic printing plate was obtained. Each PS plate was pre-heated after light exposure so that the surface temperature of the plate reached 120° C., and the plate was immersed in the developer for 20 seconds, and the coating amount of the desensitizing solution was 0.1 g/m² on a dry basis.

With the obtained printing plate set on a lithographic press "R201" (trade name), made by MAN Roland, printing operation was carried out using a printing ink ("GEOS G black (N)" (trade name), made by Dainippon Ink & Chemicals, Incorporated). To evaluate the printing durability, occurrence of dot loss on the dot image with a dot percent of 3% was examined. The printing durability was expressed by the maximum number of printed sheets before the occurrence of dot loss. The results are shown in Tables 4 and 5.

Scumming after intermission was examined by the following method. The obtained PS plate was set on a lithographic press "DAIYA IF2" (trade name), made by Mitsubishi Heavy Industries, Ltd., which was equipped with a printing ink ("GEOS G magenta (S)" (trade name), made by Dainippon Ink & Chemicals, Incorporated) to start printing operation. The printing operation was stopped and the press was allowed to stand for one hour with the printing ink being attached to the printing plate. When the press was started again one hour later, the presence of scumming on non-image areas for printed matter was visually checked. The results are shown in Tables 4 and 5.

(3) Evaluation of Change in pH Value of Developer During Development

An optimum amount of replenisher to be added to each developer was determined within a range of from 50 to 120 cc (ml) for every one square meter of the PS plate subjected to development.

To evaluate the stability of the pH value in each developer, the following test was conducted, with the replenisher being supplied to each developer at the predetermined rate. The PS plate with an area of 100 m$^2$ was subjected to development on the first day. The area of the PS plate subjected to development was decreased to 50 m$^2$ and 10 m$^2$ on the second day and the third day, respectively. On the fourth day, the PS plate was not subjected to development. This development cycle was repeated 5 times.

A difference between the minimum pH value and the maximum pH value, which were obtained during the above-mentioned test is shown as an index of the pH variation. The results are shown in Tables 4 and 5.

TABLE 4

|  | PS Plate No. | Developer No. | Desensitizing Solution | Development Performance (*) | Scumming after Intermission (**) | Printing Durability (No. of Sheets) | Variation in pH |
|---|---|---|---|---|---|---|---|
| Ex. 25 | 1 | 17 | A | Nil | Nil | 200,000 | ±0.05 |
| Ex. 26 | 2 | 17 | A | Nil | Nil | 200,000 | ±0.05 |
| Ex. 27 | 3 | 17 | A | Nil | Nil | 120,000 | ±0.05 |
| Ex. 28 | 4 | 17 | A | Nil | Nil | 250,000 | ±0.05 |
| Ex. 29 | 5 | 17 | A | Nil | Nil | 200,000 | ±0.05 |
| Ex. 30 | 6 | 17 | A | Nil | Nil | 200,000 | ±0.05 |
| Ex. 31 | 7 | 17 | A | Nil | Nil | 200,000 | ±0.05 |
| Ex. 32 | 8 | 17 | A | Nil | Nil | 150,000 | ±0.05 |
| Ex. 33 | 9 | 17 | A | Nil | Nil | 150,000 | ±0.05 |
| Ex. 34 | 4 | 16 | A | Nil | Nil | 250,000 | ±0.05 |
| Ex. 35 | 4 | 17 | A | Nil | Nil | 250,000 | ±0.05 |
| Ex. 36 | 4 | 18 | A | Nil | Nil | 200,000 | ±0.05 |
| Ex. 37 | 4 | 19 | A | Nil | Nil | 250,000 | ±0.05 |
| Ex. 38 | 4 | 20 | A | Nil | Nil | 250,000 | ±0.05 |
| Ex. 39 | 4 | 21 | A | Nil | Nil | 250,000 | ±0.05 |
| Ex. 40 | 4 | 22 | A | Nil | Nil | 250,000 | ±0.08 |
| Ex. 41 | 4 | 23 | A | Nil | Nil | 250,000 | ±0.08 |
| Ex. 42 | 8 | 23 | A | Nil | Nil | 200,000 | ±0.05 |
| Ex. 43 | 8 | 23 | B | Nil | Nil | 200,000 | ±0.05 |
| Ex. 44 | 4 | 24 | A | Nil | Nil | 250,000 | ±0.05 |
| Ex. 45 | 1 | 26 | A | Nil | Nil | 200,000 | ±0.05 |
| Ex. 46 | 2 | 26 | A | Nil | Nil | 200,000 | ±0.05 |
| Ex. 47 | 3 | 26 | A | Nil | Nil | 120,000 | ±0.05 |
| Ex. 48 | 4 | 26 | A | Nil | Nil | 250,000 | ±0.05 |
| Ex. 49 | 5 | 26 | A | Nil | Nil | 200,000 | ±0.05 |
| Ex. 50 | 6 | 26 | A | Nil | Nil | 200,000 | ±0.05 |
| Ex. 51 | 7 | 26 | A | Nil | Nil | 200,000 | ±0.05 |
| Ex. 52 | 8 | 26 | A | Nil | Nil | 150,000 | ±0.05 |
| Ex. 53 | 9 | 26 | A | Nil | Nil | 150,000 | ±0.05 |
| Ex. 54 | 4 | 25 | A | Nil | Nil | 250,000 | ±0.05 |
| Ex. 55 | 4 | 26 | A | Nil | Nil | 250,000 | ±0.05 |
| Ex. 56 | 4 | 27 | A | Nil | Nil | 200,000 | ±0.05 |
| Ex. 57 | 4 | 28 | A | Nil | Nil | 250,000 | ±0.05 |
| Ex. 58 | 4 | 29 | A | Nil | Nil | 250,000 | ±0.05 |
| Ex. 59 | 4 | 30 | A | Nil | Nil | 250,000 | ±0.05 |
| Ex. 60 | 4 | 31 | A | Nil | Nil | 250,000 | ±0.08 |

TABLE 5

|  | PS Plate No. | Developer No. | Desensitizing Solution | Development Performance (*) | Scumming after Intermission (**) | Printing Durability (No. of Sheets) | Variation in pH |
|---|---|---|---|---|---|---|---|
| Ex. 61 | 4 | 32 | A | Nil | Nil | 180,000 | ±0.08 |
| Ex. 62 | 4 | 33 | A | Nil | Nil | 200,000 | ±0.08 |
| Ex. 63 | 9 | 32 | A | Nil | Nil | 180,000 | ±0.08 |
| Ex. 64 | 9 | 32 | B | Nil | Nil | 180,000 | ±0.08 |
| Ex. 65 | 4 | 34 | A | Nil | Nil | 250,000 | ±0.05 |
| Ex. 66 | 1 | 36 | A | Nil | Nil | 200,000 | ±0.05 |
| Ex. 67 | 2 | 36 | A | Nil | Nil | 200,000 | ±0.05 |

TABLE 5-continued

|  | PS Plate No. | Developer No. | Desen- sitizing Solution | Development Performance (*) | Scumming after Intermission (**) | Printing Durability (No. of Sheets) | Variation in pH |
|---|---|---|---|---|---|---|---|
| Ex. 68 | 3 | 36 | A | Nil | Nil | 120,000 | ±0.05 |
| Ex. 69 | 4 | 36 | A | Nil | Nil | 250,000 | ±0.05 |
| Ex. 70 | 5 | 36 | A | Nil | Nil | 200,000 | ±0.05 |
| Ex. 71 | 6 | 36 | A | Nil | Nil | 200,000 | ±0.05 |
| Ex. 72 | 7 | 36 | A | Nil | Nil | 200,000 | ±0.05 |
| Ex. 73 | 8 | 36 | A | Nil | Nil | 150,000 | ±0.05 |
| Ex. 74 | 9 | 36 | A | Nil | Nil | 150,000 | ±0.05 |
| Ex. 75 | 4 | 35 | A | Nil | Nil | 250,000 | ±0.05 |
| Ex. 76 | 4 | 37 | A | Nil | Nil | 250,000 | ±0.05 |
| Ex. 77 | 4 | 38 | A | Nil | Nil | 200,000 | ±0.05 |
| Ex. 78 | 4 | 39 | A | Nil | Nil | 250,000 | ±0.05 |
| Ex. 79 | 4 | 40 | B | Nil | Nil | 250,000 | ±0.05 |
| Ex. 80 | 4 | 41 | A | Nil | Nil | 250,000 | ±0.05 |
| Ex. 81 | 4 | 42 | A | Nil | Nil | 250,000 | ±0.05 |
| Ex. 82 | 4 | 43 | A | Nil | Nil | 180,000 | ±0.05 |
| Ex. 83 | 4 | 44 | A | Nil | Nil | 180,000 | ±0.05 |
| Ex. 84 | 4 | 45 | A | Nil | Nil | 180,000 | ±0.05 |
| Ex. 85 | 4 | 36 | B | Nil | Nil | 200,000 | ±0.05 |
| Ex. 86 | 4 | 46 | A | Nil | Nil | 250,000 | ±0.05 |
| Comp. Ex. 3 | 4 | Comp. 3 | A | Nil | Nil | 250,000 | ±0.2 |
| Comp. Ex. 4 | 4 | Comp. 4 | A | Nil | Observed | 100,000 | ±0.2 |
| Comp. Ex. 5 | 4 | Comp. 5 | A | Observed | Observed | 50,000 | ±0.3 |

(*) "Nil" means there remained no light-sensitive layer, i.e., no residue, while "Observed" means there remained the light-sensitive layer, i.e., residue.
(**)) "Nil" means there was no ink contamination on non-image areas for printed matter after the printing operation was started again after intermission; while "observed" means ink contamination was observed on non-image areas.

As is apparent from Tables 4 and 5, the method for preparing a lithographic printing plate of the present invention exhibits excellent development performance, and gives good results to the resultant printing plate in terms of printing durability and scumming. In addition, the change in pH value of the developer is so small that the stable development can be ensured for a long period of time. Namely, the stability in the running performance is remarkably improved.

According to the method of making a lithographic printing plate of the present invention, scumming can be prevented and the printing durability can be improved in the resultant printing plate, without impairing the image formation properties. Further, some compounds considered to be insoluble in the conventional developers can be dissolved or stably dispersed in the developer used in the present invention during a long-term service when set in the automatic development unit, and the deterioration of performance caused by the change in pH value of the developer can be minimized to improve the stability of the development operation.

What is claimed is:

1. A method for preparing a lithographic printing plate comprising the steps of imagewise exposing, to light, a presensitized plate for use in making a lithographic printing plate, which comprises a grained and anodized substrate provided thereon with a photopolymerizable light-sensitive layer containing a compound having at least one addition-polymerizable ethylenically unsaturated double bond and a titanocene type initiator; and then developing the light-exposed presensitized plate using a developer which comprises a surfactant and a weak acid or a salt thereof having a dissociation constant pka ranging from 10 to 13, and has a pH value ranging from 11.5 to 12.8.

2. The method for preparing a lithographic printing plate according to claim 1, wherein the light-exposed plate is washed with water, said plate is then developed with the developer and washed with water again, and a desensitizing solution is applied to the surface of the plate with a coating amount of not less than 0.02 g/m$^2$ on a dry basis, said desensitizing solution comprising (a) gum arabic in amount of 0 to 3% by weight and (b) a modified starch in amount of 5 to 30% by weight.

3. The method for preparing a lithographic printing plate according to claim 1, wherein the developer comprises the weak acid or the salt thereof having a dissociation constant pka ranging from 10 to 13 in an amount of from 0.01 to 1 mol/liter.

4. The method for preparing a lithographic printing plate according to claim 1, wherein the developer comprises as the surfactant, at least one member selected from the group consisting of nonionic surfactants and anionic surfactants.

5. The method for preparing a lithographic printing plate according to claim 1, wherein the developer comprises the surfactant in an amount of from 0.1 to 20% by weight.

6. The method for preparing a lithographic printing plate according to claim 1, wherein the developer further comprises a chelating agent for divalent metals.

7. The method for preparing a lithographic printing plate according to claim 1, wherein the developer further comprises carbonic acid or a carbonate.

8. The method for preparing a lithographic printing plate according to claim 1, wherein the developer has a conductivity of from 3 to 40 mS/cm.

9. The method for preparing a lithographic printing plate according to claim 1, wherein the developer further comprises at least one member selected from the group consisting of a compound having a carboxyl group or a salt thereof, represented by the following general formula (1):
R—Ar—(COOM)$_n$ (wherein R represents a hydrogen atom or a linear or branched alkyl group having carbon atoms of from 1 to 20, Ar represents an aromatic ring, M represents a hydrogen atom, monovalent metal or an ammonium group, and n represents 1 or 2), a compound represented by the following general formula (2): $(R^1)(R^2)N\text{—}X\text{—}OH$ (wherein $R^1$ and $R^2$ each represents an organic residue, and X represents a divalent connecting group), water-soluble sulfite salts, alkaline-soluble mercapto compounds and thioether compounds.

10. The method for preparing a lithographic printing plate according to claim 9, wherein the developer comprises the compound having a carboxyl group or a salt thereof, represented by the general formula (1):

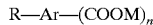

R—Ar—(COOM)$_n$ (wherein R represents a hydrogen atom or a linear or branched alkyl group having carbon atoms of from 1 to 20, Ar represents an aromatic ring, M represents a hydrogen atom, monovalent metal or an ammonium group, and n represents 1 or 2).

11. The method for preparing a lithographic printing plate according to claim 10, wherein the developer comprises the compound having a carboxyl group or a salt thereof, represented by the general formula (1) in an amount of from 0.1 to 5% by weight.

12. The method for preparing a lithographic printing plate according to claim 9, wherein the developer comprises the compound represented by the general formula (2): $(R^1)(R^2)N\text{—}X\text{—}OH$ (wherein $R^1$ and $R^2$ each represents an organic residue, and X represents a divalent connecting group).

13. The method for preparing a lithographic printing plate according to claim 12, wherein the developer comprises the compound represented by the general formula (2) in an amount of from 0.01 to 3% by weight.

14. The method for preparing a lithographic printing plate according to claim 9, wherein the developer comprises at least one member selected from water-soluble sulfite salts, alkaline-soluble mercapto compounds and thioether compounds.

15. The method for preparing a lithographic printing plate according to claim 14, wherein the developer comprises a water-soluble sulfite salt in an amount of from 0.05 to 3% by weight.

16. The method for preparing a lithographic printing plate according to claim 14, wherein the developer comprises at least one member selected from alkaline-soluble mercapto compounds and thioether compounds, in an amount of from 0.001 to 10% by weight.

17. The method for preparing a lithographic printing plate according to claim 1, wherein the light-sensitive layer has an acid value of not more than 1.0 meq/g.

18. The method for preparing a lithographic printing plate according to claim 1, wherein the imagewise light-exposed plate is developed in such a manner that the rate of the development of the non-exposed area is not less than 0.05 µm/s and the rate of the developer penetrating into the exposed area is not more than 0.1 µm/s.

19. The method for preparing a lithographic printing plate according to claim 1, wherein the substrate of the presensitized plate is provided thereon with an organic compound carrying a phosphorus atom-containing acidic group or an organic silicone compound.

* * * * *